(12) United States Patent
Toyama

(10) Patent No.: US 10,559,723 B2
(45) Date of Patent: Feb. 11, 2020

(54) OPTICAL DEVICE

(71) Applicant: ROHM CO., LTD., Kyoto-shi, Kyoto (JP)

(72) Inventor: Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/107,209

(22) Filed: Aug. 21, 2018

(65) Prior Publication Data

US 2019/0067527 A1 Feb. 28, 2019

(30) Foreign Application Priority Data

Aug. 25, 2017 (JP) ................................. 2017-161929
Aug. 25, 2017 (JP) ................................. 2017-162186
Jun. 26, 2018 (JP) ................................. 2018-120766

(51) Int. Cl.
*H01L 33/48* (2010.01)
*H01L 33/62* (2010.01)
*H01L 25/075* (2006.01)
*H01L 23/00* (2006.01)

(52) U.S. Cl.
CPC ........ *H01L 33/486* (2013.01); *H01L 25/0753* (2013.01); *H01L 33/62* (2013.01); *H01L 24/48* (2013.01); *H01L 2224/48227* (2013.01); *H01L 2224/48505* (2013.01); *H01L 2224/73265* (2013.01); *H01L 2924/12041* (2013.01)

(58) Field of Classification Search
CPC combination set(s) only.
See application file for complete search history.

(56) References Cited

U.S. PATENT DOCUMENTS 8,049,230 B2 * 11/2011 Chan .................... H01L 25/0753
257/89
2005/0213334 A1 * 9/2005 Lee ........................ H01L 33/486
362/310

(Continued)

FOREIGN PATENT DOCUMENTS

JP 2012169432 A 9/2012
JP 2015115432 A 6/2015

*Primary Examiner* — Mamadou L Diallo
(74) *Attorney, Agent, or Firm* — Hamre, Schumann Mueller & Larson, P.C.

(57) ABSTRACT

An example of an optical device of the present disclosure includes a substrate, an obverse-surface conductive layer, a reverse-surface conductive layer, a first conductive part, an optical element and a reflector. The first conductive part extends through the substrate and overlaps with a first obverse-surface conducting region of the obverse-surface conductive layer and the reverse-surface conductive layer as viewed in a thickness direction of the substrate. The reflector has an inner surface that surrounds the optical element as viewed in the thickness direction. The optical element is located on first obverse-surface conducting region, and the second obverse-surface conducting region is located between the first obverse-surface conducting region and the inner surface of the reflector as viewed in the thickness direction. A second obverse-surface conducting region of the obverse-surface conductive layer is spaced apart from the inner surface of the reflector as viewed in the thickness direction.

20 Claims, 38 Drawing Sheets

(56) References Cited

U.S. PATENT DOCUMENTS

| | | | | |
|---|---|---|---|---|
| 2006/0091409 A1* | 5/2006 | Epler | ................... | H01L 33/0079 |
| | | | | 257/95 |
| 2006/0261364 A1* | 11/2006 | Suehiro | ................... | H01L 33/56 |
| | | | | 257/100 |
| 2007/0194712 A1* | 8/2007 | Shiraishi | ................. | H01L 33/58 |
| | | | | 313/512 |
| 2008/0048205 A1* | 2/2008 | Okazaki | .................. | H01L 33/62 |
| | | | | 257/99 |
| 2011/0140150 A1* | 6/2011 | Shum | ...................... | H01L 33/46 |
| | | | | 257/98 |
| 2013/0175559 A1* | 7/2013 | Kobayakawa | .......... | H01L 33/44 |
| | | | | 257/89 |
| 2017/0212318 A1* | 7/2017 | Kuo | ..................... | G02B 6/4246 |
| 2017/0221864 A1* | 8/2017 | Kobayakawa | .......... | H01L 33/54 |

* cited by examiner

OPTICAL DEVICE

FIELD

The present disclosure relates to optical devices.

BACKGROUND

In one example, a conventional semiconductor light-emitting device includes a substrate, a light-emitting element, a wiring pattern, a bonding layer and a sealing resin.

The wiring pattern is formed on the substrate. The semiconductor light-emitting element is disposed on the wiring pattern via the bonding layer. The sealing resin is disposed on the substrate to cover the semiconductor light-emitting element and the wiring pattern.

SUMMARY

A first aspect of the present disclosure provides an optical device. The optical device includes a substrate, an obverse-surface conductive layer, a reverse-surface conductive layer, a first conductive part, an optical element and a reflector. The substrate has an obverse surface and a reverse surface facing away from each other. The obverse-surface conductive layer is formed on the obverse surface of the substrate and includes a first obverse-surface conducting region and a second obverse-surface conductive region. The reverse-surface conductive layer is formed on the reverse surface of the substrate. The first conductive part extends through the substrate and overlaps with the first obverse-surface conducting region and the reverse-surface conductive layer as viewed in a thickness direction of the substrate. The optical element is disposed on the obverse-surface conductive layer. The reflector is disposed on the substrate and has an inner surface that surrounds the optical element as viewed in the thickness direction. The optical element is located on first obverse-surface conducting region, and the second obverse-surface conducting region is located between the first obverse-surface conducting region and the inner surface of the reflector as viewed in the thickness direction. The second obverse-surface conducting region is spaced apart from the inner surface of the reflector as viewed in the thickness direction.

DRAWINGS

EMBODIMENTS

The following describes embodiments of the present disclosure, with reference to the drawings.

In the present disclosure, unless specifically noted otherwise, the statements that read "object A is formed on object B" and "object A is formed over object B" encompass that "object A is formed directly on object B" as well as "object A is formed with another object between object A and object B". Similarly, unless specifically noted otherwise, the statements that read "object A is disposed on object B" and "object A is disposed over object B" encompass that "object A is disposed directly on object B" as well as "object A is disposed with another object between object A and object B". Similarly, unless specifically noted otherwise, the statements that read "object A is laminated on object B" and "object A is laminated over object B" encompass that "object A is laminated directly on object B" as well as "object A is laminated with another object between object A and object B".

First Embodiment

With reference to FIGS. 1 to 14, a first embodiment of the present disclosure is described.

Figure 1:
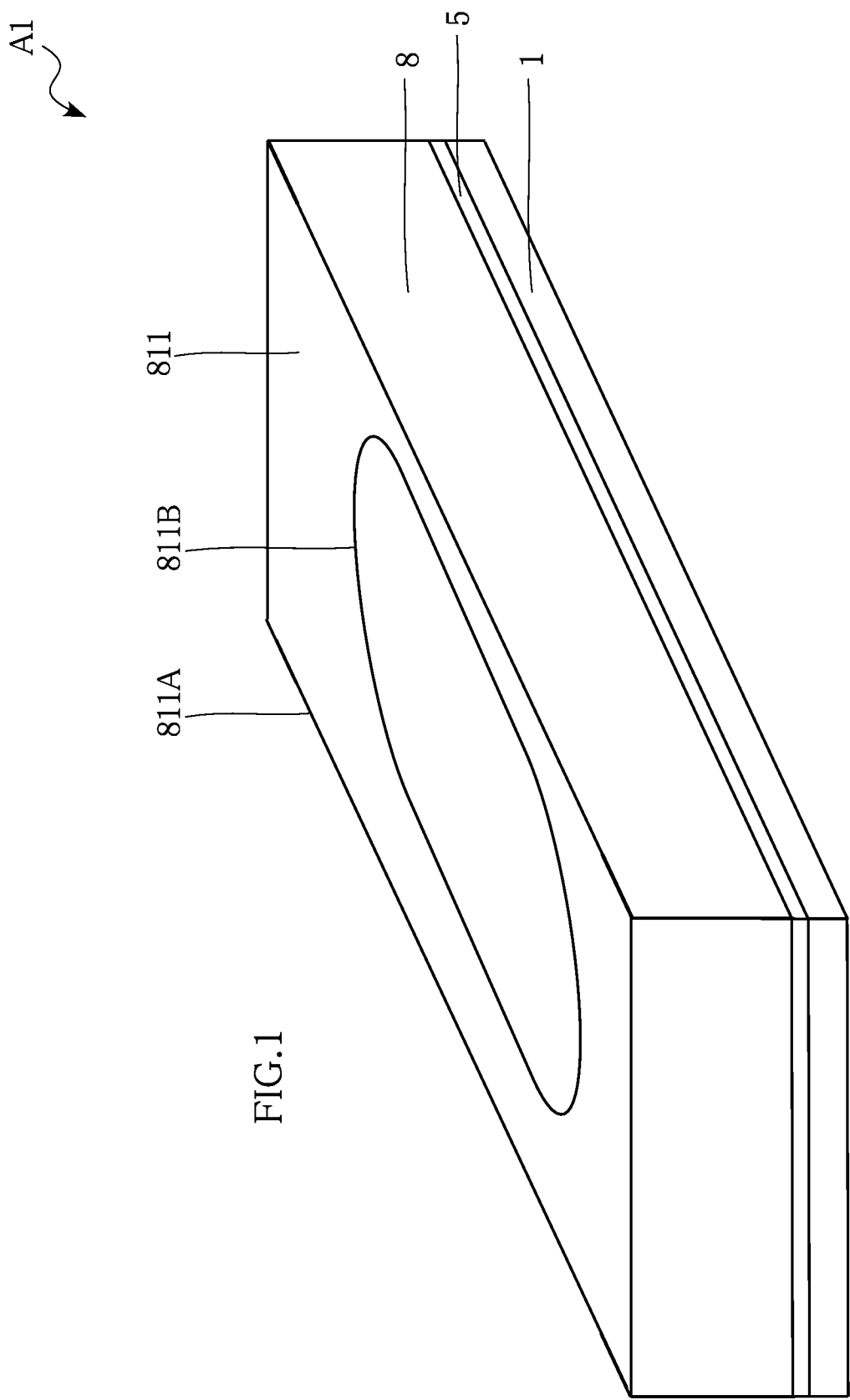
FIG. 1 is a perspective view of an optical device according to a first embodiment.
Figure 2:
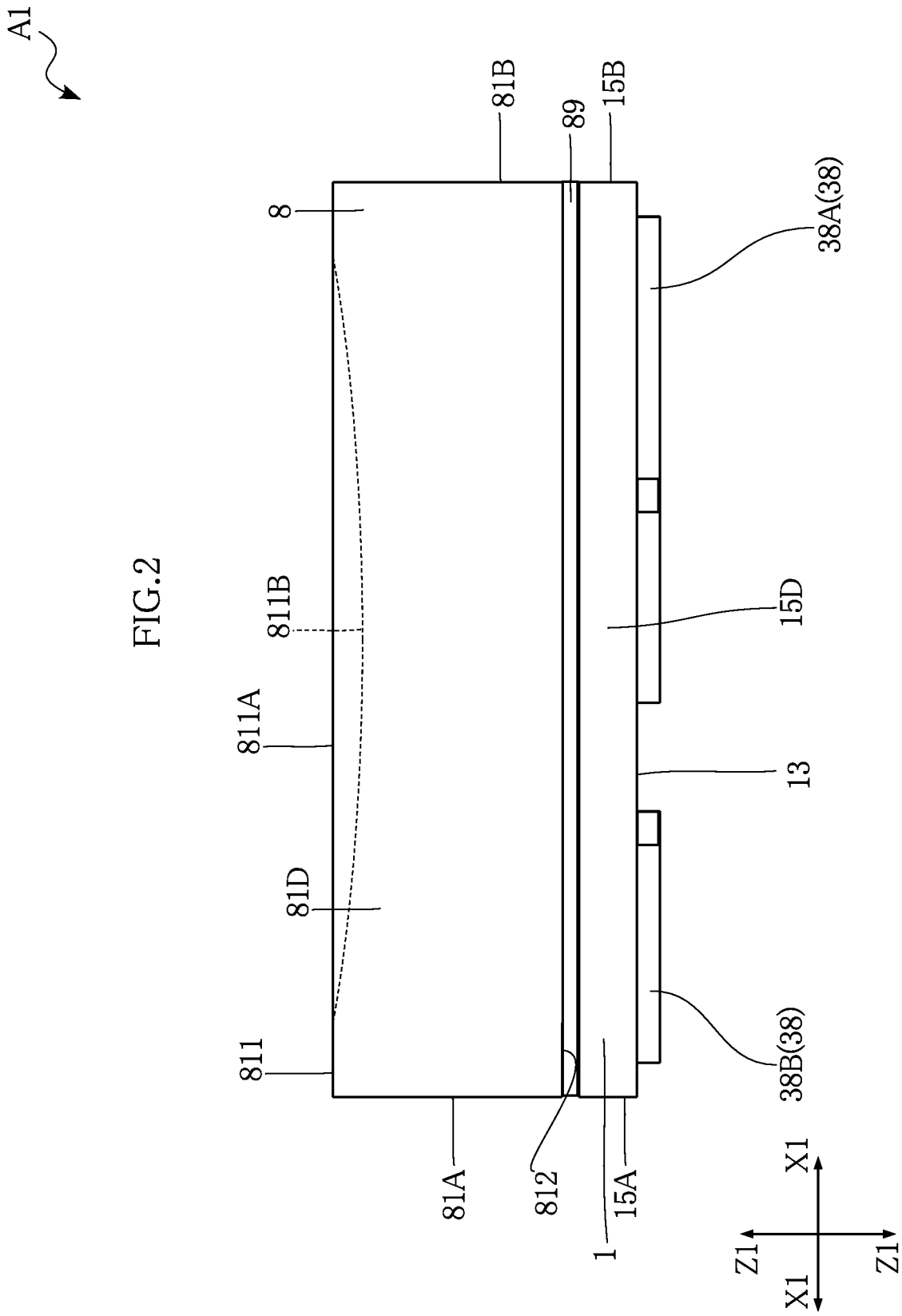
FIG. 2 is a front view of the optical device according to the first embodiment.
Figure 3:
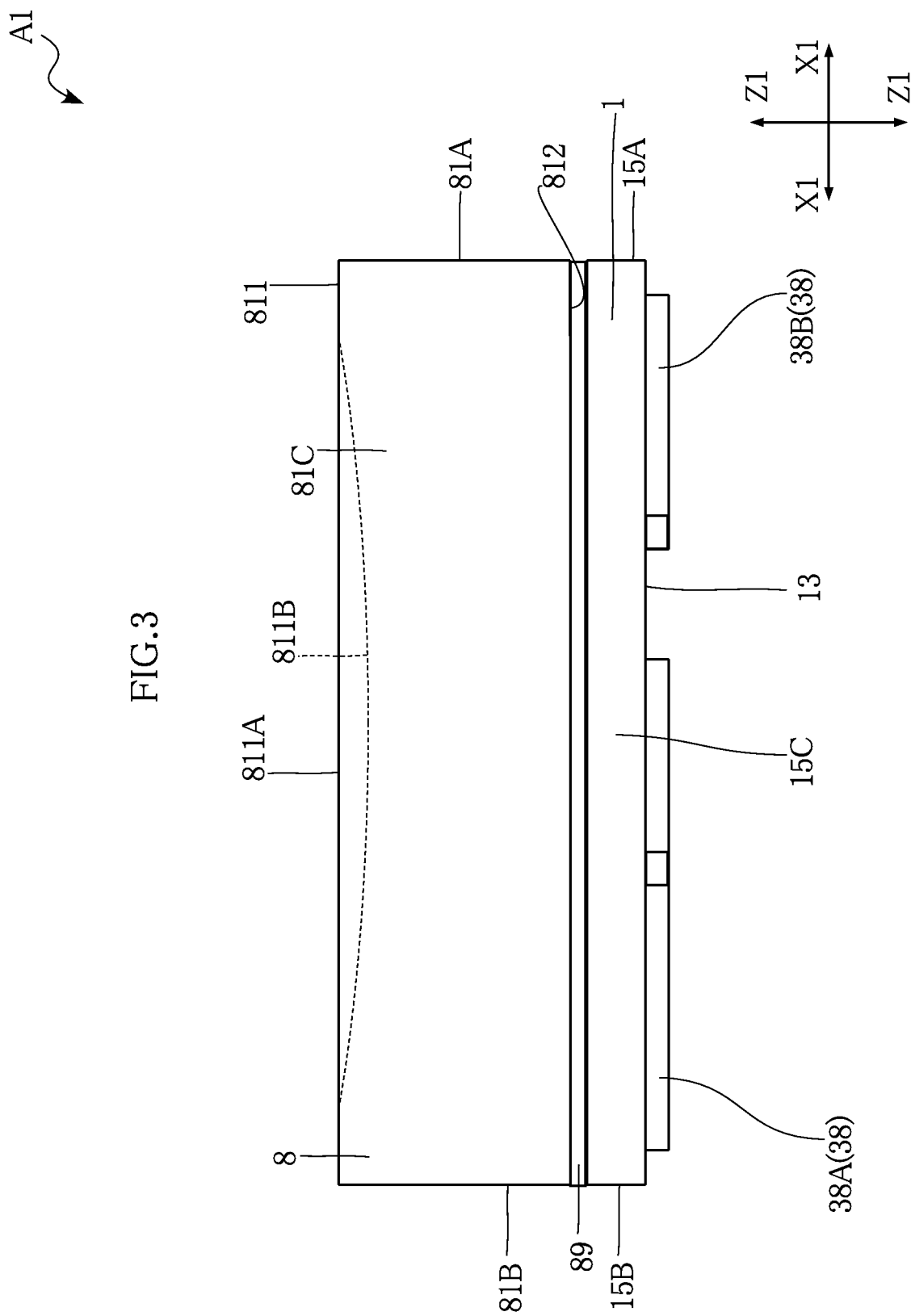
FIG. 3 is a rear view of the optical device according to the first embodiment.
Figure 4:
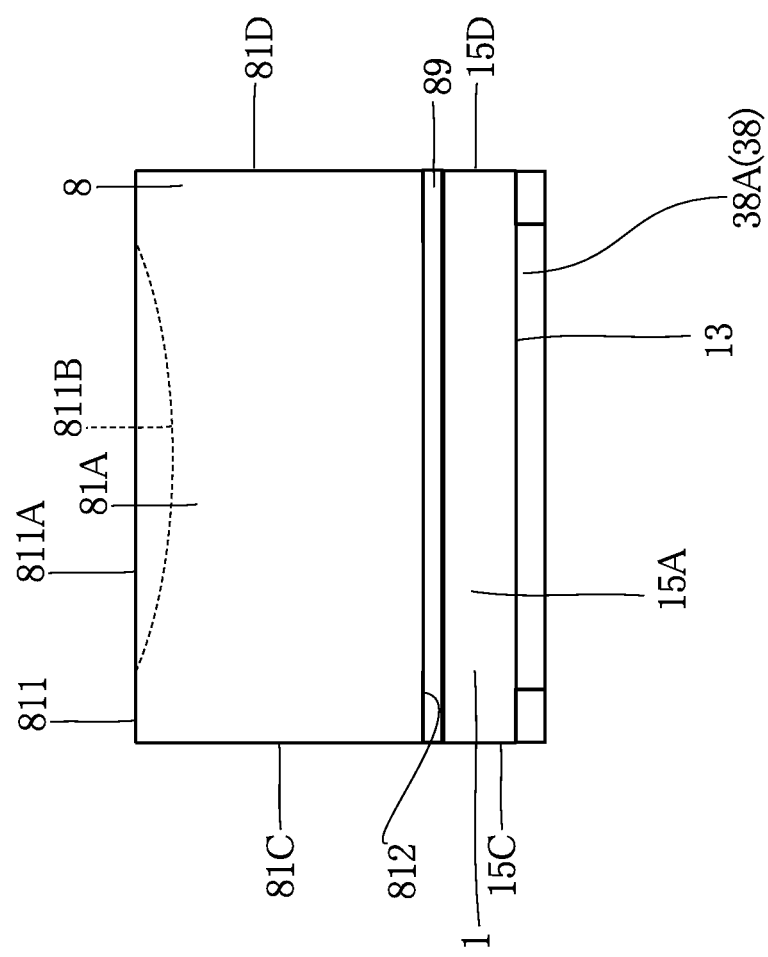
FIG. 4 is a left-side view of the optical device according to the first embodiment.
Figure 5:
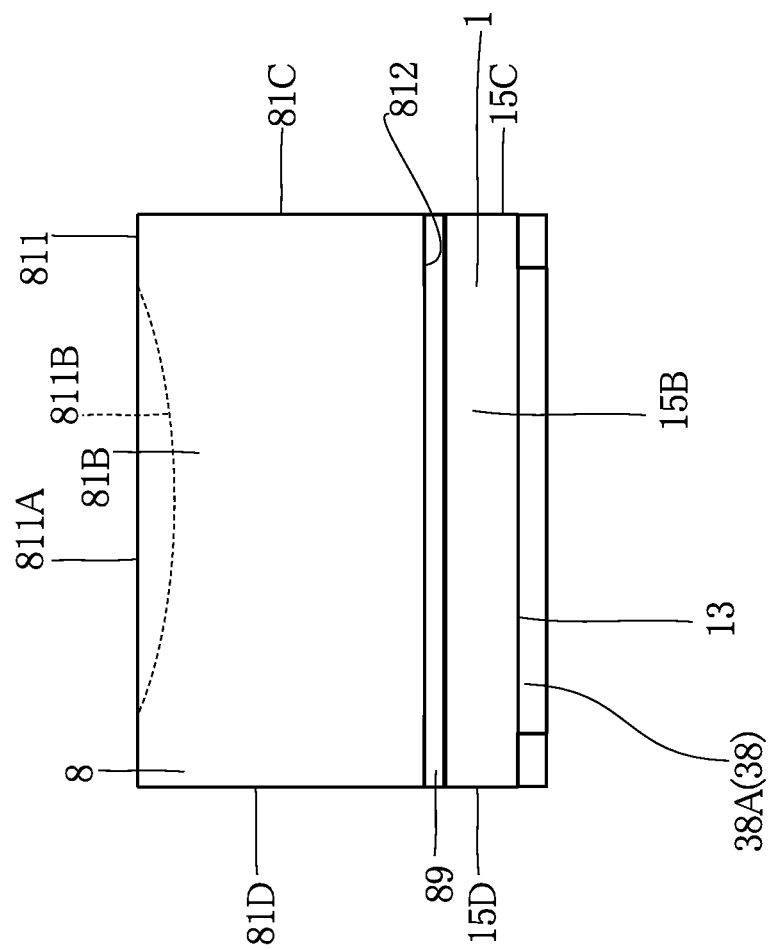
FIG. 5 is a right-side view of the optical device according to the first embodiment.
Figure 6:
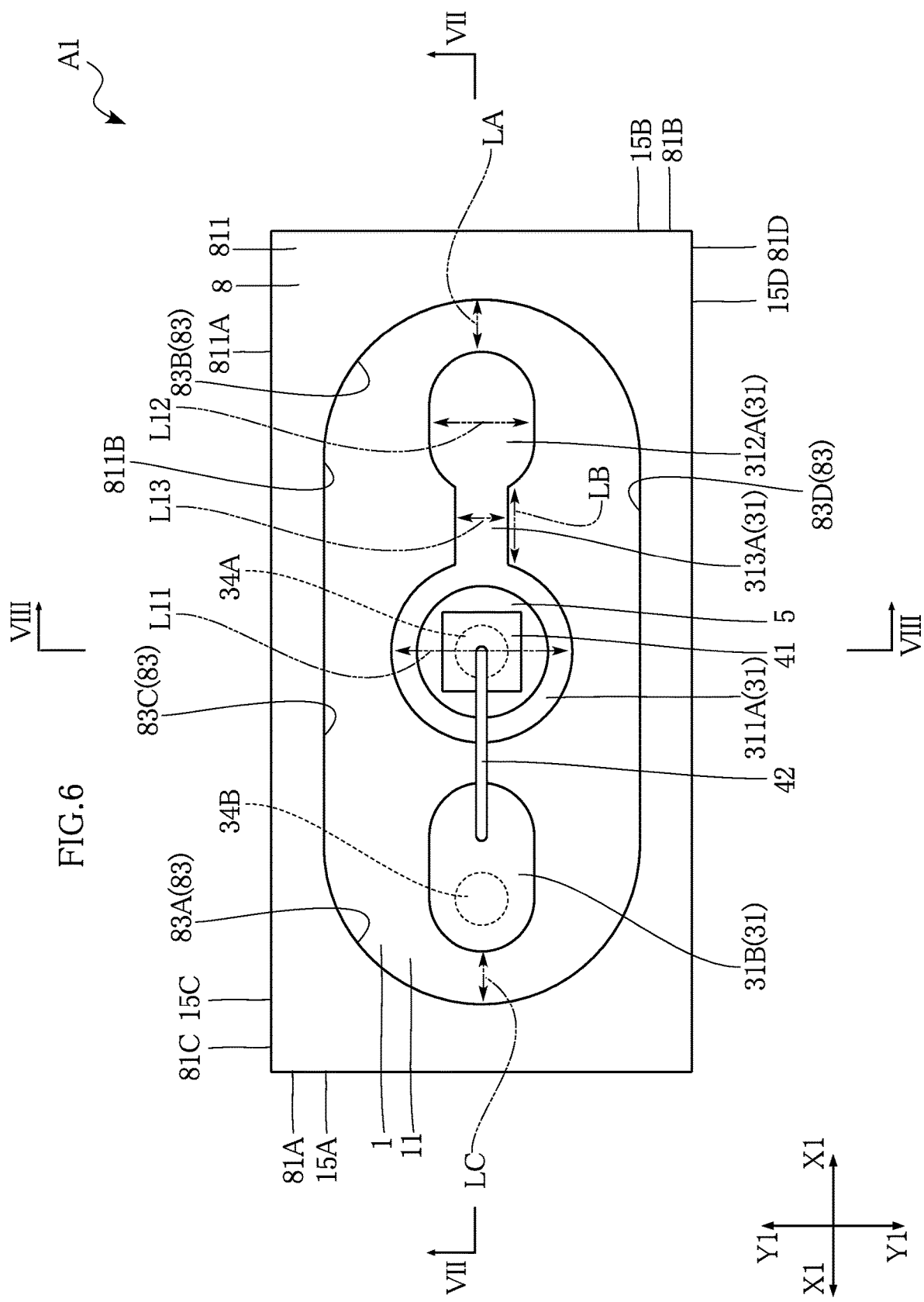
FIG. 6 is a plan view of the optical device according to the first embodiment.

FIG. 1 is a perspective view of an optical device according to the first embodiment. FIG. 2 is a front view of the optical device according to the first embodiment. FIG. 3 is a rear view of the optical device according to the first embodiment. FIG. 4 is a left-side view of the optical device according to the first embodiment. FIG. 5 is a right-side view of the optical device according to the first embodiment. FIG. 6 is a plan view of the optical device according to the first embodiment.

The optical device A1 shown in the figures includes a substrate 1, an obverse-surface conductive layer 31, a first conductive part 34A, a second conductive part 34B, a reverse-surface conductive layer 38, an optical element 41, a wire 42, a bonding layer 5 and a reflector 8.

The substrate 1 may be made of insulating material, such as insulating resin or ceramics. Examples of insulating resins include an epoxy resin (which may contain glass or paper), a phenolic resin, polyimide and polyester. Examples of ceramics include $Al_2O_3$, SiC and AlN. The substrate 1 may be made of metal, such as aluminum, coated with an insulating film. The substrate 1 is rectangular as viewed from a thickness direction Z1 of the substrate 1.

The substrate 1 has an obverse surface 11, a reverse surface 13, a first side surface 15A, a second side surface 15B, a third side surface 15C and a fourth side surface 15D. The obverse surface 11, the reverse surface 13, the first side surface 15A, the second side surface 15B, the third side surface 15C and the fourth side surface 15D are all rectangular.

The obverse surface 11 and the reverse surface 13 are spaced apart in the thickness direction Z1 of the substrate 1 and face away from each other. The obverse surface 11 and the reverse surface 13 are both flat.

The first side surface 15A and the second side surface 15B are spaced apart in a first direction X1 and face away from each other. The first side surface 15A and the second side surface 15B are both connected to the obverse surface 11 and the reverse surface 13. The first side surface 15A and the second side surface 15B are both flat.

The third side surface 15C and the fourth side surface 15D are spaced apart in a second direction Y1 that is perpendicular to the first direction X1 and to the thickness direction Z1 and face away from each other. The third side surface 15C and the fourth side surface 15D are connected to both the obverse surface 11 and the reverse surface 13. The third side surface 15C and the fourth side surface 15D are both flat.

Figure 7:
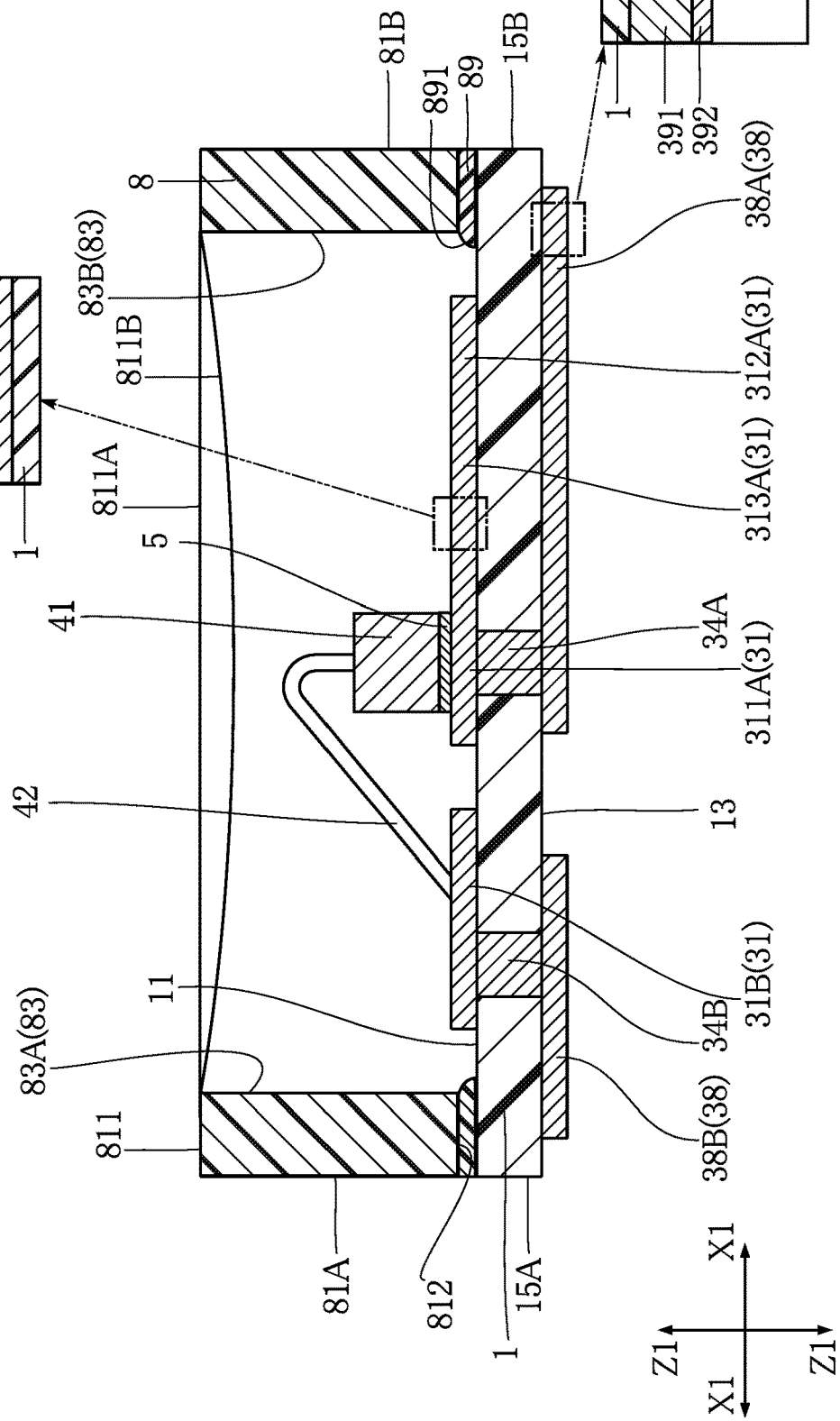
FIG. 7 is a sectional view taken along line VII-VII of FIG. 6.

The obverse-surface conductive layer 31, the first conductive part 34A, the second conductive part 34B and the reverse-surface conductive layer 38 shown, for example, in FIG. 6 form an electric current path through which electric power is supplied to the optical element 41. The obverse-surface conductive layer 31, the first conductive part 34A, the second conductive part 34B and the reverse-surface conductive layer 38 are made of one or more metals, such as Cu, Ni, Ti and Au. In the present embodiment, as shown in FIG. 7, the obverse-surface conductive layer 31, as well as the reverse-surface conductive layer 38, is made of Cu (a layer 391 may be a Cu layer) plated with Au (a layer 392 may be a Au layer). The materials of the obverse-surface conductive layer 31, the first conductive part 34A, the second conductive part 34B and the reverse-surface conductive layer 38 are not limited to those mentioned above.

The obverse-surface conductive layer 31 is formed on the obverse surface 11 of the substrate 1 and includes a first obverse-surface conductive region 311A, a second obverse-surface conductive region 312A, a third obverse-surface conductive region 313A and a fourth obverse-surface conductive region 31B.

The optical element 41 is disposed on the first obverse-surface conductive region 311A. In the present embodiment, the first obverse-surface conductive region 311A has an outer perimeter that is generally circular. The term "circular" used herein encompasses shapes that are perfectly circular and roughly circular, and the same applies hereinafter. In a different embodiment, the first obverse-surface conductive region 311A may have a different shape (e.g., rectangular) than a circular shape. Note that the term "rectangular" used herein encompasses shapes that are perfectly rectangular and roughly rectangular, and the same applies hereinafter.

The second obverse-surface conductive region 312A is spaced apart from the first obverse-surface conductive region 311A in the first direction X1. In a different embodiment, the second obverse-surface conductive region 312A may be spaced apart in an oblique direction to the first direction X1. In the present embodiment, the second obverse-surface conductive region 312A has an outer perimeter that is generally elliptical. The term "elliptical" used herein encompasses shapes that are perfectly elliptical shape, as well as shapes that are roughly elliptical, and the same applies hereinafter. In a different embodiment, the second obverse-surface conductive region 312A may have a different shape (e.g., rectangular or circular) than an elliptical shape.

The third obverse-surface conductive region 313A is located between the first obverse-surface conductive region 311A and the second obverse-surface conductive region 312A as viewed in the thickness direction Z1, connecting the first obverse-surface conductive region 311A and the second obverse-surface conductive region 312A. The third obverse-surface conductive region 313A extends from the first obverse-surface conductive region 311A in the first direction X1. As shown in FIG. 6, the third obverse-surface conductive region 313A has a dimension L13 in the second direction Y1, and this dimension L13 may be smaller than the dimension L11 of the first obverse-surface conductive region 311A in the second direction Y1. In addition, the dimension L13 of the third obverse-surface conductive region 313A may be smaller than the dimension L12 of the second obverse-surface conductive region 312A in the second direction Y1.

To the fourth obverse-surface conductive region 31B, the wire 42 is bonded. The fourth obverse-surface conductive region 31B is spaced apart from the first obverse-surface conductive region 311A in the first direction X1. In the present embodiment, the fourth obverse-surface conductive region 341A has an outer perimeter that is generally elliptical. In a different embodiment, the fourth obverse-surface conductive region 31B may have a different shape (e.g., rectangular or circular) than an elliptical shape.

Figure 8:
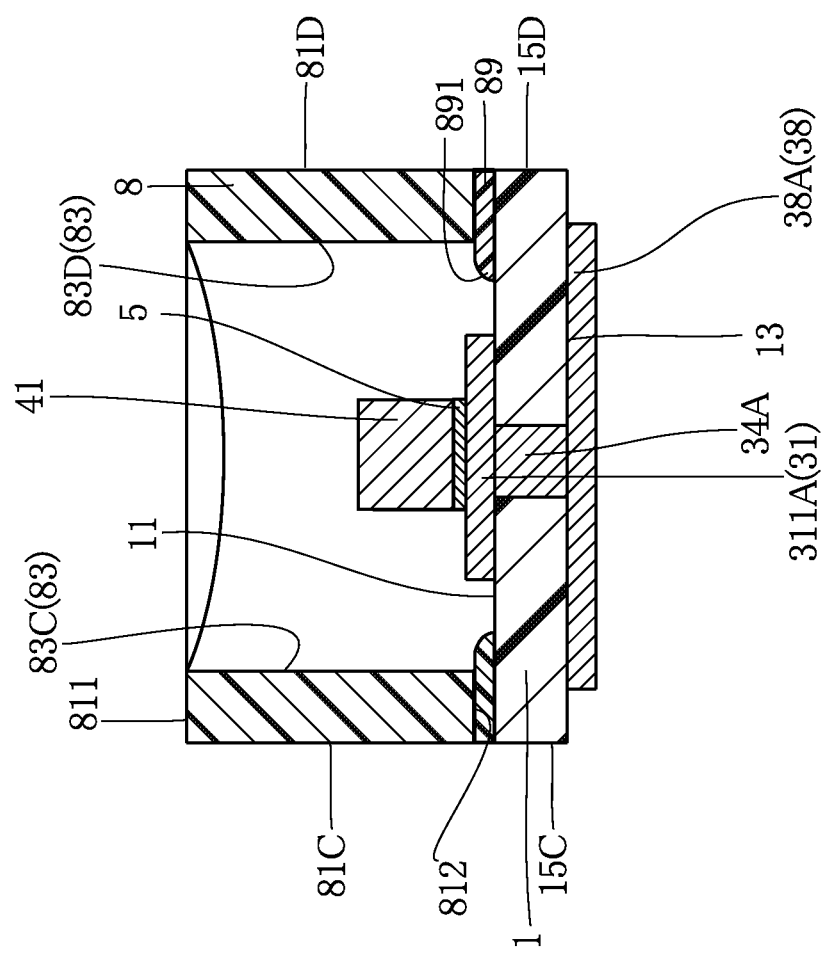
FIG. 8 is a sectional view taken along line VIII-VIII of FIG. 6.
Figure 9:
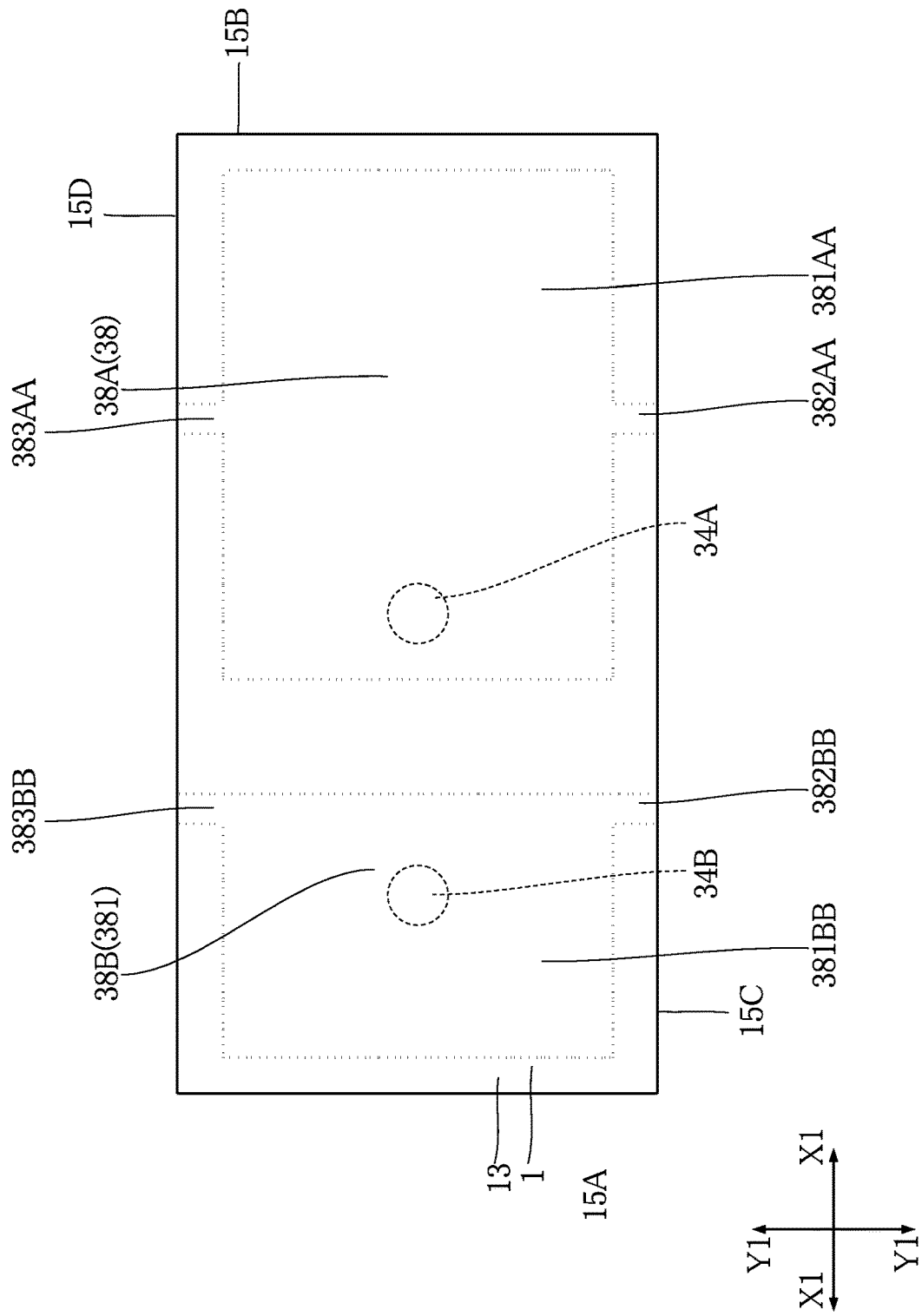
FIG. 9 is a bottom view of the optical device according to the first embodiment.

FIG. 7 is a sectional view taken along line VII-VII of FIG. 6. FIG. 8 is a sectional view taken along line VIII-VIII of FIG. 6. FIG. 9 is a bottom view of the optical device according to the first embodiment.

As shown in FIGS. 7 to 9, the reverse-surface conductive layer 38 is formed on the reverse surface 13 of the substrate 1. The reverse-surface conductive layer 38 includes a first reverse-surface conductive region 38A and a second reverse-surface conductive region 38B.

The first reverse-surface conductive region 38A has a part overlapping with the second obverse-surface conductive region 312A as viewed in the thickness direction Z1 of the substrate 1. As viewed in the thickness direction Z1, the first reverse-surface conductive region 38A extends across the reverse surface 13 of the substrate 1 from the boundary with the third side surface 15C to the boundary with the fourth side surface 15D. This configuration of the present embodiment aims to enable plating to be carried out in the manufacture of multiple optical devices A1, by allowing an electric current to flow through wiring patterns of the optical devices A1 (to form the reverse-surface conductive layers 38 and other layers). In the present embodiment, the first reverse-surface conductive region 38A is composed of segments 381AA, 382AA and 383AA. The segment 381AA is rectangular. The segment 382AA extends from the segment 381AA to the boundary between the reverse surface 13 and the third side surface 15C of the substrate 1. The segment 382AA is at a position offset from the first conductive part 34A in the direction X1. The segments 383AA extends from the segment 381AA to the boundary between the reverse surface 13 and the fourth side surface 15D of the substrate 1. The segment 383AA is at a position offset from the first conductive part 34A in the first direction X1. The segments 382AA and 383AA located offset from the first conductive part 34A in the direction X1 are preferable because this configuration allows solder to be applied in more preferable shapes to mount the optical device A1. This provides the optical device A1 that can be mounted more easily.

The second reverse-surface conductive region 38B is spaced apart from the first reverse-surface conductive region 38A in the first direction X1. The second reverse-surface conductive region 38B has a part overlapping with the fourth obverse-surface conductive region 31B as viewed in the thickness direction Z1 of the substrate 1. As viewed in the thickness direction Z1, the second reverse-surface conductive region 38B extends across the reverse surface 13 of the substrate 1 from the boundary with the third side surface 15C to the boundary with the fourth side surface 15D. This configuration of the present embodiment aims to enable plating to be carried out in the manufacture of multiple optical devices A1, by allowing an electric current to flow through the wiring patterns of the optical devices A1 (to form the reverse-surface conductive layer 38 and other layers). In the present embodiment, the second reverse-surface conductive region 38B is composed of segments 381BB, 382BB and 383BB. The segment 381BB is rectangular. The segment 382BB extends from the segment 381BB to the boundary between the reverse surface 13 and the third side surface 15C of the substrate 1. The segment 382BB is at a position offset from the second conductive part 34B in the first direction X1. The segment 383BB extends from the segment 381BB to the boundary between the reverse surface 13 and the fourth side surface 15D of the substrate 1. The segment 383BB is at a position offset from the second conductive part 34B in the first direction X1. The segments 382BB and 383BB located offset from the second conductive part 34B in the direction X1 are preferable because this configuration allows solder to be applied to in more preferable shapes to mount the optical device A1. This provides the optical device A1 that can be mounted more easily.

The first conductive part 34A shown, for example, in FIGS. 6 and 7 extends through the substrate 1. More specifically, the first conductive part 34A is formed in a through hole formed in the substrate 1. The first conductive part 34A overlaps with the first obverse-surface conductive region 311A and the first reverse-surface conductive region 38A as viewed in the thickness direction Z1 of the substrate 1. The first conductive part 34A connects the first obverse-surface conductive region 311A to the first reverse-surface conductive region 38A. As viewed in the thickness direction Z1, the entire region of the first conductive part 34A overlaps with the first obverse-surface conductive region 311A and also with the first reverse-surface conductive region 38A. In an example shown in FIG. 11 different from FIG. 6, the first conductive part 34A may overlap with the second obverse-surface conductive region 312A as viewed in the thickness direction Z1.

The second conductive part 34B extends through the substrate 1. More specifically, the second conductive part 34B is formed in a through hole formed in the substrate 1. As viewed in the thickness direction of the substrate 1, the second conductive part 34B overlaps with the fourth obverse-surface conductive region 31B and also with the second reverse-surface conductive region 38B. The second conductive part 34B connects the fourth obverse-surface conductive region 31B to the second reverse-surface conductive region 38B. As viewed in the thickness direction Z1, the entire region of the second conductive part 34B overlaps with the fourth obverse-surface conductive region 31B and also with the second reverse-surface conductive region 38B.

In the present embodiment, the first conductive part 34A and the second conductive part 34B are circular as viewed in the thickness direction Z1. In a different embodiment, the first conductive part 34A and the second conductive part 34B may have a non-circular shape as viewed in the thickness direction Z1.

The optical element 41 shown, for example, in FIG. 7 is disposed on the first obverse-surface conductive region 311A. In general, optical elements include light-emitting elements and light-receiving elements. In the present embodiment, the optical element 41 is a light-emitting element used as a light source of the optical device A1. More specifically, the optical element 41 in the present embodiment is an LED chip having an n-type semiconductor layer, an active layer and a p-type semiconductor layer. The n-type semiconductor layer is laminated on the active layer, which is laminated on the p-type semiconductor layer. That is, the active layer is located between the n-type semiconductor layer and the p-type semiconductor layer. The n-type semiconductor layer, the active layer and the p-type semiconductor layer may be made of GaN, for example. The optical element 41 includes an obverse-surface electrode pad and a reverse-surface electrode pad facing away from each other. Note that the obverse- and reverse-surface electrode pads are not shown in the figures. The optical element 41 is mounted on the substrate 1. The emission color of the optical element 41 is not specifically limited.

The wire 42 is bonded to the optical element 41 and the fourth obverse-surface conductive region 31B. The wire 42 is made of a conductive material and electrically connects the optical element 41 to the fourth obverse-surface conductive region 31B. In the present embodiment, the wire 42 extends in the first direction X1 as viewed in the thickness direction Z1.

Figure 10:
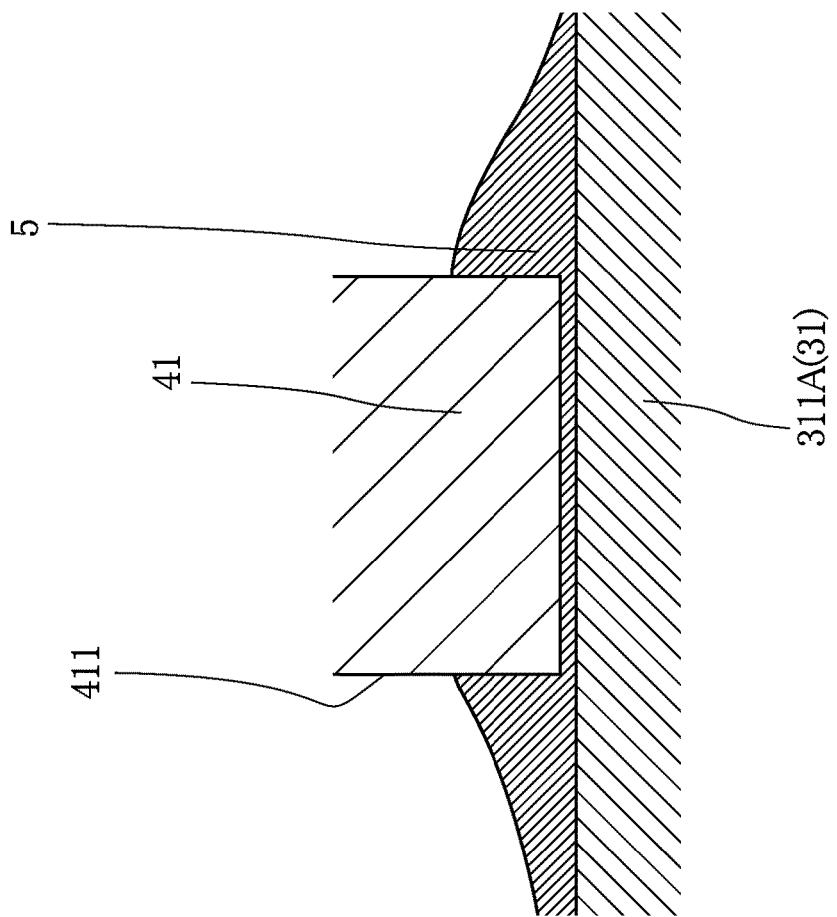
FIG. 10 is an enlarged view showing a part around the optical element of the first embodiment.
Figure 11:
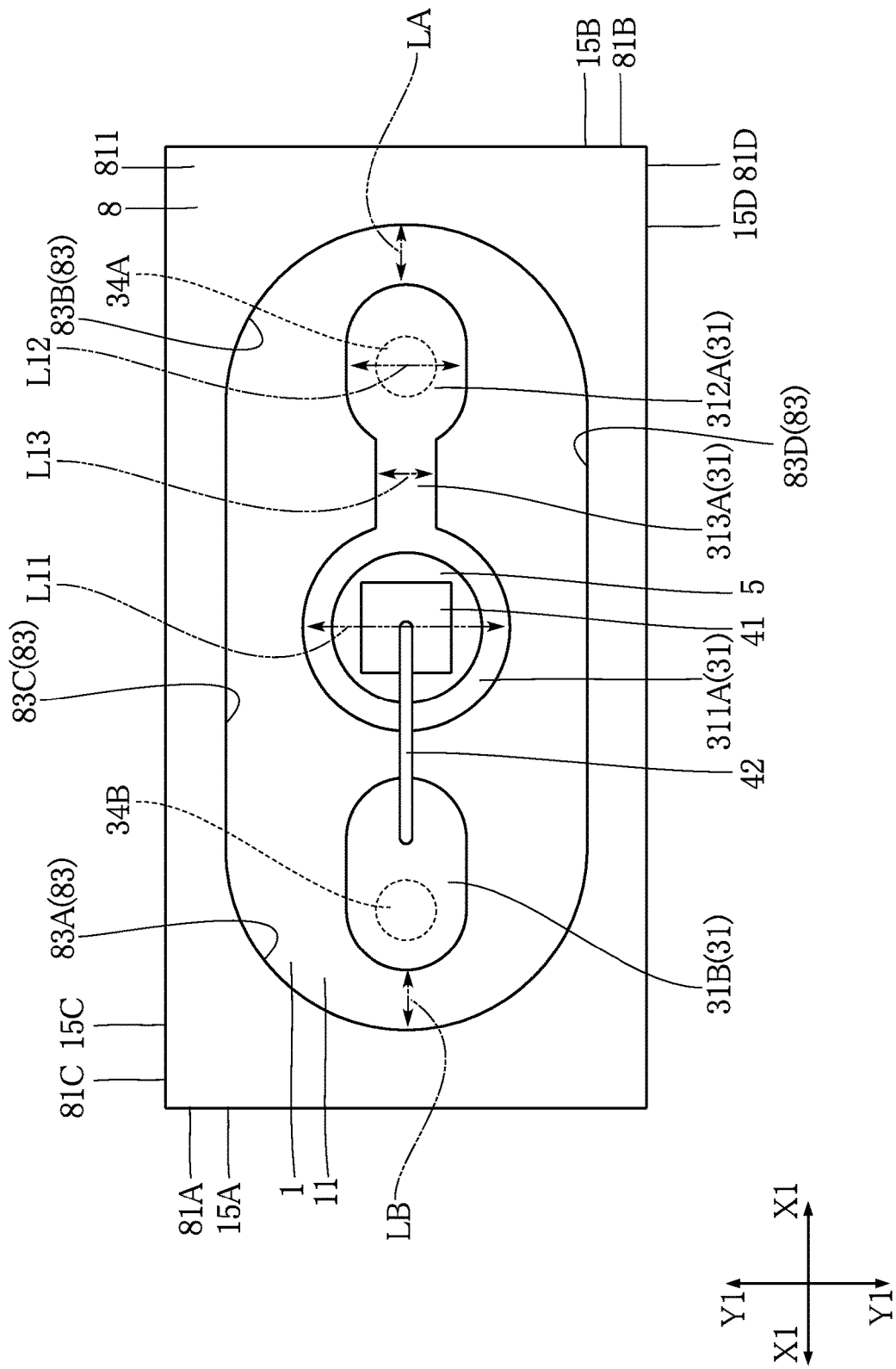
FIG. 11 is a plan view of an optical device according to a variation of the first embodiment.

As shown, for example, in FIGS. 7 and 10, the bonding layer 5 is located between the optical element 41 and the first obverse-surface conductive region 311A. The bonding layer 5 may be made from a silver paste. In a different embodiment, however, the bonding layer 5 may be made from an insulating material. In the present embodiment, the bonding layer 5 is preferably in contact with the side surfaces 411 of the optical element 41 and the first obverse-surface conductive region 311A, so that the optical element 41 can be held more firmly.

The reflector 8 shown, for example, in FIGS. 6, 7 and 8 is disposed on the substrate 1. The reflector 8 may be bonded to the substrate 1 via a bonding layer 89. As shown in FIGS. 7 and 8, the bonding layer 89 may have a segment 891 projecting inward beyond the reflector 8. Note that other embodiments and variations, which will be described layer, may also have a bonding layer 89 provided with a segment 891 shown in FIGS. 7 and 8. Preferably, the reflector 8 is made of a material that blocks transmission of light. In particular, where the optical element 41 is a light-emitting element, the reflector 8 may be made of a material not allowing passage of light emitted from the light-emitting element. In a case where the optical element 41 is a light-receiving element, the reflector 8 may be made of a material not allowing passage of light that can be received by the light-receiving element. The reflector 8 may be formed integrally (i.e., an integral piece). In a case where the optical element 41 is a light-emitting element, the reflector 8 can restrict lateral leakage of light emitted from the optical element 41.

In the present embodiment, the reflector 8 and the substrate 1 contain the same material. In one example, the reflector 8 is made of an epoxy resin, whereas the substrate 1 is made of an epoxy resin containing glass. That is to say, the reflector 8 and the substrate 1 both contain an epoxy resin. In a different embodiment, the reflector 8 and the substrate 1 may be made of mutually different materials. For example, the reflector 8 may be made of a liquid crystal polymer or nylon.

The reflector 8 has a reflector-obverse surface 811, a reflector-reverse surface 812, a first reflector-outer surface 81A, a second reflector-outer surface 81B, a third reflector-outer surface 81C, a fourth reflector-outer surface 81D and an inner surface 83.

The reflector-obverse surface 811 faces in the same direction as the obverse surface 11 of the substrate 1. In the present embodiment, the reflector-obverse surface 811 has an edge 811A and an edge 811B. The edge 811A of the reflector-obverse surface 811 is an outer edge defining a rectangular shape. The edge 811B of the reflector-obverse surface 811 is an inner edge defining a curved shape. In the embodiment shown, for example, in FIG. 3, the separation distance of the edge 811B from the obverse surface 11 of the substrate 1 in the Z1 direction is smaller than that of the edge 811A. This configuration is preferable, in the manufacture of the optical device A1, for manipulating tools to hold the optical element 41 or to bond a wire without the tools touching the inner surface 83 of the reflector 8. This configuration is also preferable, in the transport of the optical device A1, for a gripping tool to grip the optical device A1 by, for example, the reflector-outer surfaces 81C and 81D. The reflector-obverse surface 811 includes a flat region and a curved region. The reflector-reverse surface 812 faces away from the reflector-obverse surface 811. In this embodiment, the reflector-reverse surface 812 is flat.

The inner surface 83 is connected to the reflector-obverse surface 811 and the reflector-reverse surface 812. The inner surface 83 extends from the reflector-obverse surface 811 to the reflector-reverse surface 812. In the present embodiment, the inner surface 83 forms an angle of 90° with the reflector-obverse surface 811 and also with the reflector-reverse surface 812. In a different embodiment, the inner surface 83 may form an angle other than 90° with each of the reflector-obverse surface 811 and the reflector-reverse surface 812. In short, the inner surface 83 may be inclined with respect to the direction Z1.

As shown in FIG. 6, the inner surface 83 surrounds the optical element 41 as viewed in the thickness direction Z1. In the present embodiment, the entire regions of the obverse-surface conductive layer 31 are located entirely inside the inner surface 83 as viewed in the thickness direction Z1. Similarly, the entire regions of the first conductive part 34A and the second conductive part 34B are located inside the inner surface 83 as viewed in the thickness direction Z1. In FIG. 6, the second obverse-surface conductive region 312A is located between the first obverse-surface conductive region 311A and the inner surface 83 of the reflector 8 as viewed in the thickness direction Z1. The second obverse-surface conductive region 312A is separated from the inner surface 83 at a separation distance LA, which may be 40 to 100 μm, for example. The separation distance LA may be smaller than the separation distance LB between the second obverse-surface conductive region 312A and the first obverse-surface conductive region 311A. In FIG. 6, the fourth obverse-surface conductive region 31B is separated from the inner surface 83 of the reflector 8 as viewed in the thickness direction Z1. The separation distance LC of the fourth obverse-surface conductive region 31B from the inner surface 83 may be 40 to 100 μm, for example.

The inner surface 83 includes a first segment 83A, a second segment 83B, a third segment 83C and a fourth segment 83D. The first segment 83A and the second segment 83B are spaced apart from each other in the first direction X1. In the present embodiment, each of the first segment 83A and the second segment 83B is semicircular as viewed in the thickness direction Z1. The third segment 83C and the fourth segment 83D are spaced apart from each other in the second direction Y1. The third segment 83C and the fourth segment 83D are each connected to the first segment 83A and the second segment 83B. In the present embodiment, each of the third segment 83C and the fourth segment 83D is substantially straight as viewed in the thickness direction Z1.

In a different embodiment, the first segment 83A and the second segment 83B may be substantially straight instead of semicircular. In another different embodiment, the inner surface 83 may have a circular shape as viewed in the thickness direction Z1.

As shown, for example, in FIGS. 6 and 7, the reflector-outer surface 81A and the second reflector-outer surface 81B are spaced apart in the first direction X1 and face away from each other. The first reflector-outer surface 81A and the second reflector-outer surface 81B are both connected to the reflector-obverse surface 811 and the reflector-reverse surface 812. The first reflector-outer surface 81A and the second reflector-outer surface 81B are both flat.

As shown, for example, in FIGS. 6 and 8, the third reflector-outer surface 81C and the fourth reflector-outer surface 81D are spaced apart in the second direction Y1 and face away from each other. The third reflector-outer surface 81C and the fourth reflector-outer surface 81D are both connected to the reflector-obverse surface 811 and the reflector-reverse surface 812. The third reflector-outer surface 81C and the fourth reflector-outer surface 81D are both flat.

The first side surface 15A is flush with the first reflector-outer surface 81A. Similarly, the second side surface 15B is flush with the second reflector-outer surface 81B, the third side surface 15C with the third reflector-outer surface 81C, and the fourth side surface 15D with the fourth reflector-outer surface 81D. This is because the substrate 1 and the reflector 8 are cut at a time in a dicing process, respectively from a substrate 100 and a reflector 800 (both of which will be described later).

Figure 12:
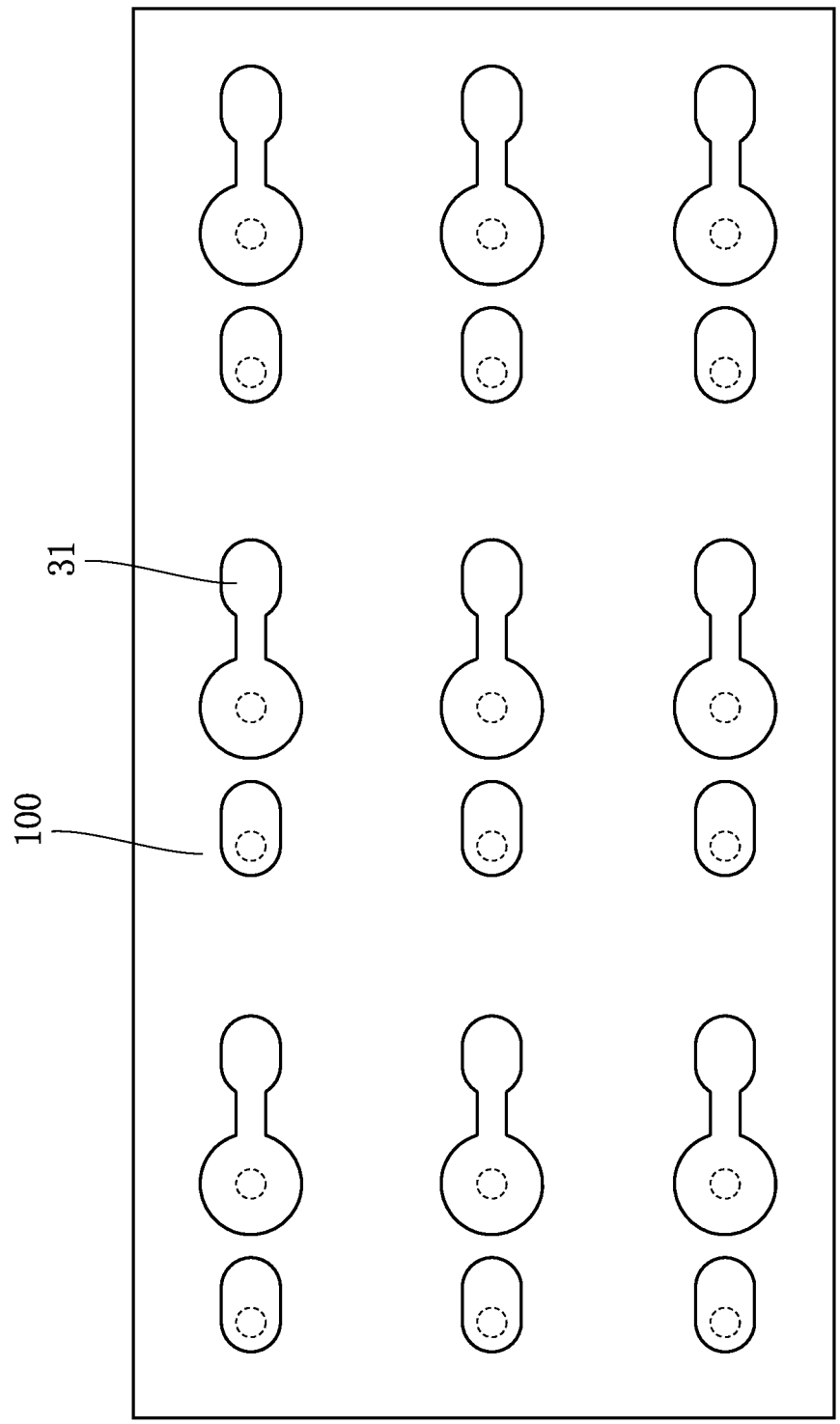
FIG. 12 is a view showing a step of manufacturing the optical element according to the first embodiment.
Figure 13:
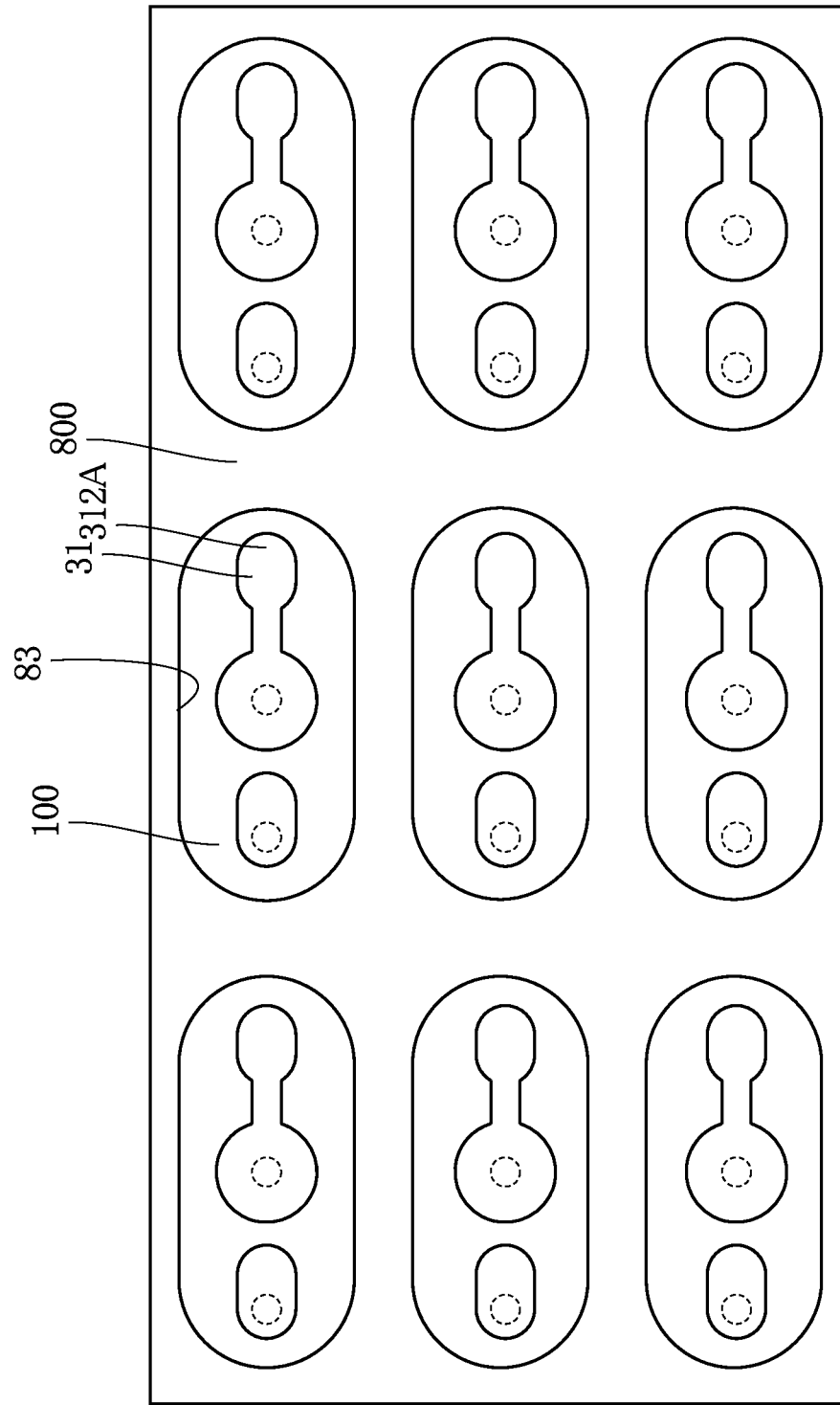
FIG. 13 is a view showing a step of manufacturing the optical element according to the first embodiment.
Figure 14:
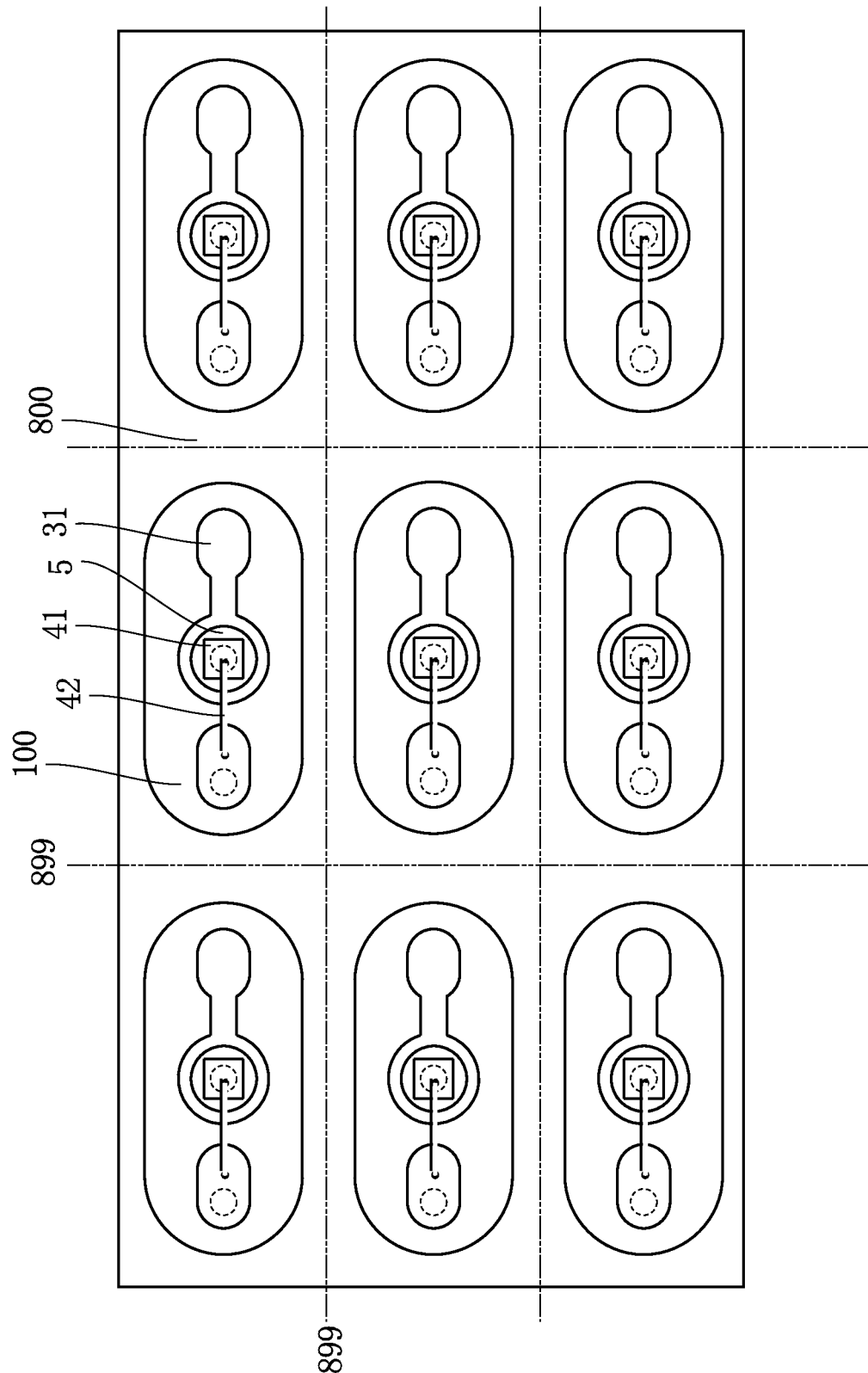
FIG. 14 is a view showing a step of manufacturing the optical element according to the first embodiment.

The following now describes a method for manufacturing the optical device A1 according to the present embodiment, with reference to FIGS. 12 to 14. In particular, the present embodiment provides an example in which a plurality of optical devices A1 are manufactured. In the following description, the same reference signs as above are used to denote the same or similar elements.

First, a rectangular substrate 100 (see FIG. 12) is prepared. As shown, for example, in FIG. 12, the substrate 100 is of a size large enough for multiple substrates 1. The substrate 100 is made of the same material (glass epoxy resin) as described above for the substrate 1. Next, wiring patterns (corresponding to the obverse-surface conductive layers 31, the reverse-surface conductive layers 38 and so on) are formed on the substrate 100. The wiring patterns are formed by plating Cu foil with Au.

Next, as shown in FIG. 13, a reflector 800 is attached to the substrate 100 using an adhesive, for example. The reflector 800 has a plurality of openings (each having an inner surface 83) formed by, for example, drilling or molding.

Next, as shown in FIG. 14, optical elements 41 are disposed on the obverse-surface conductive layers 31 via bonding layers 5. Then, wires 42 are attached by wire bonding to connect the optical elements 41 to the obverse-surface conductive layer 31. As a result, each optical element 41 is electrically connected to an obverse-surface conductive layer 31.

Next, the thus obtained intermediate product shown in FIG. 14 is diced along lines 899 into a plurality of optical devices A1, each of which is identical to the one shown, for example, in FIG. 6. In the process of dicing the intermediate product, the substrate 100 and the reflector 800 are cut at a time. Although the manufacturing method is described using an example in which a plurality of optical devices A1 are manufactured at a time, the optical devices A1 may as well be manufactured one by one at a time.

Now, advantages of the present embodiment are described.

In the present embodiment, the first obverse-surface conductive region 311A is where the optical element 41 is mounted, and the second obverse-surface conductive region 312A is located between the first obverse-surface conductive region 311A and the inner surface 83 of the reflector 8 as viewed in the thickness direction Z1. The second obverse-surface conductive region 312A is spaced apart from the inner surface 83 of the reflector 8 as viewed in the thickness direction Z1. This configuration allows the reflector 8 to be located where the second obverse-surface conductive region 312A is not present, so that the reflector 8a can be securely mounted on the substrate 1. In addition, the reflector 8 can reflect light from the optical element 41 at higher brightness.

The present embodiment ensures that the reflector 8 (i.e., reflector 800 in FIG. 13) is placed on the substrate 1 without covering the second obverse-surface conductive region 312A as much as possible. This configuration ensures as much as possible that the reflector 8 is not disposed on an uneven surface due to a step formed by the second obverse-surface conductive region 312A. As a result, the reflector 8 can be securely mounted on the substrate 1 without being inclined.

In the present embodiment, all the regions of the obverse-surface conductive layer 31 are located inside the inner surface 83 as viewed in the thickness direction Z1. This configuration ensures that the reflector 8 does not overlap with the obverse-surface conductive layer 31, enabling the reflector 8 to be securely mounted on the substrate without being inclined.

In the present embodiment, the optical device A1 includes the bonding layer 5 located between and in contact with the optical element 41 and the obverse-surface conductive layer 31. The present embodiment ensures the following during the manufacture of the optical device A1. That is, when a paste for forming the bonding layer 5 is applied to the first obverse-surface conductive region 311A, the paste is not allowed to flow into the second obverse-surface conductive region 312A and then to reach the inner surface 83 of the reflector 8. That is, the paste is kept from flowing across the inner surface 83 of the reflector 8 to reach another region of the obverse-surface conductive layer 31 (the fourth obverse-surface conductive region 31B, for example). This provides an advantage of minimizing the risk of a short circuit between the fourth obverse-surface conductive region 31B and the second obverse-surface conductive region 312A, even if the bonding layer 5 has electrical conductivity.

In the present embodiment, the reflector 8 and the substrate 1 contain the same material, ensuring that the reflector 8 and the substrate 1 have the same or similar thermal expansion coefficient. Consequently, the reflector 8 and the substrate 1 are expected to undergo the same degree of thermal expansion or contraction, which is effective in keeping the reflector 8 and the substrate 1 from warping.

First Variation of First Embodiment

With reference to FIGS. 15 to 18, a first variation of the first embodiment of the present disclosure is described.

In the following description, the same reference signs as above are used to denote the same or similar elements.

Figure 15:
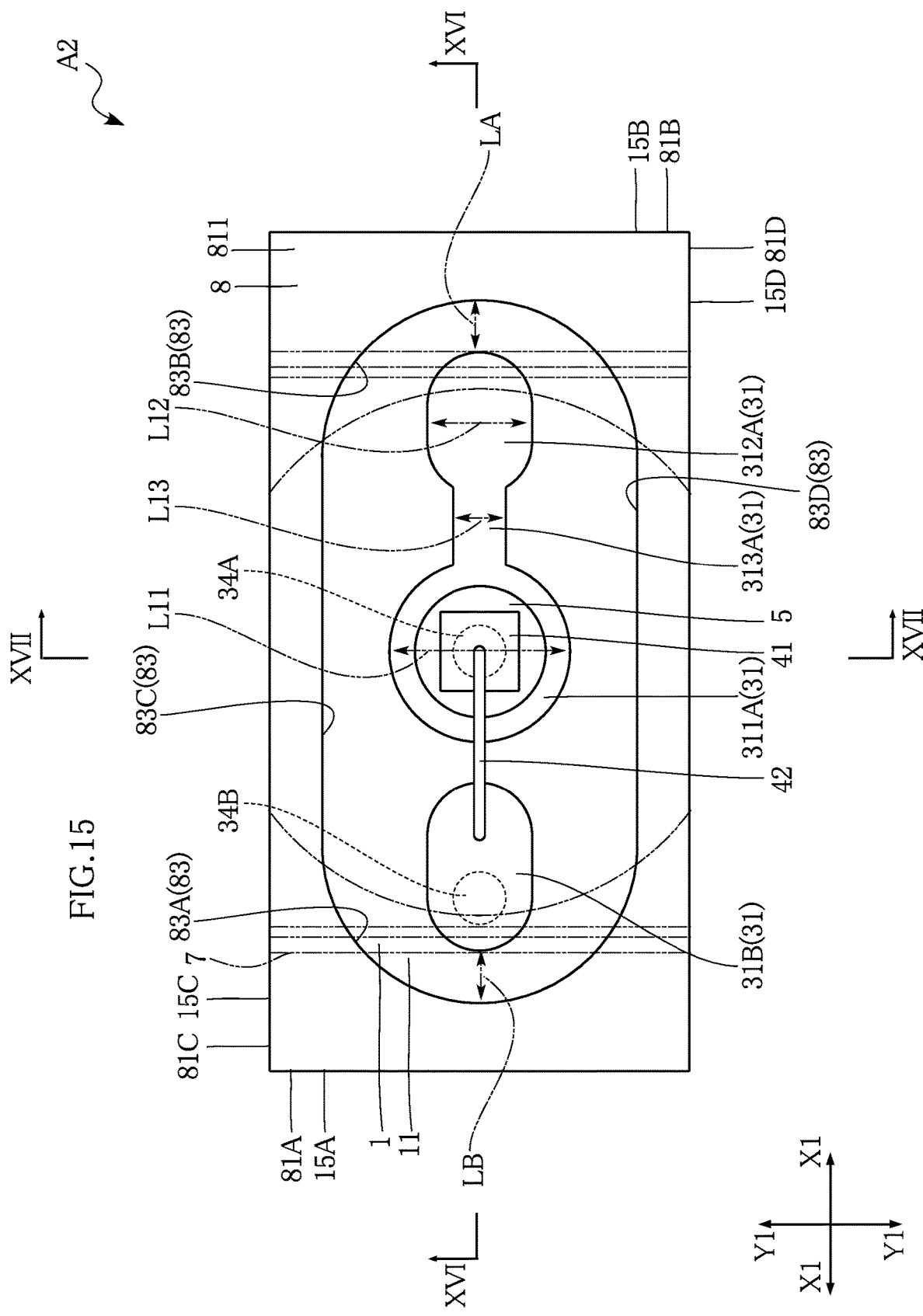
FIG. 15 is a plan view of an optical device according to a first variation of the first embodiment.
Figure 16:
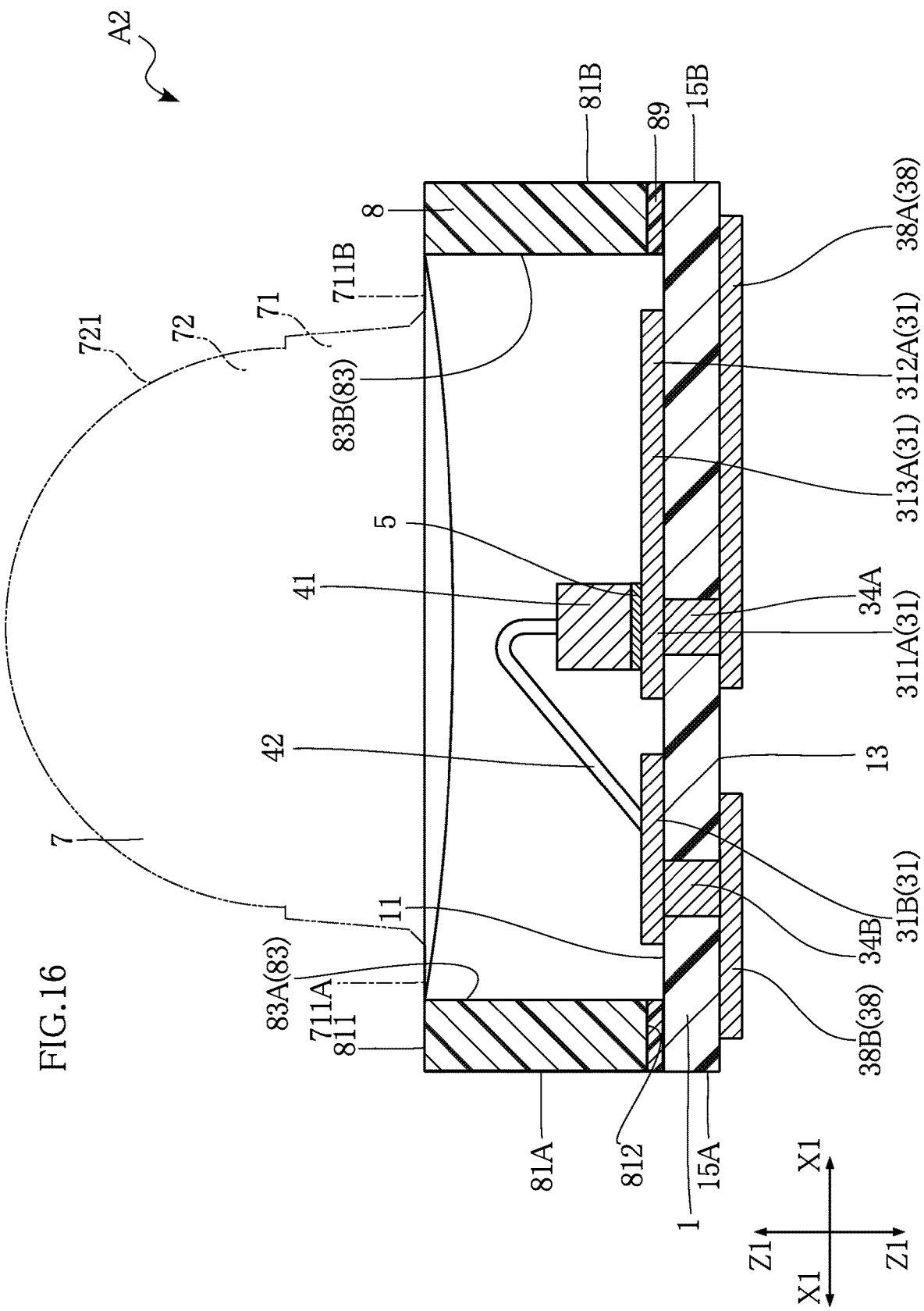
FIG. 16 is a sectional view taken along line XVI-XVI of FIG. 15.
Figure 17:
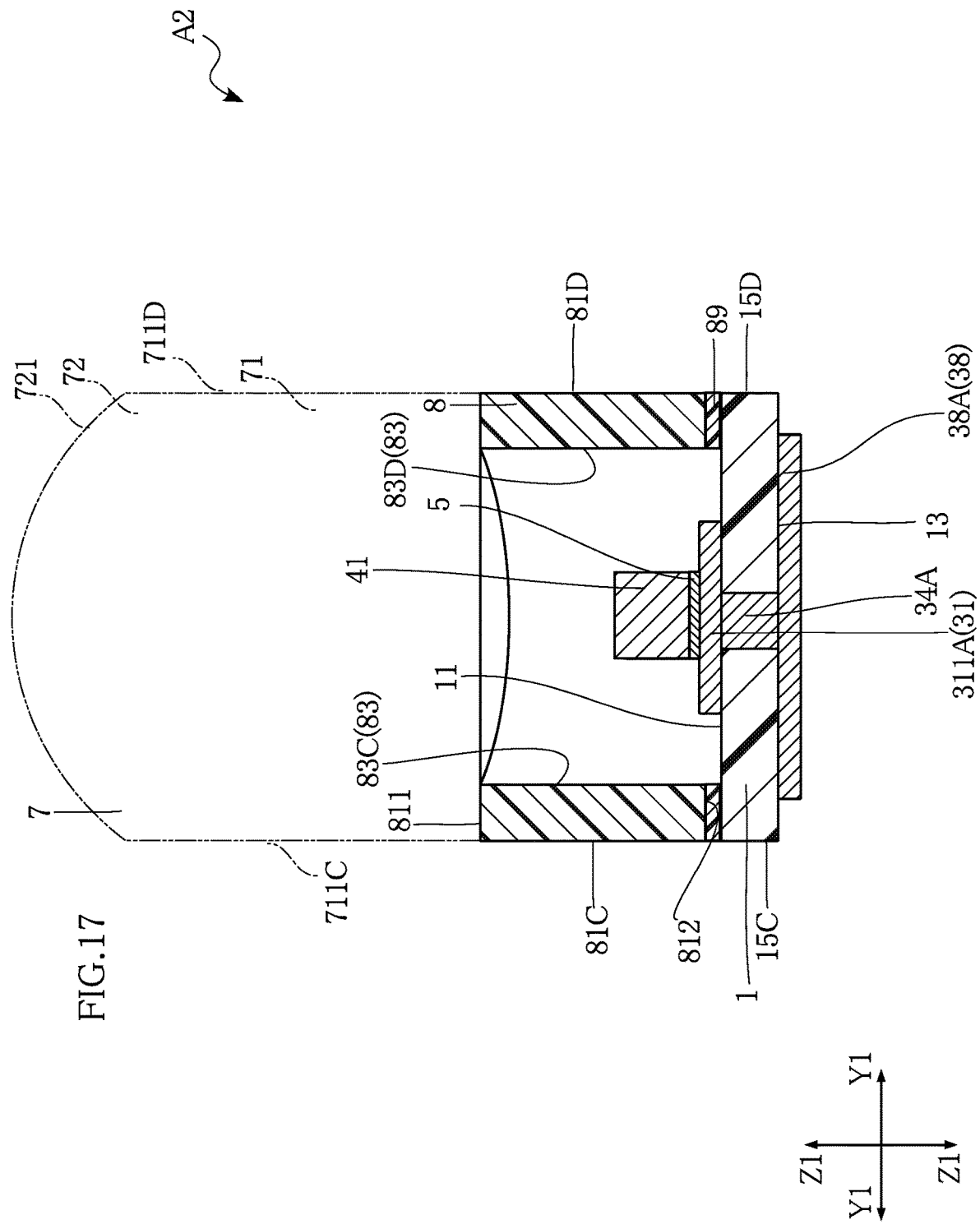
FIG. 17 is a sectional view taken along line XVII-XVII of FIG. 15.
Figure 18:
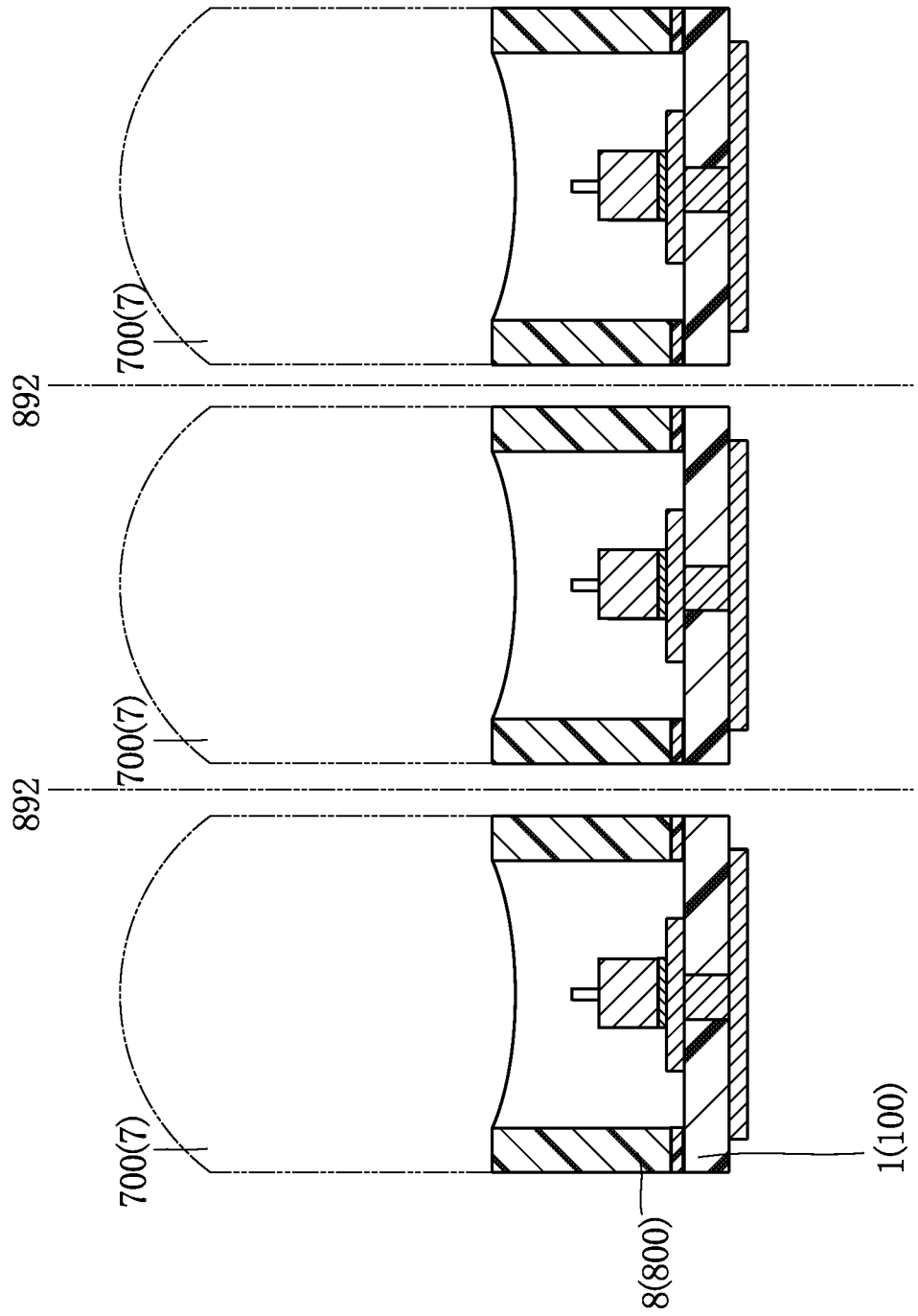
FIG. 18 is a view showing a step of manufacturing the optical element according to the first variation of the first embodiment.

FIG. 15 is a plan view of an optical device according to the first variation of the first embodiment. FIG. 16 is a sectional view taken along line XVI-XVI of FIG. 15. FIG. 17 is a sectional view taken along line XVII-XVII of FIG. 15.

The optical device A2 of the present variation is similar to the optical device A1, except that a light-transmitting resin package 7 is additionally included. In FIGS. 15 to 17, the light-transmitting resin package 7 is shown by dash-double-dot lines.

The light-transmitting resin package 7 is disposed on the substrate 1. Specifically, the light-transmitting resin package 7 covers the substrate 1, the optical element 41, the obverse-surface conductive layer 31, the wire 42 and the reflector 8. The light-transmitting resin package 7 is made of a material that passes light. In particular, in a case where the optical element 41 is a light-emitting element, the light-transmitting resin package 7 may be made of a material allowing passage of light emitted from the light-emitting element. In a case where the optical element 41 is a light-receiving element, the light-transmitting resin package 7 may be made of a material allowing passage of light that can be received by the light-receiving element. Examples of resins usable to form the light-transmitting resin package 7 include a transparent or semi-transparent epoxy resin, silicone resin, acrylic resin and polyvinyl resin.

The light-transmitting resin package 7 may be formed integrally (i.e., an integral piece). The light-transmitting resin package 7 may contain a fluorescent material that emits light of a different wavelength when excited by the light from the optical element. In this variation, the light-transmitting resin package 7 contains no filler, unlike a resin package of so-called a black resin. The light-transmitting resin package 7 may be formed by molding.

The light-transmitting resin package 7 has a first light-transmitting segment 71 and a second light-transmitting segment 72. The first light-transmitting segment 71 is located between the second light-transmitting segment 72 and the substrate 1. The first light-transmitting segment 71 has light-transmitting outer surfaces 711A, 711B, 711C and 711D.

The light-transmitting outer surface 711A is flush with the reflector-obverse surface 811 of the reflector 8. Similarly, the light-transmitting outer surface 711B is flush with the reflector-obverse surface 811 of the reflector 8. In the manufacture of the optical device A2, the light-transmitting outer surfaces 711A and 711B and the reflector-obverse surface 811 are formed by pressing flat surfaces of a mold therapainst. The light-transmitting outer surfaces 711C and 711D (two light-transmitting outer surfaces) face away from each other. The light-transmitting outer surface 711C is flat and flush with the third reflector-outer surface 81C and with the third side surface 15C. Similarly, the light-transmitting outer surface 711D is flat and flush with the fourth reflector-outer surface 81D and with the fourth side surface 15D. This is because the substrate 1, the reflector 8, and the light-transmitting resin package 7 are cut at a time in a dicing process, respectively from a substrate 100, a reflector 800 and a light-transmitting resin package 700 (all of which will be described later).

The second light-transmitting segment 72 has a curved surface 721, which is curved outward in the direction from the substrate 1 to the optical element 41. The curved surface 721 overlaps with the optical element 41 as viewed in the thickness direction Z1.

The optical device A2 is manufactured through the same steps as with the optical device A1 up to the steps shown in FIG. 14. In a step subsequent to the step shown in FIG. 14, a light-transmitting resin package 700 is formed on the substrate 100 by die molding to obtain an intermediate product shown in FIG. 18. Next, the intermediate product is diced along lines 892 into a plurality of optical devices A2.

This variation provides the following advantages in addition to those provided by the optical device A1.

In the optical device A2 as shown in FIG. 17, the light-transmitting outer surface 711C is flush with the third reflector-outer surface 81C and the light-transmitting outer surface 711D is flush with the fourth reflector-outer surface 81D. In a case where the optical element 41 is a light-emitting element, this configuration ensures total reflection to occur at the light-transmitting outer surface 711C and the light-transmitting outer surface 711D. As a result, more light emitted from the light-emitting element and traveling in the light-transmitting resin package 7 can exit in the thickness direction Z1. In a case where the optical element 41 is a light-receiving element, this configuration allows more light traveling toward the optical device A2 in the thickness direction Z1 to be received by the light-receiving element. In this way, the optical device A2 of improved capability is provided.

Second Variation of First Embodiment

Figure 19:
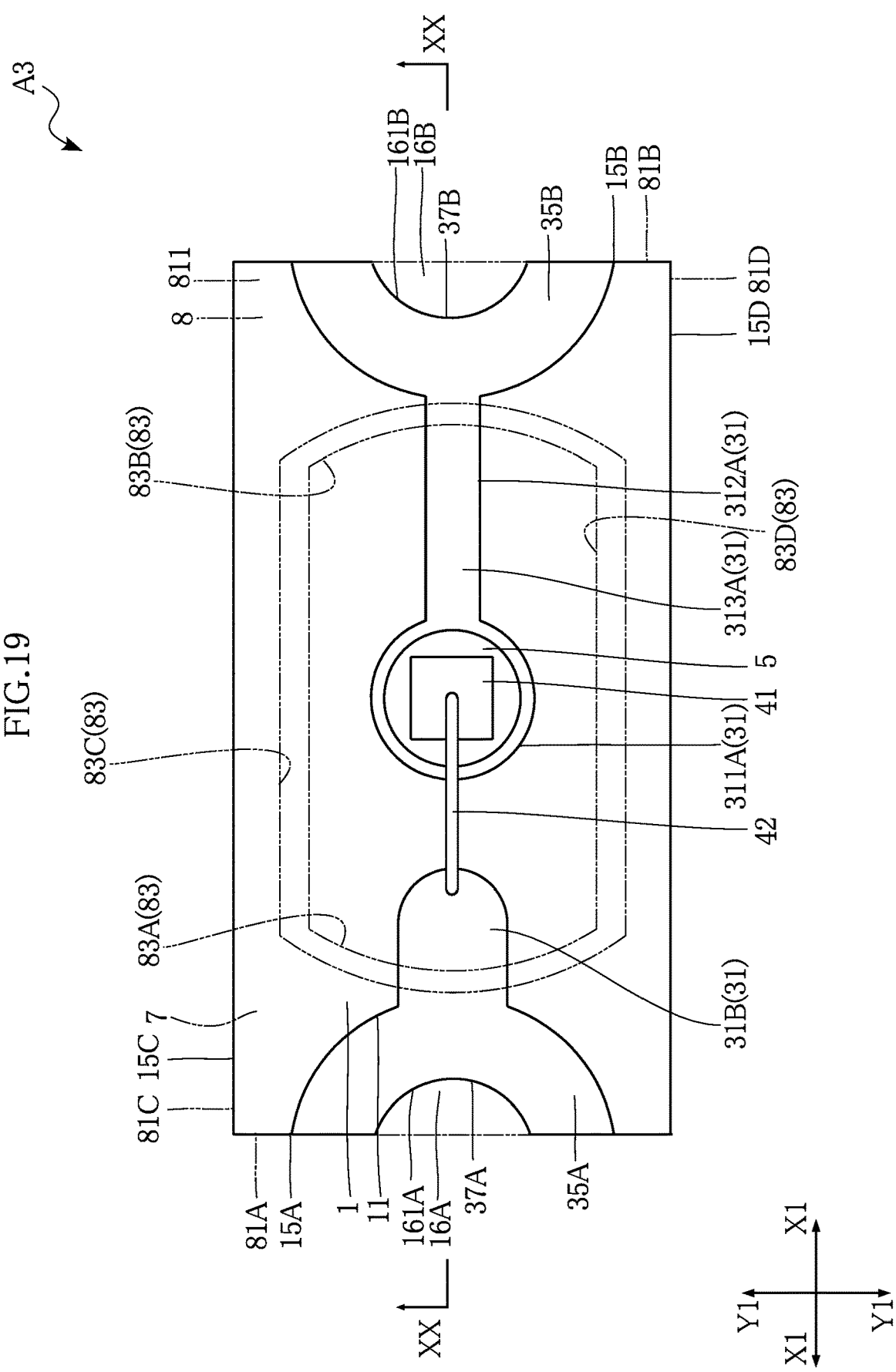
FIG. 19 is a plan view of an optical device according to a second variation of the first embodiment.
Figure 20:
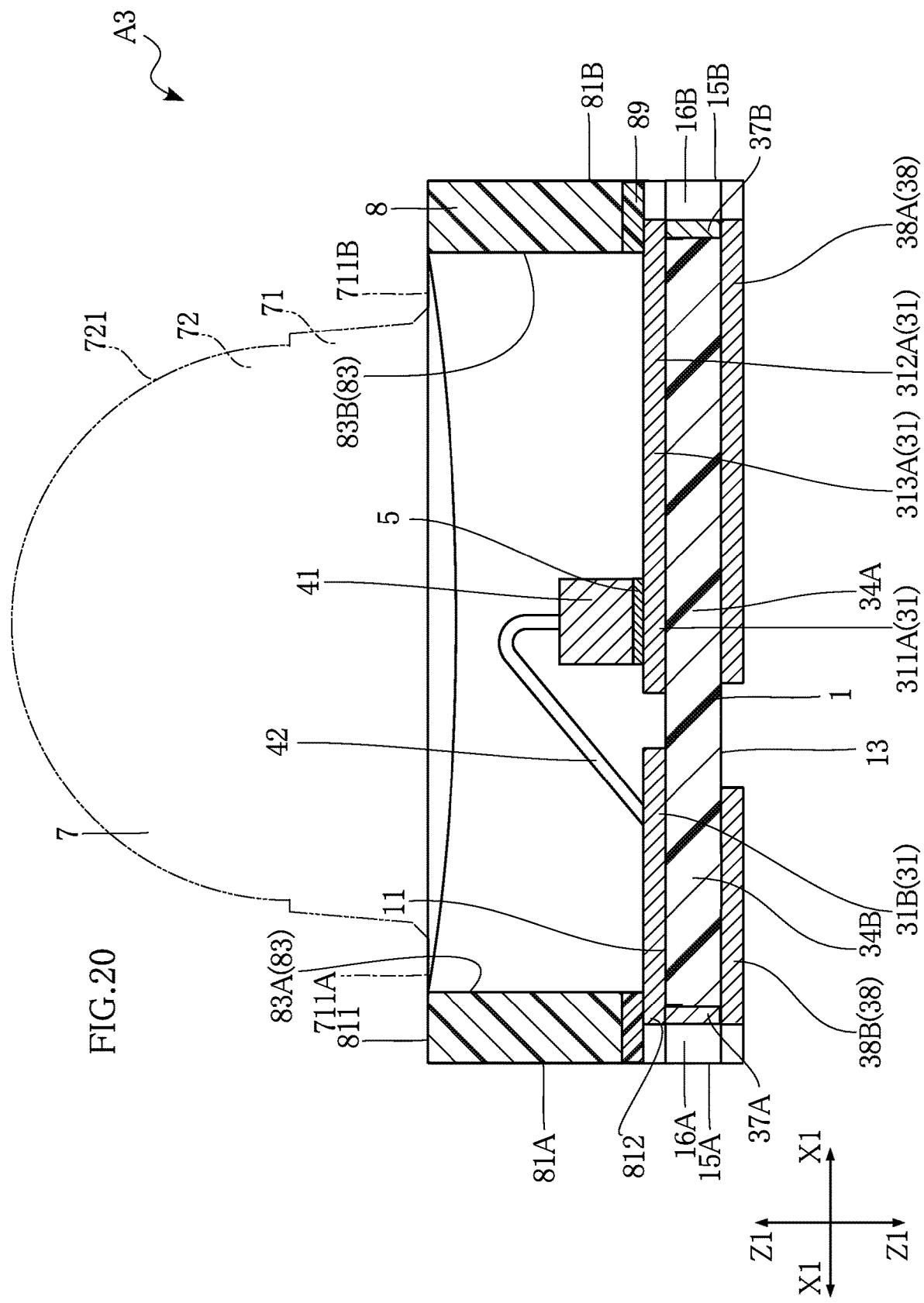
FIG. 20 is a sectional view taken along line XX-XX of FIG. 19.
Figure 21:
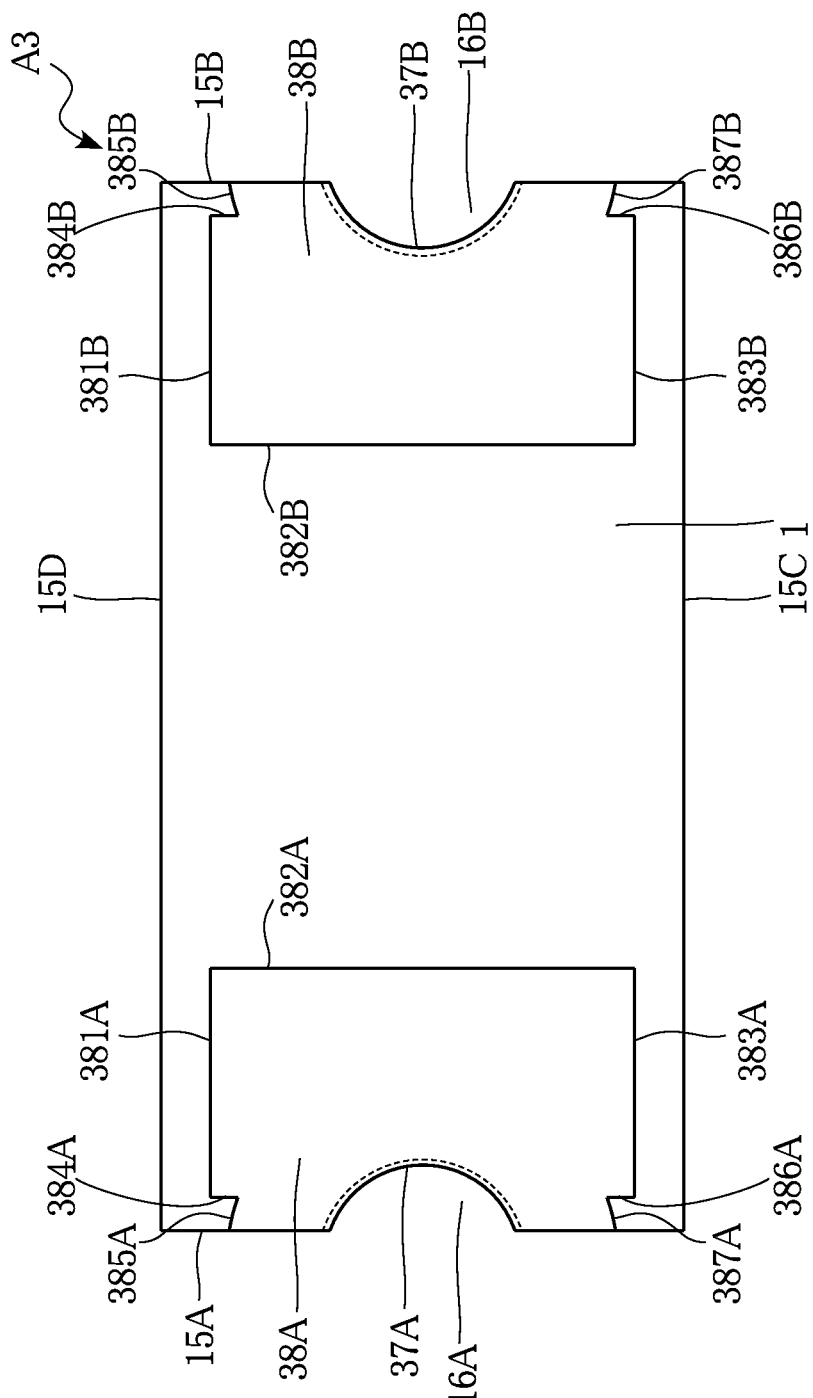
FIG. 21 is a bottom view of the optical device according to the second variation of the first embodiment.

With reference to FIGS. 19 to 21, the following describes a second variation of the embodiment of the present disclosure.

FIG. 19 is a plan view of an optical device according to the second variation of the first embodiment. FIG. 20 is a sectional view taken along line XX-XX of FIG. 19. FIG. 21 is a plan view of the optical device according to the second variation of the first embodiment.

An optical device A3 of this variation is similar to the optical device A2, other than the shapes of the obverse-surface conductive layer, the reverse-surface conductive layer, the first conductive part and the second conductive part.

The substrate 1 has an obverse surface 11, a reverse surface 13, a first side surface 15A, a second side surface 15B, a third side surface 15C and a fourth side surface 15D.

The obverse surface 11 and the reverse surface 13 are spaced apart in the thickness direction Z1 of the substrate 1 and face away from each other. The obverse surface 11 and the reverse surface 13 are both flat.

The first side surface 15A and the second side surface 15B are spaced apart in the first direction X1 and face away from each other. The first side surface 15A and the second side surface 15B are both connected to the obverse surface 11 and the reverse surface 13. The first side surface 15A and the second side surface 15B are both flat.

The substrate 1 has a first concavity 16A and a second concavity 16B that are recessed inward from the first side surface 15A and the second side surface 15B, respectively. The first concavity 16A and the second concavity 16B both extend from the obverse surface 11 to the reverse surface 13. In the present embodiment, each of the first concavity 16A and the second concavity 16B is semicircular as viewed in the thickness direction Z1 of the substrate 1.

The third side surface 15C and the fourth side surface 15D are spaced apart in the second direction Y1 and face away from each other. The third side surface 15C and the fourth side surface 15D are both connected to the obverse surface 11 and the reverse surface 13. The third side surface 15C and the fourth side surface 15D are both flat.

The obverse-surface conductive layer 31 includes a first obverse-surface conductive region 311A, a second obverse-surface conductive region 312A, a first end region 35A, a fourth obverse-surface conductive region 31B and a second end region 35B. The description of the first obverse-surface conductive region 311A is omitted here because the relevant description given for the optical device A1 applies here.

The second obverse-surface conductive region 312A extends from the first obverse-surface conductive region 311A in the first direction X1. As shown in FIG. 19, the first end region 35A extends along an edge 161A of the first concavity 16A. In the present embodiment, the first end region 35A has a half-annular shape. The first end region 35A is continuous with the fourth obverse-surface conductive region 31B. The second end region 35B extends along the edge 161B of the second concavity 16B. In the present embodiment, the second end region 35B has a half-annular shape. The second end region 35B is continuous with the second obverse-surface conductive region 312A.

The first conductive part 37A is formed on the inner surface of the first concavity 16A and connected to the first end region 35A. The second conductive part 37B is formed on the inner surface of the second concavity 16B and connected to the second end region 35B. When the optical device A3 is mounted on a wired substrate, solder adheres to the first conductive part 37A and the second conductive part 37B and forms solder fillets.

As shown in FIG. 21, the reverse-surface conductive layer 38 includes a first reverse-surface conductive region 38A and a second reverse-surface conductive region 38B.

The first reverse-surface conductive region 38A is connected to the first conductive part 37A. The first reverse-surface conductive region 38A has edges 381A to 387A. The edge 381A extends in the first direction X1. The edge 382A extends in the second direction Y1 from the edge 381A. The edge 383A extends in the first direction X1 from the edge 382A. The edge 384A extends in the second direction Y1 from the edge 381A. The edge 384A is shorter than the edge 382A. The edge 385A defines a circular arc extending from the edge 384A. The edge 385A reaches an outer edge of the reverse surface 13 of the substrate 1 in the first direction X1. The edge 386A extends in the second direction Y1 from the edge 383A. The edge 386A is shorter than the edge 382A. The edge 387A defines a circular extending from the edge 386A. The edge 387A reaches the outer edge of the reverse surface 13 of the substrate 1 in the first direction X1.

The second reverse-surface conductive region 38B is connected to the second conductive part 37B. The second reverse-surface conductive region 38B has edges 381B to 387B. The edge 381B extends in the first direction X1. The edge 382B extends in the second direction Y1 from the edge 381B. The edge 383B extends in the first direction X1 from the edge 382B. The edge 384B extends in the second direction Y1 from the edge 381B. The edge 384B is shorter than the edge 382B. The edge 385B defines a circular arc extending from the edge 384B. The edge 385B reaches an outer edge of the reverse surface 13 of the substrate 1 in the first direction X1. The edge 386B extends in the second direction Y1 from the edge 383B. The edge 386B is shorter than the edge 382B. The edge 387B defines a circular arc extending from the edge 386B. The edge 387B reaches the outer edge of the reverse surface 13 of the substrate 1 in the first direction X1.

The optical device of this variation provides the same advantages as those described for the optical device A2.

The present disclosure is not limited to the specific embodiments described above. Various design modifications may be made to the specific configurations of each part of the present disclosure.

The first embodiment of the present disclosure encompasses the following clauses.

Clause A1.

An optical device comprising:
a substrate having an obverse surface and a reverse surface facing away from each other;
an obverse-surface conductive layer formed on the obverse surface of the substrate, the obverse-surface conductive layer including a first obverse-surface conducting region and a second obverse-surface conductive region;
a reverse-surface conductive layer formed on the reverse surface of the substrate;
a first conductive part extending through the substrate and overlapping with the first obverse-surface conducting region and the reverse-surface conductive layer as viewed in a thickness direction of the substrate;
an optical element disposed on the obverse-surface conductive layer; and
a reflector disposed on the substrate, the reflector having an inner surface that surrounds the optical element as viewed in the thickness direction,
wherein the optical element is located on first obverse-surface conducting region, and the second obverse-surface conducting region is located between the first obverse-surface conducting region and the inner surface of the reflector as viewed in the thickness direction, and
wherein the second obverse-surface conducting region is spaced apart from the inner surface of the reflector as viewed in the thickness direction.

Clause A2.

The optical device according to Clause A1, further comprising a bonding layer disposed between and in contact with the optical element and the obverse-surface conductive layer.

Clause A3.

The optical device according to Clause A1 or A2,
wherein an entirety of the obverse-surface conductive layer is located inside the inner surface as viewed in the thickness direction.

Clause A4.

The optical device according to any of Clauses A1 to A3,
wherein the first conductive part is located inside the inner surface as viewed in the thickness direction.

Clause A5.

The optical device according to any of Clauses A1 to A4,
wherein a distance between the second obverse-surface conducting region and the inner surface is smaller than a distance between the second obverse-surface conducting region and the first obverse-surface conducting region.

Clause A6.

The optical device according to any of Clauses A1 to A5,
wherein the obverse-surface conductive layer includes a third obverse-surface conducting region that is disposed between the first obverse-surface conducting region and the second obverse-surface conducting region as viewed in the thickness direction and that connects the first obverse-surface conducting region and the second obverse-surface conducting region.

Clause A7.

The optical device according to Clause A6,
wherein the third obverse-surface conducting region extends from the first obverse-surface conducting region in a first direction, and
wherein the third obverse-surface conducting region is smaller than the first obverse-surface conducting region in dimension in a second direction that is perpendicular to both the first direction and the thickness direction.

Clause A8.

The optical device according to Clause A7, wherein the third obverse-surface conducting region is smaller than the second obverse-surface conducting region in dimension in the second direction.

Clause A9.

The optical device according to any of Clauses A6 to A8, further comprising a wire bonded to the optical element and the obverse-surface conductive layer, wherein the obverse-surface conductive layer includes a fourth obverse-surface conducting region to which the wire is bonded, and wherein the fourth obverse-surface conducting region is spaced apart from the inner surface of the reflector as viewed in the thickness direction.

Clause A10.

The optical device according to Clause A9, further comprising a second conductive part that extends through the substrate, the second conductive part overlapping with the fourth obverse-surface conducting region and the reverse-surface conductive layer as viewed in the thickness direction of the substrate, wherein the second conductive part is located inside the inner surface as viewed in the thickness direction.

Clause A11.

The optical device according to Clause A10, wherein the reverse-surface conductive layer includes a first reverse-surface conductive region and a second reverse-surface conductive region, wherein the first reverse-surface conductive region overlaps with the first conductive part and the reflector as viewed in the thickness direction, and wherein the second reverse-surface conductive region overlaps with the second conductive part and the reflector as viewed in the thickness direction.

Clause A12.

The optical device according to Clause A1, wherein the substrate has two side surfaces facing away from each other, wherein the substrate has: a first boundary between the reverse surface and one of the side surfaces; and a second boundary between the reverse surface and the other of the side surfaces, and wherein the reverse-surface conductive layer extends on the reverse surface of the substrate from the first boundary to the second boundary as viewed in the thickness direction.

Clause A13.

The optical device according to any of Clauses A1 to A12, wherein the reflector and the substrate contain the same material.

Clause A14.

The optical device according to any of Clauses A11 to A13, wherein the reflector is made of an opaque material.

Clause A15.

The optical device according to any of Clauses A11 to A14, further comprising alight-transmitting resin package disposed on the substrate, wherein the light-transmitting resin package has two light-transmitting outer surfaces facing away from each other, wherein the reflector has two reflector outer surfaces facing away from each other, wherein each of the two light-transmitting outer surfaces and the two reflector outer surfaces is parallel to the thickness direction of the substrate, and wherein the two light-transmitting outer surfaces are flush with the two reflector outer surfaces, respectively.

Clause A16.

The optical device according to Clause A15, wherein the light-transmitting resin package has a surface curved outward in a direction from the substrate to the optical element.

Second Embodiment

Figure 22:
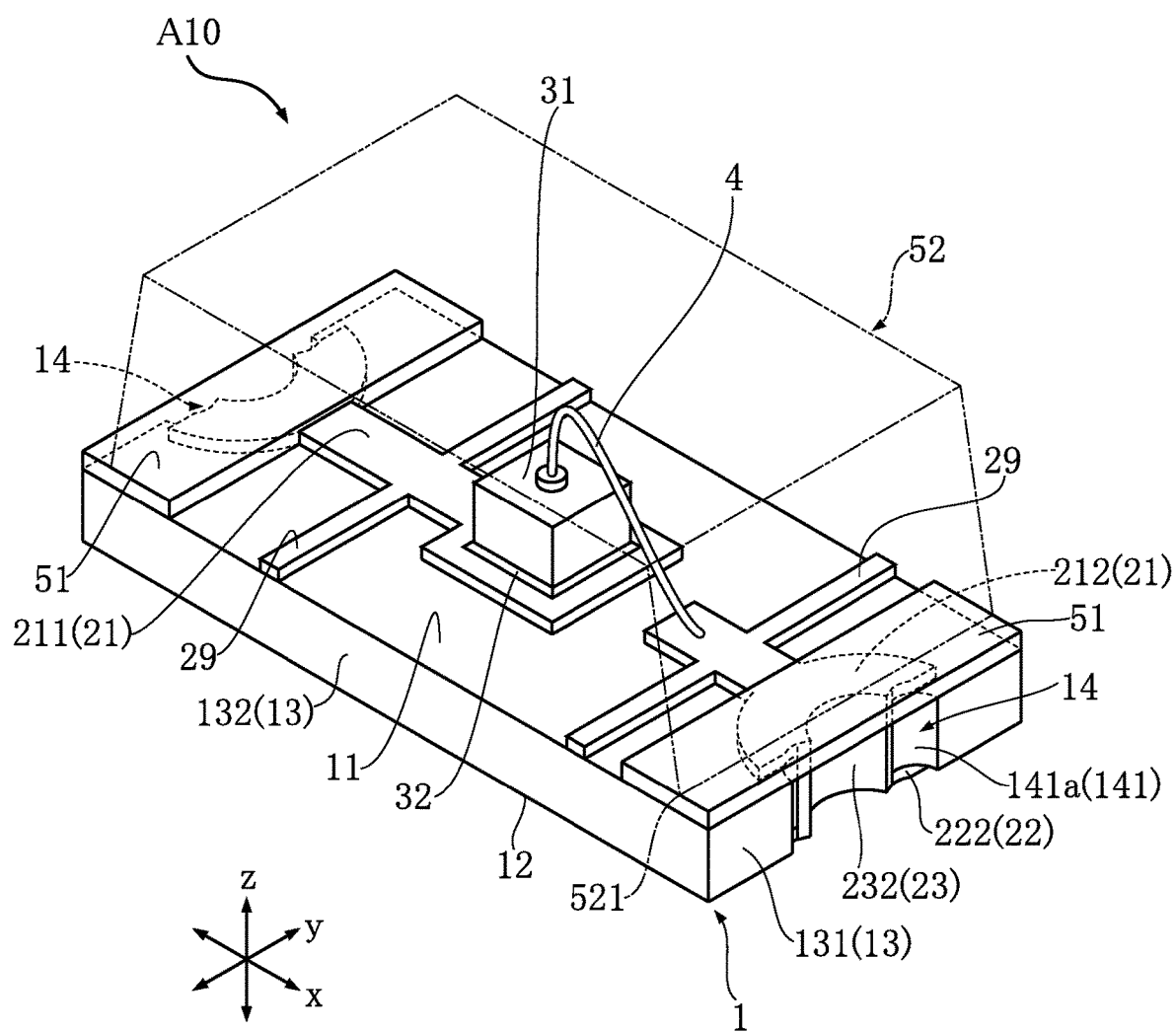
FIG. 22 is a perspective view of a semiconductor device (with a sealing resin shown in shown in phantom) according to a second embodiment of the present disclosure.
Figure 23:
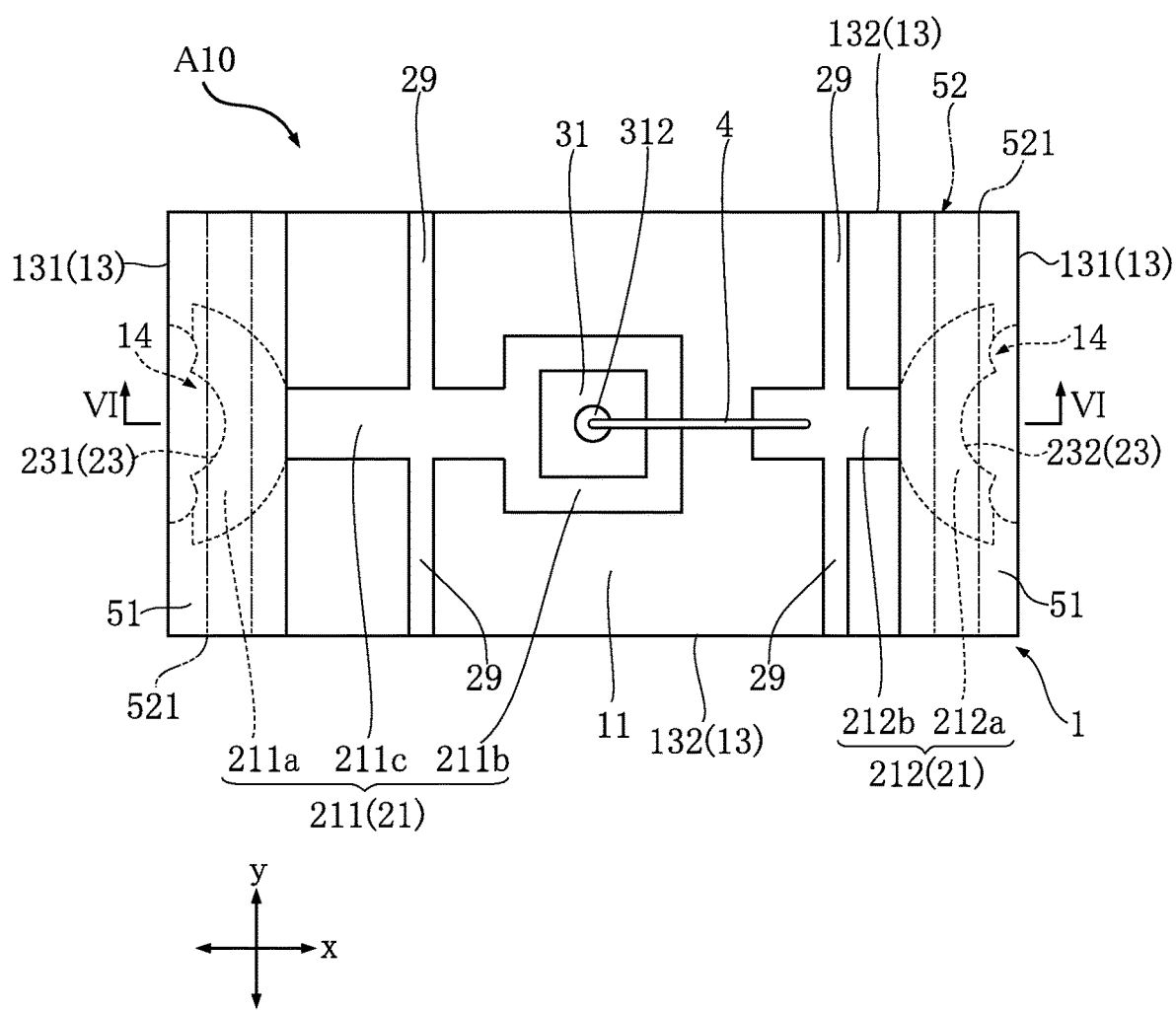
FIG. 23 is a plan view of the semiconductor device (with the sealing resin shown in phantom) of FIG. 22.

The following describes a semiconductor device A10 according to a second embodiment of the present disclosure, with reference to FIGS. 22 to 29. The reference numerals in the second and third embodiments are not related to the reference numerals in the first embodiment. The semiconductor device A10 includes a substrate 1, obverse-surface electrodes 21, reverse-surface electrodes 22, middle electrodes 23, wiring layers 29, a semiconductor element 31, a wire 4, coatings 51 and a sealing resin 52. For convenience, the sealing resin 52 in FIGS. 22 and 23 are shown in phantom by the dash-double-dot lines indicating the outline of the sealing resin 52.

The semiconductor device A10 shown in the figures is an LED package containing a light-emitting diode as the semiconductor element 31. The semiconductor device A10 is designed for surface mounting on a wired substrate. As shown in FIGS. 22 and 23, the semiconductor device A10 is rectangular as viewed in the thickness direction z of the substrate 1 (hereinafter "plan view"). For convenience of explanation, the longitudinal direction of the semiconductor device A10 perpendicular to the thickness direction z of the substrate 1 (hereinafter, simply "thickness direction z") is referred to as a first direction x. The short direction of the semiconductor device A10 perpendicular to both the thickness direction z and the first direction x is referred to as a second direction y. In addition, "one direction" used in the present disclosure refers to the first direction.

Figure 24:
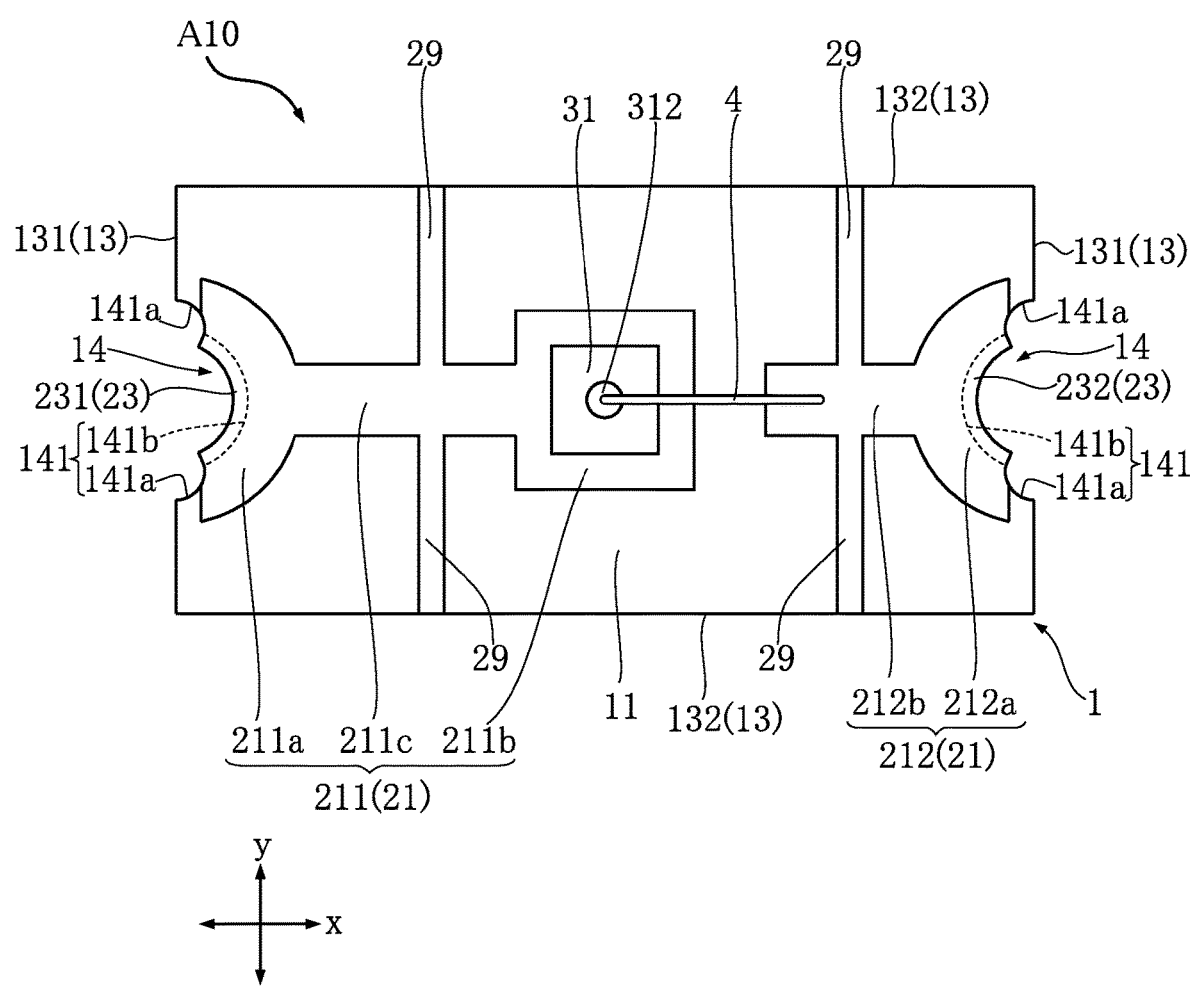
FIG. 24 shows the semiconductor device of FIG. 23, without coatings and the sealing resin.

As shown in FIGS. 22 to 27, the substrate 1 is an electrical insulating member on which the obverse-surface electrodes 21, the reverse-surface electrodes 22, the middle electrodes 23 and the wiring layers 29 are disposed and the semiconductor element 31 and the sealing resin 52 are supported. The substrate 1 may be made of, for example, glass epoxy resin or alumina ($Al_2O_3$). As shown in FIGS. 22 to 24, the substrate 1 is rectangular elongated in the first direction x in plan view. The substrate 1 has an obverse surface 11, a reverse surface 12 and side surfaces 13.

As shown in FIGS. 22 to 24, 26 and 27, the obverse surface 11 faces in one direction along the thickness direction z. The obverse-surface electrodes 21 are disposed on the obverse surface 11, and the semiconductor element 31 is disposed on one of the obverse-surface electrodes 21. In the present embodiment, the wiring layers 29 and the coatings 51 are also disposed on the obverse surface 11.

As shown in FIGS. 22 and 25 to 27, the reverse surface 12 faces the other direction along the thickness direction z. That is, the obverse surface 11 and the reverse surface 12 face away from each other in the thickness direction z. The reverse-surface electrodes 22 are disposed on the reverse surface 12, which are for mounting the semiconductor device A10 on a printed substrate.

As shown in FIGS. 22 to 27, each side surfaces 13 meets both the obverse surface 11 and the reverse surface 12. The side surfaces 13 include a pair of first side surfaces 131 spaced apart from each other in the first direction x and a pair of side surfaces 132 spaced apart from each other in the second direction y.

As shown in FIGS. 22 to 25, each of the first side surfaces 131 has a concavity 14 that is recessed inward in the substrate 1 in plan view. Note that neither of the second side surfaces 132 has a concavity 14. As shown in FIGS. 24 to 28, each concavity 14 is recessed from a corresponding side surface 13 in plan view and has an inner surface 141 extending from the obverse surface 11 to the reverse surface 12. The inner surface 141 includes a pair of first regions 141a recessed from the side surface 13 and a second region 141b recessed from the first regions 141a. In the present embodiment, the first regions 141a are separated from each other in the second direction y, and the second region 141b is located therebetween. That is, each concavity 14 of the present embodiment is composed of a pair of first regions 141a and a second region 141b forming a two-stepped groove across the substrate 1 in the thickness direction z. Each of the first regions 141a and the second region 141b defines an inwardly curved surface of the substrate 1 in plan view. The middle electrodes 23 are disposed on the second regions 141b to electrically connect the obverse-surface electrodes 21 and the reverse-surface electrodes 22. The middle electrodes 23 include a first middle electrode 231 and a second middle electrode 232 spaced apart from each other in the first direction x.

Figure 28:
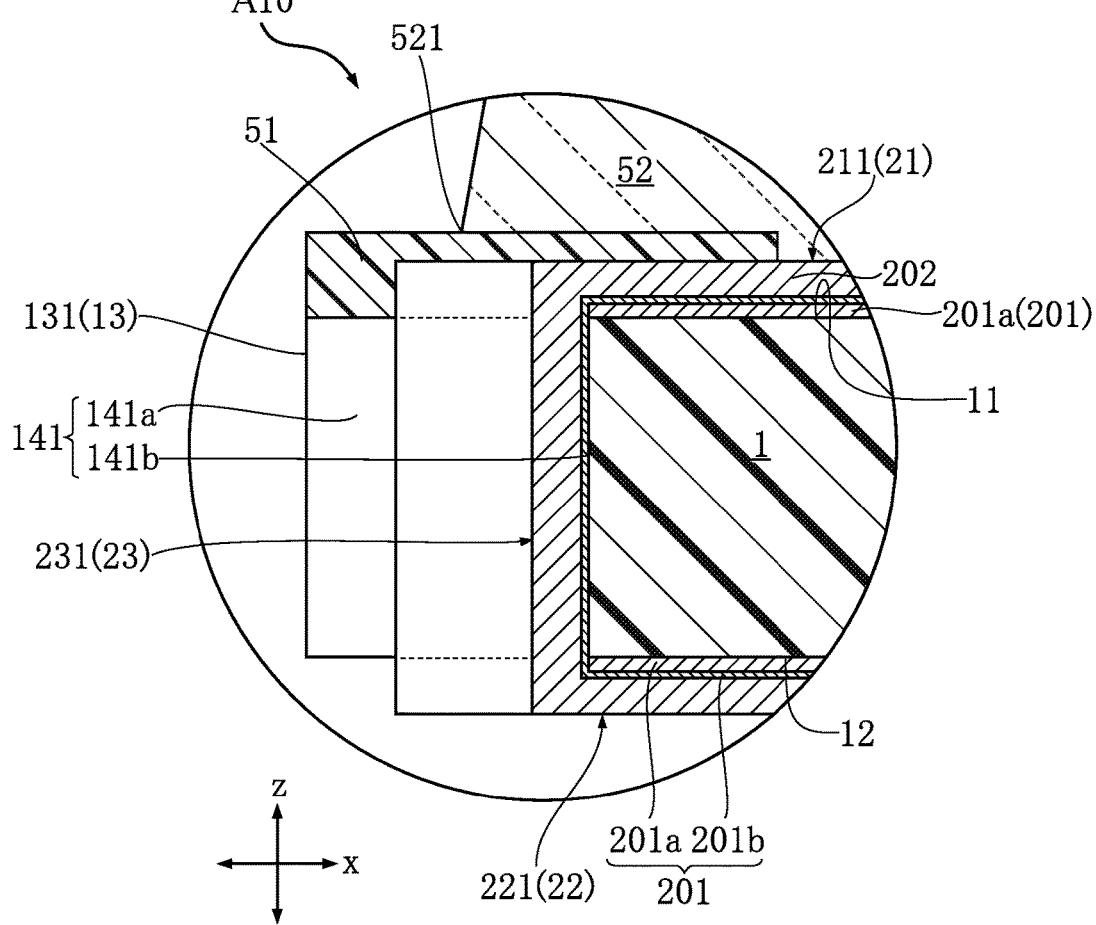
FIG. 28 is a partially enlarged view of FIG. 27 (showing a part around a concavity)
Figure 29:
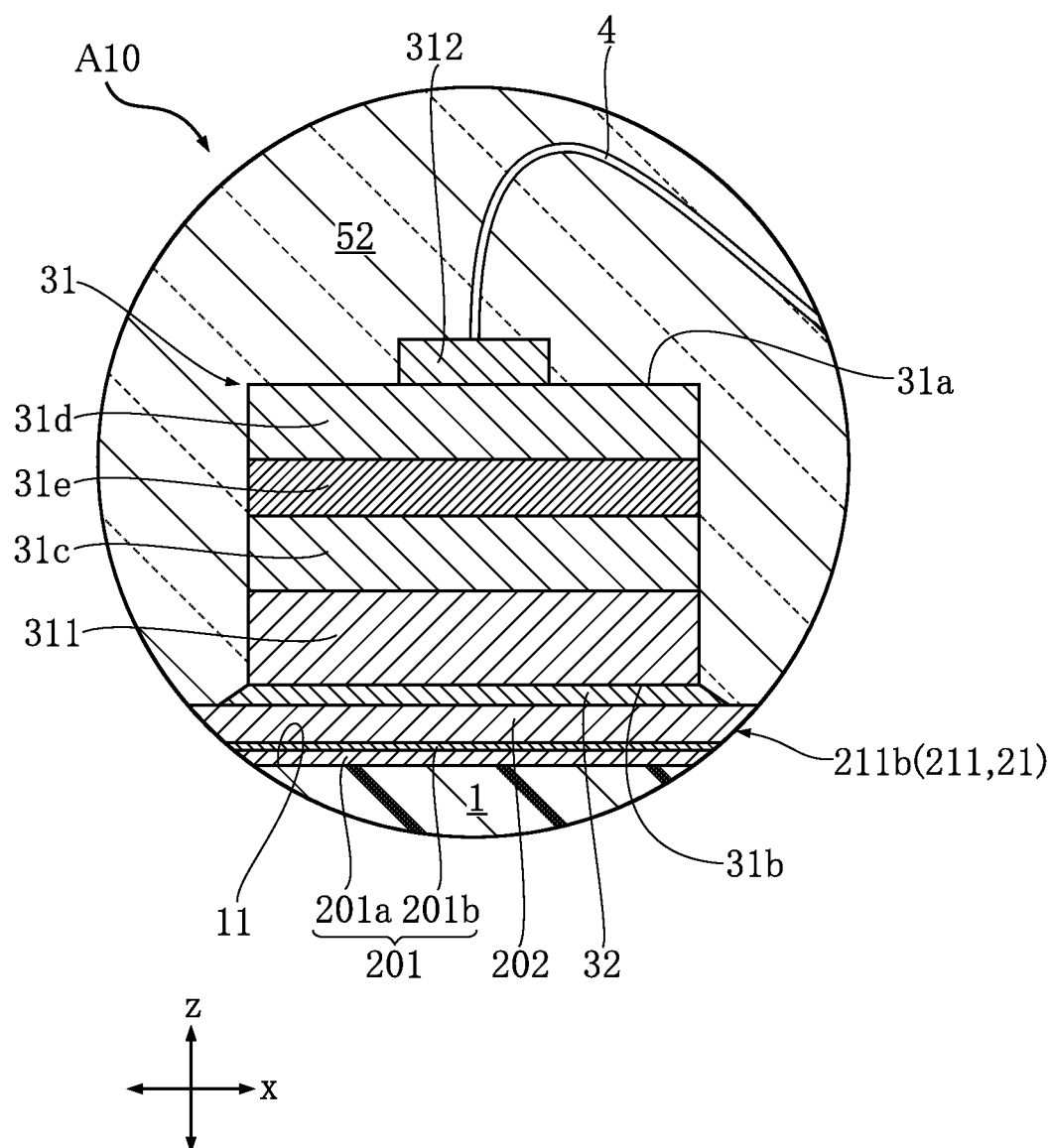
FIG. 29 is a partially enlarged view of FIG. 27 (showing a part around a semiconductor element)

As shown in FIGS. 22 to 24 and 27, the obverse-surface electrodes 21 are conductive members disposed on the obverse surface 11. In the present embodiment, the obverse-surface electrodes 21 include a first obverse-surface electrode 211 on which the semiconductor element 31 is mounted, and a second obverse-surface electrode 212 that is spaced apart from the first obverse-surface electrode 211 in the first direction x. As shown in FIGS. 28 and 29, each obverse-surface electrode 21 includes a Cu layer 201 and a plating layer 202 as its components. The Cu layer 201 contains Cu and is in contact with the substrate 1. In the present embodiment, the Cu layer 201 is composed of a first layer 201a and a second layer 201b. The first layer 201a is in contact with the obverse surface 11, and the second layer 201b covers the first layer 201a. In the manufacture of the semiconductor device A10, the first layers 201a are formed by applying copper foil to the obverse surface 11 and also to the reverse surface 12 of the substrate 1. The second layer 201b is formed by electroless plating. The second layer 201b is necessary to dispose a middle electrode 23 in the second region 141b of a concavity 14. The plating layer 202 is a metal layer and covers the Cu layer 201 (the second layer 201b in particular). The plating layer 202 may be composed of a Ni layer, a Pd layer and a Au layer laminated on one another. Alternatively, the plating layer 202 may be composed solely of a Au layer.

As shown in FIGS. 23 and 24, the first obverse-surface electrode 211 includes a base segment 211a, a mounting segment 211b and a connecting segment 211c. The base segment 211a has an outer perimeter that includes apart located on the boundary between the obverse surface 11 and one of the inner surfaces 141 (the one on the left in FIG. 24). The base segment 211a has an arc shape with a predetermined radial width. The first middle electrode 231 is connected to the part of the outer perimeter of the base segment 211a located on the boundary between the obverse surface 11 and the second region 141b of the inner surface 141. The mounting segment 211b is where the semiconductor element 31 is mounted. The outer perimeter of the mounting segment 211b is composed of four sides surrounding the semiconductor element 31. The connecting segment 211c connects the base segment 211a to the mounting segment 211b. The connecting segment 211c has a strip shape extending in the first direction x in plan view.

As shown in FIGS. 23 and 24, the second obverse-surface electrode 212 includes a base segment 212a and a terminal segment 212b. The base segment 212a has an outer perimeter that includes a part located on the boundary between the obverse surface 11 and the other of the inner surfaces 141 (the one on the right in FIG. 24). The base segment 212a has a shape symmetrical to the base segment 211a with respect to an axis along the second direction y. The second middle electrode 232 is connected to the part of the outer perimeter of the base segment 212a located at the boundary between the obverse surface 11 and the second region 141b of the inner surface 141. The terminal segment 212b is where the wire 4 is bonded to provide an electrical connection to the semiconductor element 31. The terminal segment 212b has a strip shape extending in the first direction x in plan view.

As shown in FIG. 24, the outer perimeter of each obverse-surface electrode 21 is located inward in the obverse surface 11 from the boundary between the obverse surface 11 and the side surfaces 13. In addition, the outer perimeter of each obverse-surface electrode 21 (the base segment 211a of the first obverse-surface electrode 211 and the base segment 212a of the second obverse-surface electrode 212) includes a part located on the boundary between the obverse surface 11 and the first regions 141a of an inner surface 141.

Figure 25:
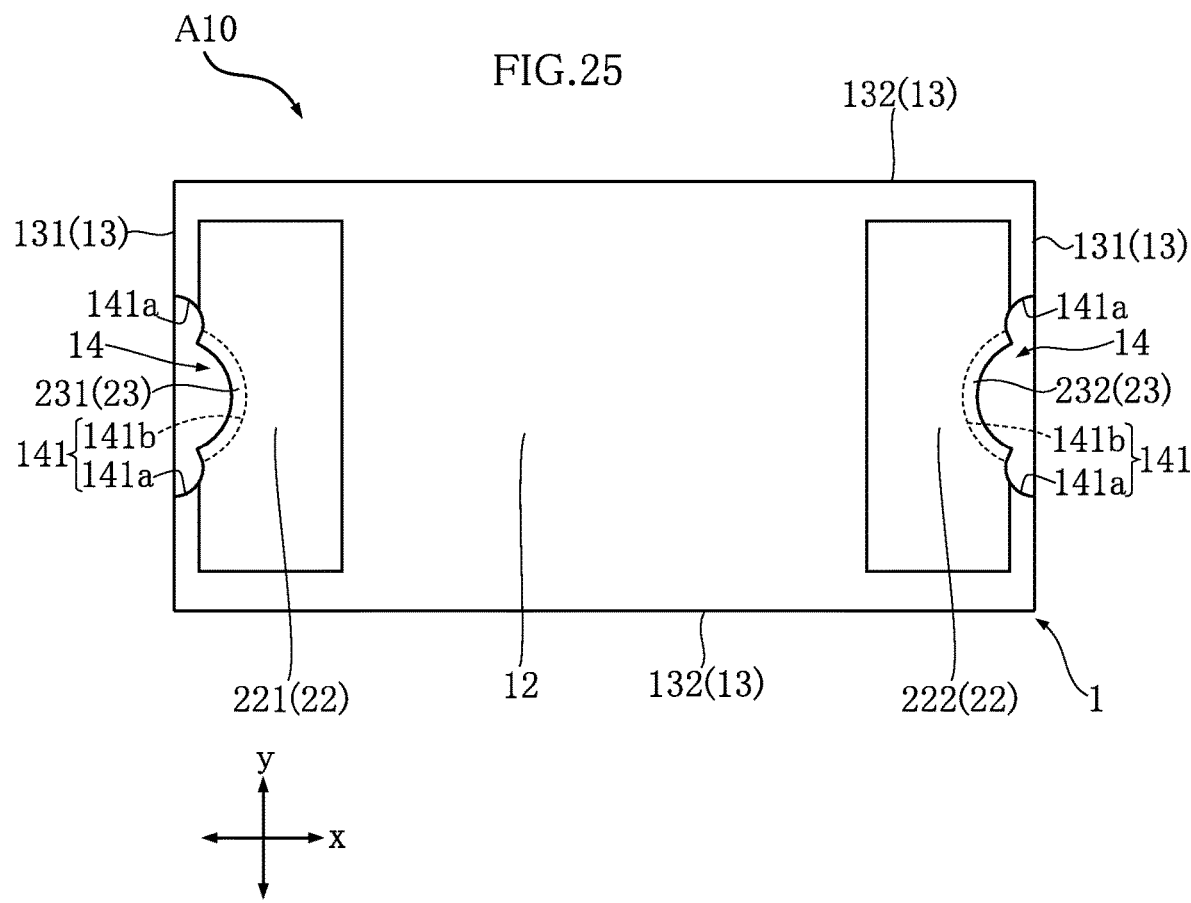
FIG. 25 is a bottom view of the semiconductor device of FIG. 22.
Figure 27:
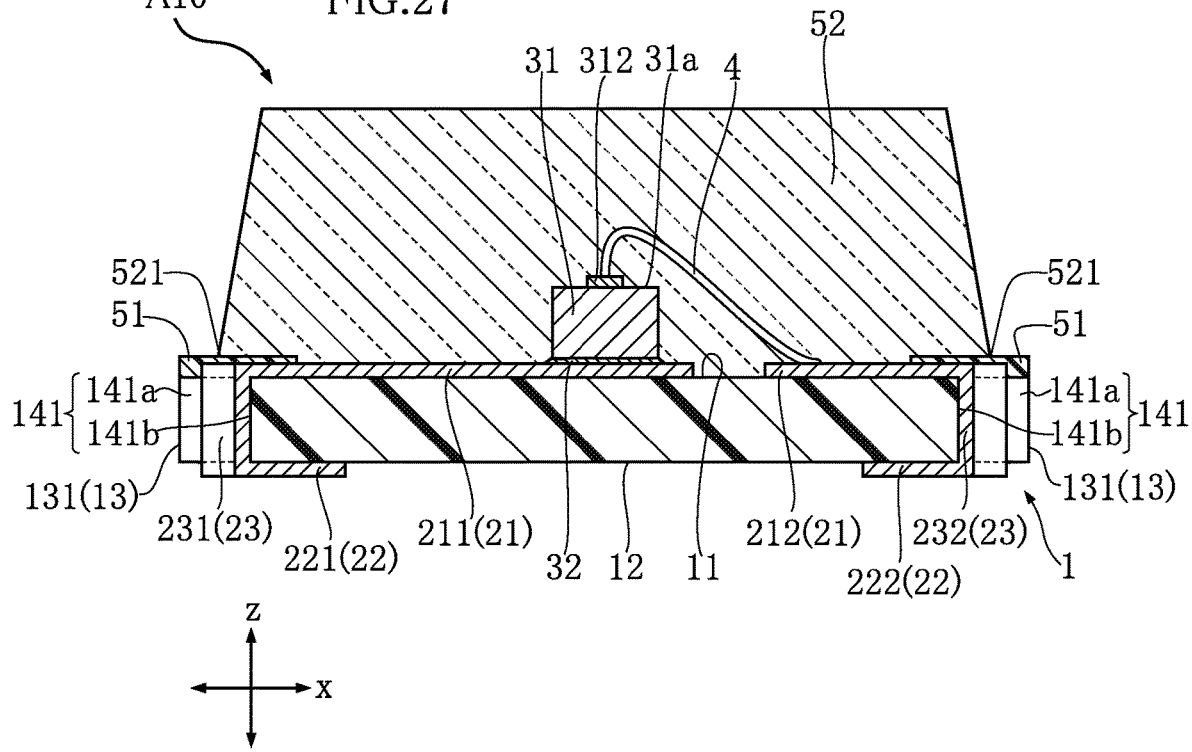
FIG. 27 is a sectional view taken along line VI-VI of FIG. 23.

As shown in FIGS. 22, 25 and 27, the reverse-surface electrodes 22 are conductive members disposed on the reverse surface 12. The reverse-surface electrodes 22 include a first reverse-surface electrode 221 and a second reverse-surface electrode 222 spaced apart from each other in the first direction x. Each reverse-surface electrode 22 has an outer perimeter that includes a part located on the boundary between the reverse surface 12 and an inner surface 141. Each reverse-surface electrode 22 is connected to a middle electrode 23 at the part of the outer perimeter located on the boundary between the reverse surface 12 and the second region 141b of the inner surface 141. More specifically, the first reverse-surface electrode 221 is connected to the first middle electrode 231 at the part of the outer perimeter located on the boundary between the reverse surface 12 and one of the second regions 141b (the one on the left in FIG. 25). In addition, the second reverse-surface electrodes 222 is connected to the second middle electrode 232 at the part of the outer perimeter located on the boundary between the reverse surface 12 and the other of the second regions 141b (one on the right in FIG. 25). As shown in FIG. 28, each reverse-surface electrode 22 includes the Cu layer 201 and the plating layer 202, which are the common components with the obverse-surface electrodes 21. Hence, the first layer 201a of each Cu layer 201 is in contact with the reverse surface 12.

As shown in FIG. 25, the outer perimeter of each reverse-surface electrode 22 is located inward in the reverse surface 12 from the boundary between the reverse surface 12 and the side surfaces 13. In addition, the outer perimeter of each reverse-surface electrode 22 includes a part located on the boundary between the reverse surface 12 and the first regions 141a of an inner surface 141.

As shown in FIGS. 22 and 24 to 27, the middle electrodes 23 are conductive members disposed on the second regions 141b of the respective inner surfaces 141. In the thickness direction z, each middle electrode 23 is connected at one end to an obverse-surface electrode 21 and at the other end to a reverse-surface electrode 22. Hence, the middle electrode 23 electrically connects the obverse-surface electrode 21 and the reverse-surface electrode 22. In addition, as shown in FIG. 28, each middle electrode 23 includes the second layer 201b of the Cu layer 201 and the plating layer 202, which are the common components with the obverse-surface electrodes 21 and the reverse-surface electrodes 22. Note that the second layer 201b is in contact with the second region 141b.

Figure 26:
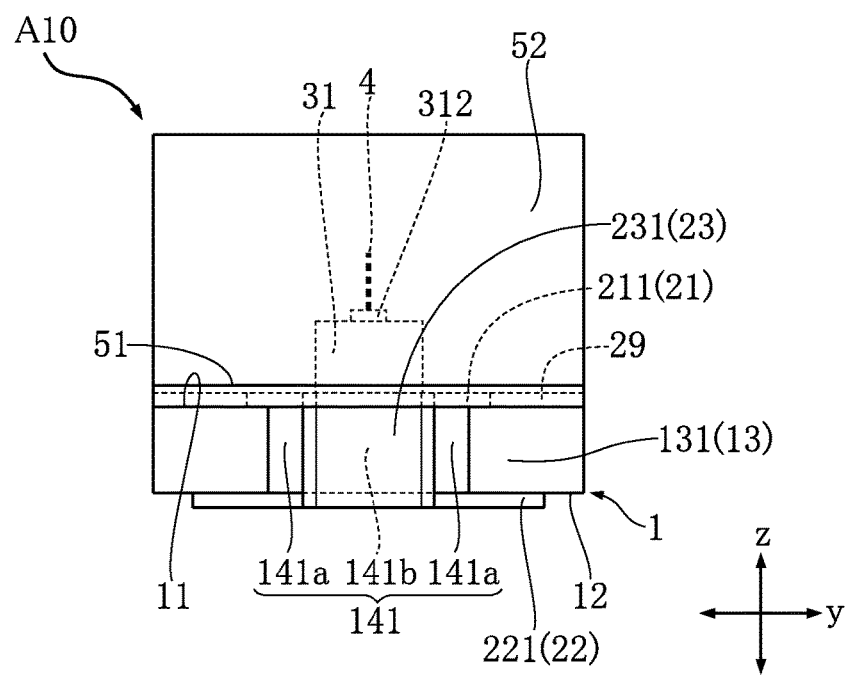
FIG. 26 is a left-side view of the semiconductor device of FIG. 22.

As shown in FIGS. 24 to 26, each middle electrode 23 has an outer perimeter located inward in the inner surface 141 from the boundary between the inner surface 141 and the side surfaces 13 as viewed in the thickness direction z. In the present embodiment, each middle electrode 23 is disposed on the second region 141b of an inner surface 141 and not on the first regions 141a of the inner surface 141.

As shown in FIGS. 22 to 24, the wiring layers 29 are conductive members disposed on the obverse surface 11 and connected to the respective obverse-surface electrodes 21. The wiring layers 29 are different conductive members from the obverse-surface electrodes 21. In the present embodiment, one wiring layer 29 is connected to the connecting segment 211c of the first obverse-surface electrode 211 and another to the terminal segment 212b of the second obverse-surface electrode 212 such that each wiring layer 29 is connected to the opposite edges of the connecting segment 211c or the terminal segment 212b in the second direction y. In plan view, each wiring layer 29 has a strip shape extending in the second direction and reaches the opposite edges of the obverse surface 11 that are spaced apart in the second direction y. Each wiring layer 29 has a narrower width (the length in the first direction x) than the width of the terminal segment 212b (the length in the second direction y). Each wiring layers 29 is composed of the Cu layer 201 (the first layer 201a and the second layer 201b) and the plating layer 202, which are the common components with the obverse-surface electrodes 21 and the reverse-surface electrodes 22. The wiring layers 29 are disposed to enable electroplating for forming the plating layer 202, which is a component of the obverse-surface electrodes 21, the reverse-surface electrodes 22 and the middle electrodes 23.

The semiconductor element 31 plays a central role in the function of the semiconductor device A10. As shown in FIG. 29, the semiconductor element 31 according to the present embodiment is a light-emitting element that includes a stack of a p-type semiconductor layer 31c and a n-type semiconductor layer 31d. To be more specific, the semiconductor element 31 of the present embodiment is a light-emitting diode, which may alternatively be a Vertical Cavity Surface Emitting LASER (VCSEL). The semiconductor element 31 includes an active layer 31e between the p-type semiconductor layer 31c and the n-type semiconductor layer 31d. The semiconductor element 31 emits light from the active layer 31e. The color of light emitted by the semiconductor element 31 may be blue. In that case, gallium nitride (GaN) is used a main component of the p-type semiconductor layer 31c and the n-type semiconductor layer 31d, and indium nitride (InGaN) as a component of the active layer 31e. Note that the semiconductor element 31 may be a light-receiving element, such as a photodiode or may even be a non-optical element, such as a diode.

As shown in FIG. 29, the semiconductor element 31 has an element obverse surface 31a facing in the same direction as the obverse surface 11, and an element reverse surface 31b facing away from the element obverse surface 31a. The element obverse surface 31a is apart of the n-type semiconductor layer 31d. The element obverse surface 31a has a second electrode 312 formed thereon and connected to the conductive wire 4. That is, the second electrode 312 serves as the N electrode (cathode) of the semiconductor element 31. In addition, the element reverse surface 31b is a surface of a first electrode 311 disposed in contact with the p-type semiconductor layer 31c. Hence, the first electrode 311 serves as the P electrode (anode) of the semiconductor element 31. The semiconductor element 31 is mounted on the mounting segment 211b of the first obverse-surface electrode 211 via a conductive bonding layer 32. In this state, the element reverse surface 31b faces toward the first obverse-surface electrode 211. Thus, the first electrode 311 is electrically connected to the first obverse-surface electrode 211 via the bonding layer 32. The bonding layer 32 according to the present embodiment may be made of a synthetic resin composed mainly of an epoxy resin containing Ag (so-called Ag paste). The bonding layer 32 is formed by curing a die-bonding material applied to the semiconductor element 31.

As shown in FIGS. 23, 24 and 27, the wire 4 is an electrically conductive component electrically connecting the semiconductor element 31 to the second obverse-surface electrode 212. The wire 4 is connected at one end to the second electrode 312 of the semiconductor element 31, and at the other end to the terminal segment 212b of the second obverse-surface electrode 212. The wire 4 may be made of Au, for example.

As shown in FIGS. 22, 23, 26 and 27, each coating 51 is an electrically insulating member disposed on the obverse surface 11 so as to overlap with at least a part of a concavity 14. The coatings 51 may be made of a solder resist film, for example. In the present embodiment, one coating 51 overlaps with an entirety of a concavity 14 and covers the base segment 211a of the first obverse-surface electrode 211, and another overlaps with an entirety of a concavity 14 and covers the base segment 212a of the second obverse-surface electrode 212.

As shown in FIGS. 26 and 27, the sealing resin 52 is supported on the obverse surface 11 and covers the semiconductor element 31. As shown in FIGS. 22, 23 and 27, the sealing resin 52 has a pair of outer edges 521 spaced apart from each other in the first direction x. Each outer edge 521 has a part in contact with a coating 51 and overlapping with a concavity 14. In the case where the semiconductor element 31 is a light-emitting element (such as a light emitting diode) or a light-receiving element (such as photodiode), a light-transmitting synthetic resin, such as a silicone resin, is used as the sealing resin 52. In particular, in a case where the semiconductor element 31 is a light emitting diode, the sealing resin 52 may contain a phosphor (not illustrated). For example, for the semiconductor element 31 that emits blue light, the sealing resin 52 containing a yellow phosphor may be used to achieve the semiconductor device A10 that emits white light. Similarly, for the semiconductor element 31 that emits near-ultraviolet radiation, the sealing resin 52 containing red, blue and green phosphors may be used to achieve the semiconductor device A10 that emits white light with high color rendering property. In a case where the semiconductor element 31 is non-optical element (such as diode), the sealing resin 52 may be a black epoxy resin, for example.

Next, with reference to FIGS. 30 to 39, the following describes an example of a method for manufacturing the semiconductor device A10.

Figure 30:
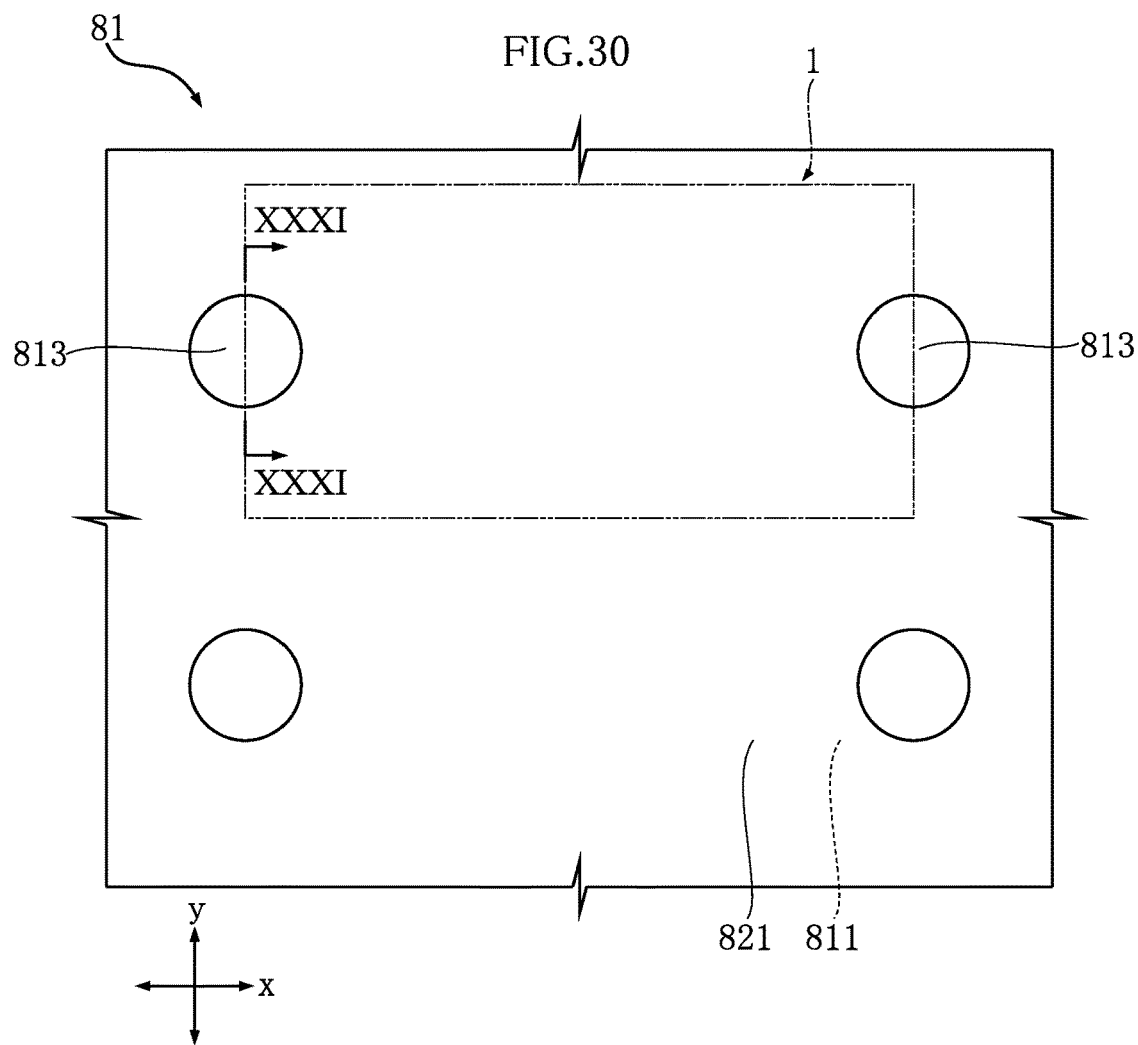
FIG. 30 is a plan view illustrating a method of manufacturing the semiconductor device of FIG. 22.
Figure 31:
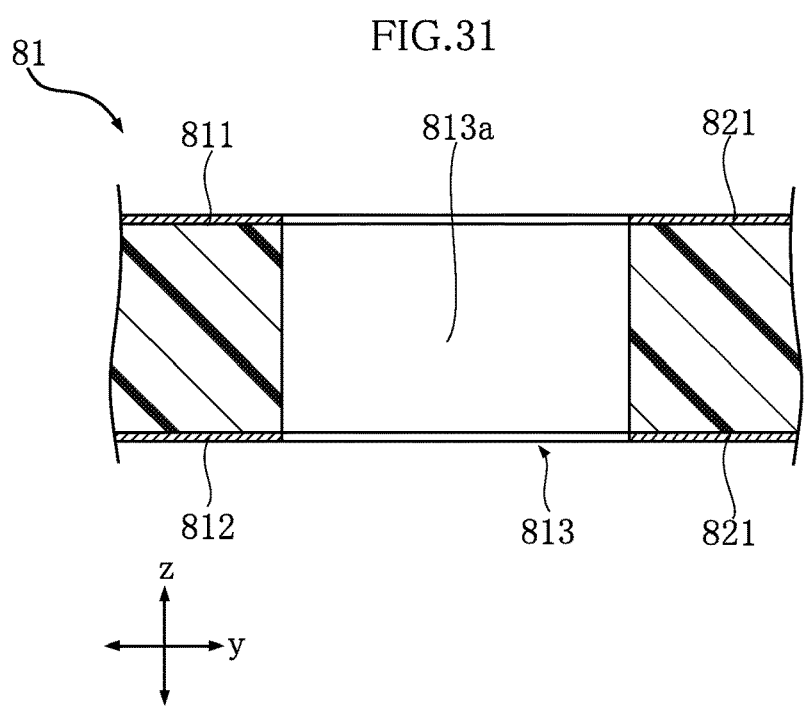
FIG. 31 is a sectional view taken along line XXXI-XXXI of FIG. 30.
Figure 32:
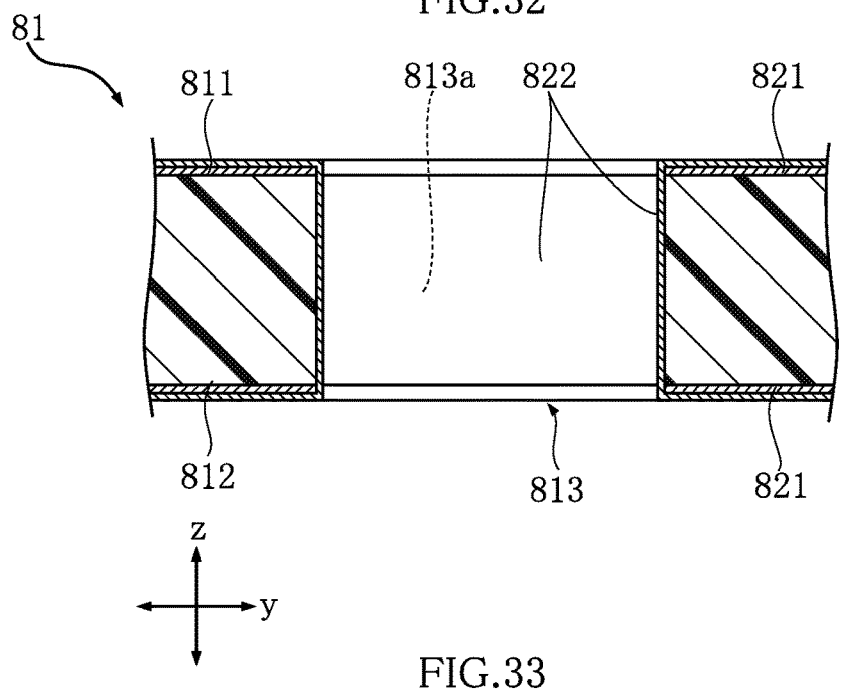
FIG. 32 is a sectional view illustrating the method of manufacturing the semiconductor device of FIG. 22.

FIGS. 30 to 39 show a base member 81 (details of which will be described later) having a thickness direction z, a first direction x and a second direction y, which respectively correspond to the thickness direction z, the first direction x and the second direction y shown in FIGS. 22 to 29. In addition, FIGS. 31 and 32 show the sections taken along the same plane and having the same coverage.

First, as shown in FIGS. 30 and 31, the base member 81 has an obverse surface 811 and a reverse surface 812 facing away from each other in the thickness direction z, and a plurality of holes 813 are formed through the base member 81 in the thickness direction z. In FIG. 30, the region of the base member 81 enclosed by phantom lines (double-dashed lines) corresponds to the substrate 1 of the semiconductor device A10. The base member 81 may be made of a glass epoxy resin, for example. The holes 813 may be formed by drilling or using laser. As shown in FIG. 31, each hole 813 has an inner circumferential surface 813a connected to both the obverse surface 811 and the reverse surface 812. According to the present embodiment, a Cu foil layer 821, which is electrically conductive, is formed on the obverse surface 811 and the reverse surface 812. The Cu foil layer 821 corresponds to the first layer 201a of the Cu layer 201. The Cu foil layer 821 may be formed by pressing Cu foil against the obverse surface 811 and the reverse surface 812. The Cu foil layer 821 may be omitted.

Next, a conductive layer 82 is formed on the base member 81. The conductive layer 82 corresponds to the obverse-surface electrodes 21, the reverse-surface electrodes 22 and middle electrodes 23 of the semiconductor device A10. The process of forming the conductive layer 82 includes a step of forming a foundation layer 822, a step of removing parts of the foundation layer 832, and a step of forming a plating layer 823.

First, as shown in FIG. 32, a conductive foundation layer 822 is formed on the obverse surface 811, the reverse surface 812 and the inner circumferential surfaces 813a of the holes 813. The foundation layer 822 corresponds to the second layer 201b of the Cu layer 201 of the semiconductor device A10. The foundation layer 822 is formed by depositing Cu by electroless plating. The thus formed foundation layer 822 covers the inner circumferential surfaces 813a of the holes 813. In addition, the foundation layer 822 covers the Cu foil layer 821 on the obverse surface 811 and the reverse surface 812. In a case where the Cu foil layer 821 is omitted, the foundation layer 822 covers the obverse surface 811 and the reverse surface 812, in the same manner as it covers the inner circumferential surfaces 813a of the holes 813.

Then, parts of the foundation layer 822 are removed. The step of removing parts of the foundation layer 822 includes a step of patterning the foundation layer 822 and a step of forming pairs of auxiliary holes 814 through the base member 81.

Figure 33:
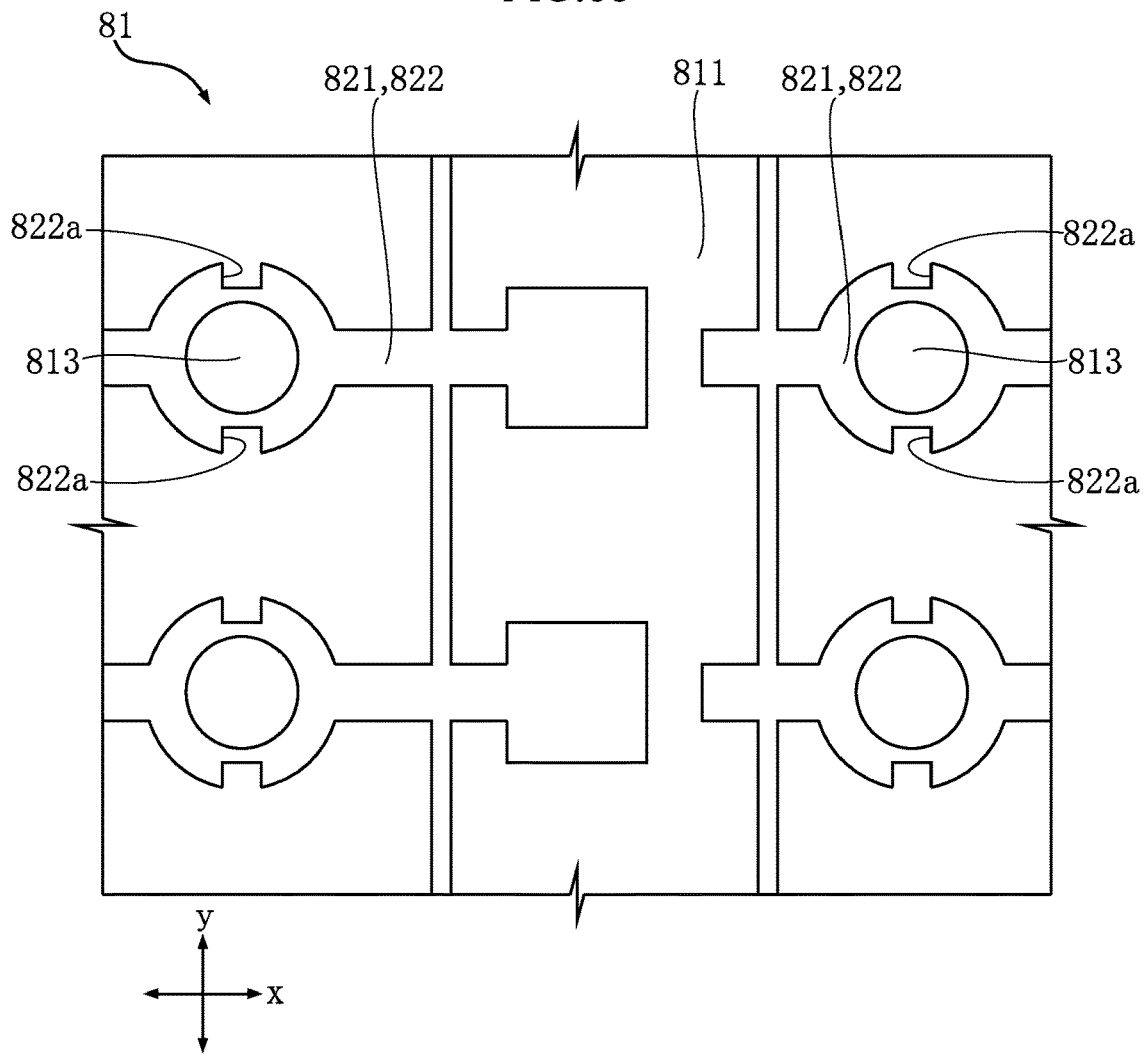
FIG. 33 is a plan view illustrating the method of manufacturing the semiconductor device of FIG. 22.

First, the foundation layer 822 is patterned as shown in FIG. 33. The patterning is performed by wet etching, for example. In this case, a mixture solution of sulfuric acid ($H_2SO_4$) and hydrogen peroxide ($H_2O_2$) is used as an etchant. The patterning of the foundation layer 822 involves patterning of the Cu foil layer 821 and the foundation layer 822 formed on the obverse surface 811 and the reverse surface 812. The foundation layer 822 formed on the inner circumferential surfaces 813a of the respective holes 813 remains unaffected by the patterning. By patterning the Cu foil layer 821 and the foundation layer 822 on the obverse surface 811 and the reverse surface 812, a pair of notches 822a is formed for each hole 813. More specifically, the notches 822a in each pair are formed at opposite sides of a hole 813 in the second direction y and spaced apart from the hole 813 in the second direction y.

Figure 34:
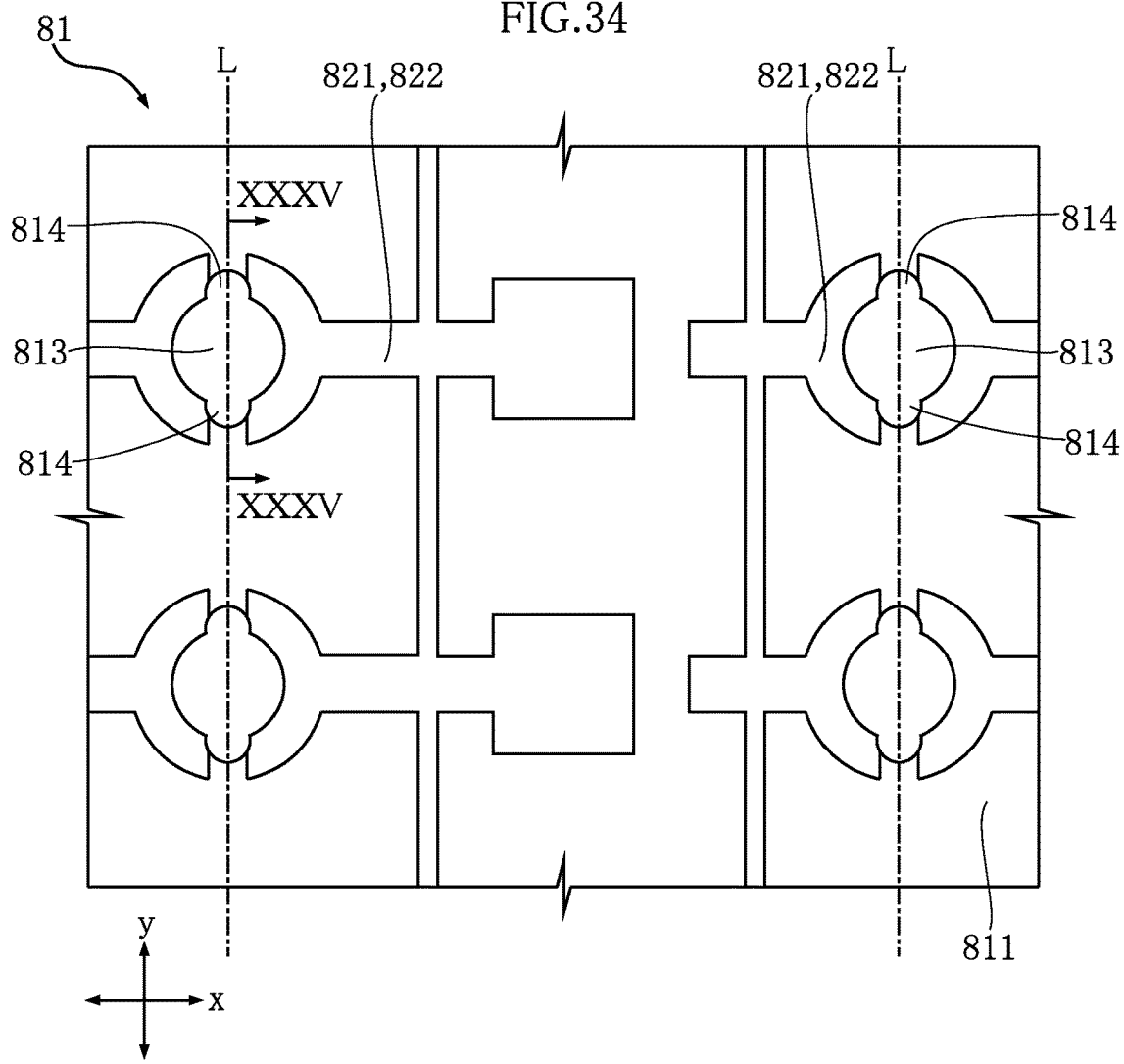
FIG. 34 is a plan view illustrating the method of manufacturing the semiconductor device of FIG. 22.
Figure 35:
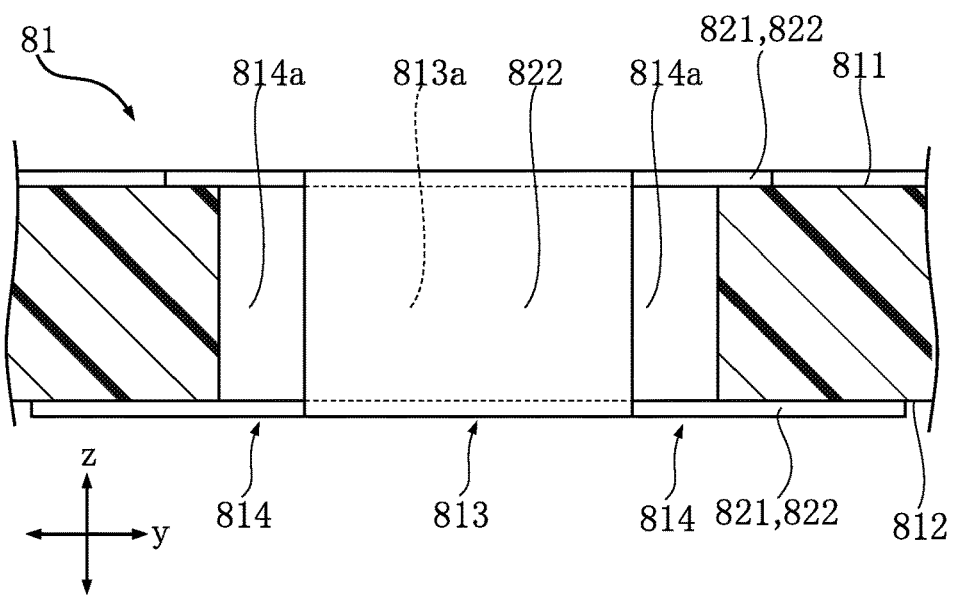
FIG. 35 is a sectional view taken along line XXXV-XXXV of FIG. 34.

Next, as shown in FIGS. 34 and 35, a plurality of pairs of auxiliary holes 814 are formed through the base member 81 such that the auxiliary holes 814 are continuous with the respective holes 813. The auxiliary holes 814 in a pair are located at the opposite sides of the hole 813 along a line L (the long and short dashed line shown in FIG. 34) passing through the center of the hole 813 in plan view. Each auxiliary hole 814 thus formed has the center lies the line L and the diameter smaller than the diameter of the hole 813. After the auxiliary holes 814 are formed, the notches 822a are no longer distinct.

Through the steps shown in FIGS. 33 to 35, the removal of portions of the foundation layer 822 completes. In this state, as shown in FIG. 34, the outer perimeters of the Cu foil layers 821 and the foundation layers 822 remaining on the obverse surface 811 and the reverse surface 812 are spaced apart from the line L. As shown in FIG. 35, in addition, no foundation layer 822 remains on the inner circumferential surface 814a of each auxiliary hole 814, which is contiguous with the inner circumferential surface 813a of a corresponding hole 813. The outer perimeters of the foundation layers 822 remaining on the inner circumferential surface 813a of the holes 813 are also spaced apart from the line L in plan view.

Figure 36:
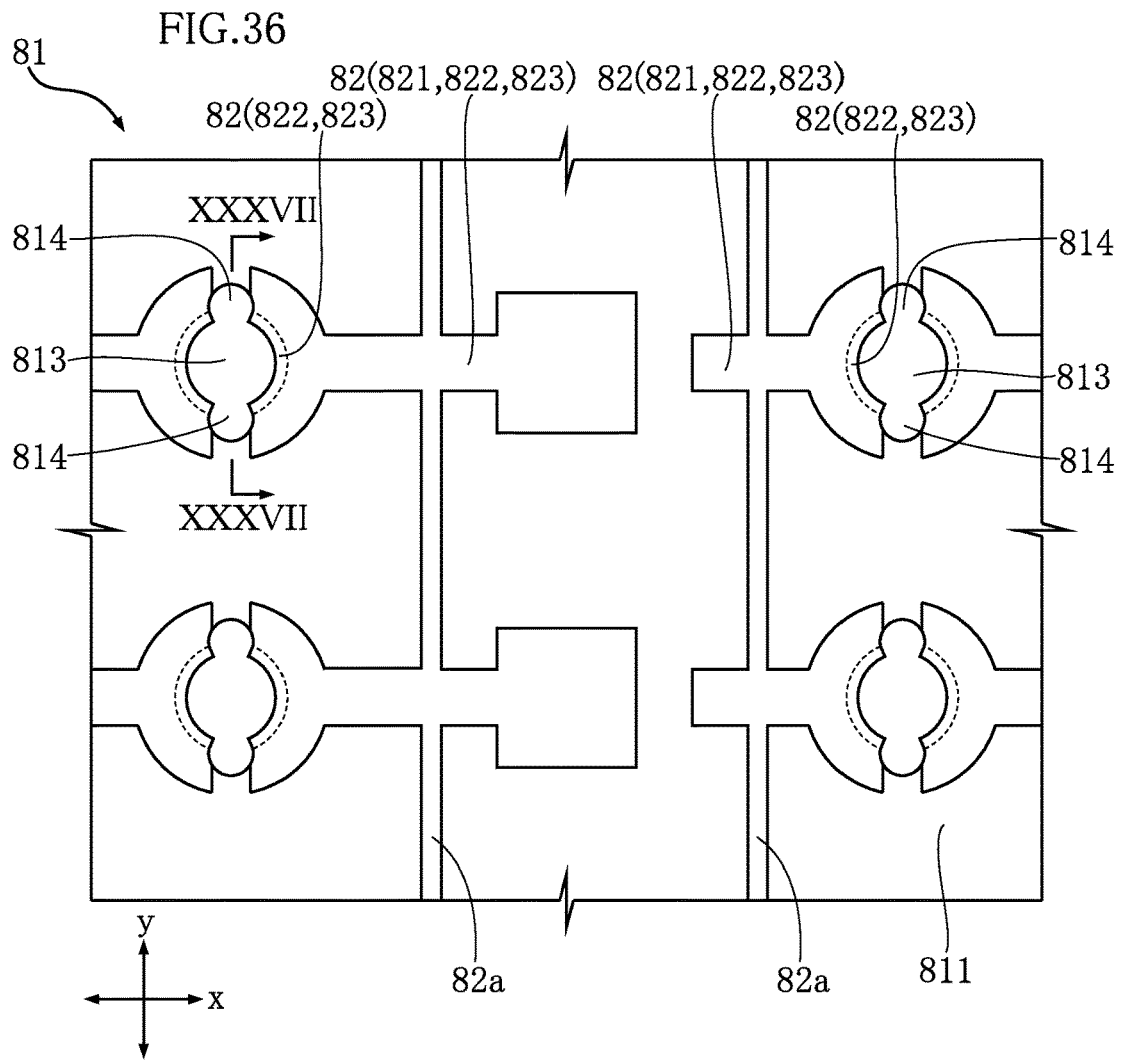
FIG. 36 is a plan view illustrating the method of manufacturing the semiconductor device of FIG. 22.
Figure 37:
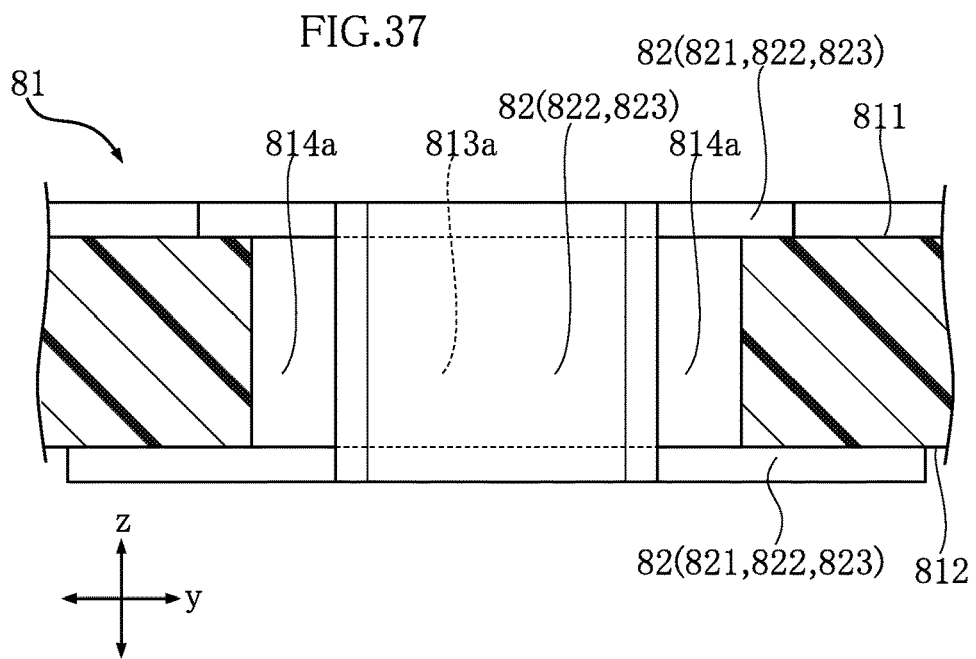
FIG. 37 is a sectional view taken along line XXXVII-XXXVII of FIG. 36.

Next, as shown in FIGS. 36 and 37, a plating layer 823 is formed to coat the foundation layers 822. The plating layer 823 corresponds to the plating layer 202 of the semiconductor device A10. The plating layer 823 may be composed of a metal layer formed by electroplating. The metal layer may be a laminate of a Ni layer, a Pd layer and a Au layer. Alternatively, the meal layer may be a Ag layer. The electroplating is performed using wiring layers 82a, which extend in the second direction y, as the conductive paths. The wiring layers 82a correspond to the wiring layers 29 of the semiconductor device A10. Each wiring layer 82a connects a Cu foil layer 821 and a foundation layer 822 to another Cu foil layer 821 and another foundation layer 822 that are spaced apart in the second direction y on the obverse surface 811. The wiring layers 82a are formed together with the conductive layers 82 formed by patterning on the obverse surface 811.

Through the steps shown in FIGS. 32 to 37, the conductive layers 82 are completed. The conductive layers 82 remaining on the obverse surface 811 correspond to the obverse-surface electrodes 21 and the wiring layers 29 of the semiconductor device A10. The conductive layers 82 remaining on the reverse surface 812 correspond to the reverse-surface electrodes 22 of the semiconductor device A10. The conductive layers 82 remaining on the inner circumferential surfaces 813a of the holes 813 correspond to the middle electrodes 23 of the semiconductor device A10.

Figure 38:
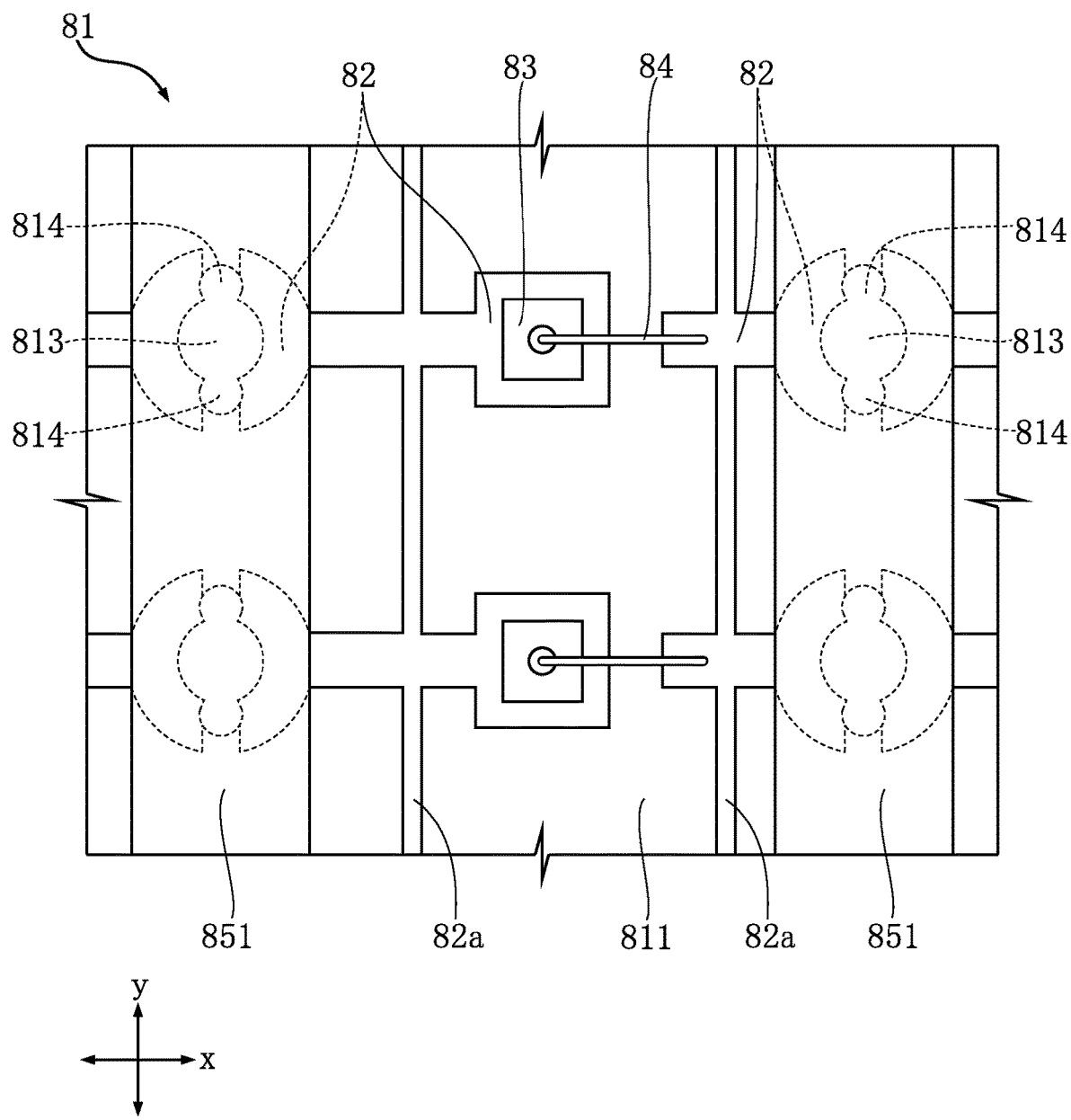
FIG. 38 is a plan view illustrating the method of manufacturing the semiconductor device of FIG. 22.

Next, as shown in FIG. 38, coatings 851 are formed on the obverse surface 811 to overlap with the holes 813 and the pairs of auxiliary holes 814 in plan view. The coatings 851 correspond to the coatings 51 of the semiconductor device A10. After the coatings 851 are formed, semiconductor elements 83 are mounted by die bonding on the conductive layers 82 on the obverse surface 811. Each semiconductor element 83 corresponds to the semiconductor element 31 of the semiconductor device A10. After the semiconductor elements 83 are mounted, wires 84 are disposed by wire bonding to connect each semiconductor element 83 to a conductive layer 82 that is spaced apart on the obverse surface 811 in the first direction x from the conductive layer 82 on which the semiconductor element 83 is formed. Each wire 84 corresponds to the wire 4 of the semiconductor device A10.

Figure 39:
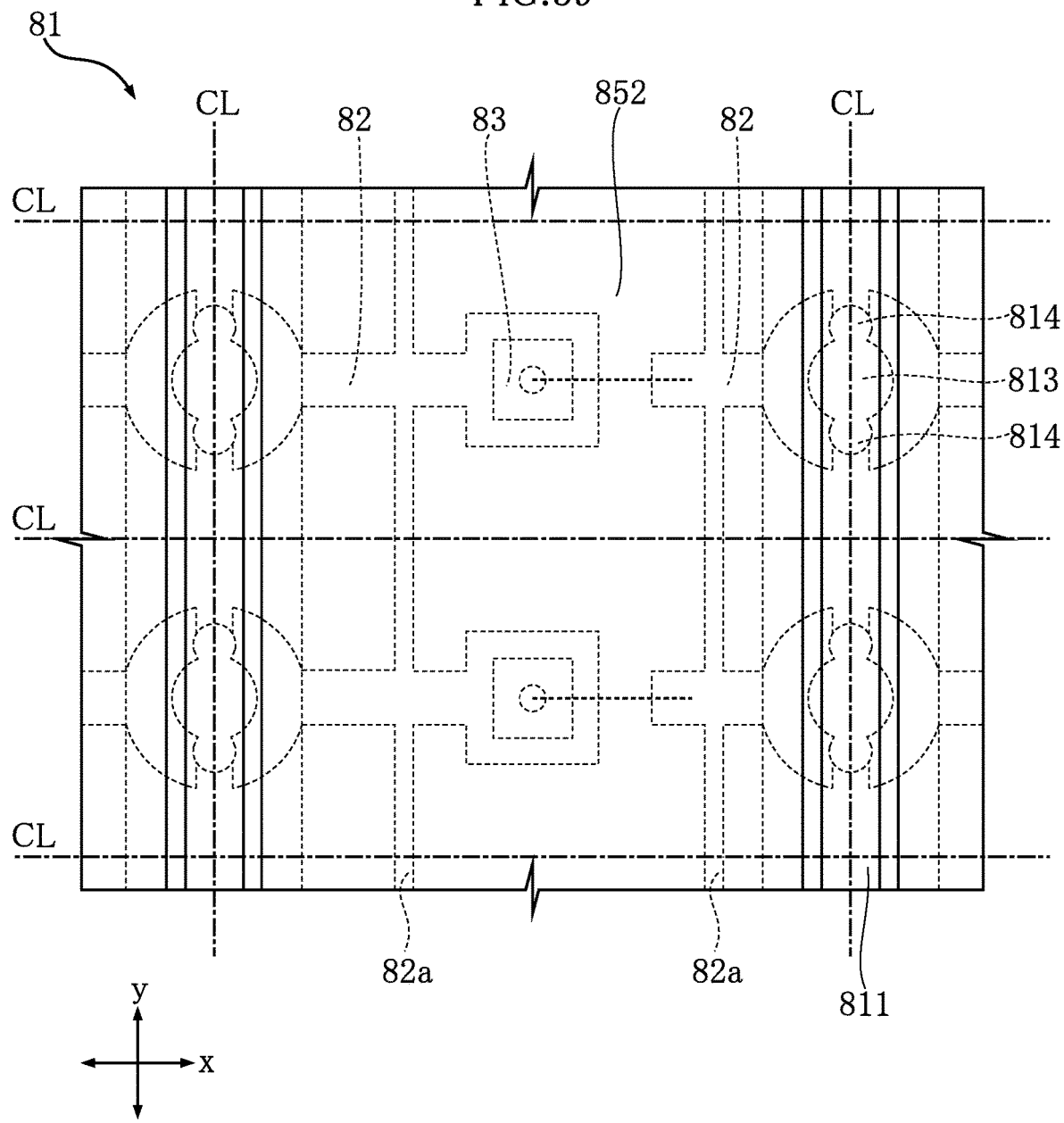
FIG. 39 is a plan view illustrating the method of manufacturing the semiconductor device of FIG. 22.

Next, as shown in FIG. 39, a sealing resin 852 is formed to cover the semiconductor elements 83. The sealing resin 852 corresponds to the sealing resin 52 of the semiconductor device A10. The sealing resin 852 may be formed by transfer molding, for example. After the sealing resin 852 is formed, the base member 81 and the sealing resin 852 are cut (diced) into individual pieces along the cutting lines CL (the long and short dashed lines shown in FIG. 39). The cutting lines CL are determined by defining grids with lines in the first direction x and lines in the second direction y. Hence, cutting along the cut lines CL in the first direction cuts the wiring layers 82a together with the base member 81 and the sealing resin 52. However, cutting along the lines CL in the second direction y cuts the base member 81 alone. This is because the lines CL in the second direction y are defined to pass through the centers of the holes 813 and the pairs of auxiliary holes 814. In this manner, this step of cutting along the cutting lines CL does not cut the conductive layers 82 at all. Each piece separated in this step corresponds to a semiconductor device A10. In addition, each hole 813 and the associated pair of auxiliary holes 814, each of which extends through the base member 81, together correspond to a concavity 14 of the semiconductor devices A10. Though the steps described above, the semiconductor devices A10 are manufactured.

The following describes advantages of the semiconductor devices A10.

The substrate 1 of the semiconductor device A10 has the concavities 14. Each concavity 14 is recessed from a corresponding side surface 13 and has an inner surface 141 extending from the obverse surface 11 to the reverse surface 12. Each middle electrode 23 is disposed on an inner surface 141 to electrically connect an obverse-surface electrode 21 formed on the obverse surface 11 to a reverse-surface electrode 22 formed on the reverse surface 12. In this configuration, each obverse-surface electrode 21 has the outer perimeter located inward in the obverse surface 11 from the boundary between the obverse surface 11 and the side surfaces 13. Similarly, each reverse-surface electrode 22 has an edge located inward in the reverse surface 12 from the boundary between the reverse-surface electrode 22 and the side surfaces 13. This configuration ensures that the step of cutting the base member 81 shown in FIG. 39 is performed without forming metal burrs along the edges of the obverse-surface electrodes 21 and the reverse-surface electrodes 22 of the individual semiconductor devices A10. That is, this configuration makes it possible to provide a semiconductor devices A10 of a smaller size without metal burrs on the electrodes (obverse-surface electrodes 21 and reverse-surface electrodes 22), which impairs the appearance and/or mountability.

Each middle electrode 23 has the outer perimeter located inward in the inner surface 141 from the boundary between the inner surface 141 and the side surface 13. In the present embodiment, the middle electrodes 23 are located only in the second regions 141b of the inner surfaces 141. The middle electrodes 23 are important parts for forming solder fillets when the semiconductor device A10 is mounted on a target printed substrate. This configuration enables the step of cutting the base member 81 shown in FIG. 39 to be performed without forming metal burrs along the edges of the middle electrodes 23, as with the obverse-surface electrodes 21 and the reverse-surface electrodes 22. This serves to further improve the appearance and mountability of the semiconductor device A10.

In the semiconductor device A10, each obverse-surface electrode 21 has an outer perimeter including a part located on the boundary between the obverse surface 11 and the first region 141a of the inner surface 141. Similarly, the reverse-surface electrode 22 has an outer perimeter including a part located on a part of the boundary between the reverse-surface electrode 22 and the first region 141a of the inner surface 141. This configuration ensures that the step of patterning the foundation layer 822 shown in FIG. 33 is performed to form the conductive layers 82 surrounding the entire peripheral edges of the holes 813. This ensures that the foundation layers 822 formed on the inner circumferential surfaces 813a of the holes 813 are duly left unremoved. Thus, the semiconductor device A10 is manufactured without damaging the conductive layers 82 formed on the inner circumferential surfaces 813a (and later formed into the middle electrodes 23 of the semiconductor device A10).

In the semiconductor device A10, the inner surface 141 of each concavity 14 includes the first region 141a and the second region 141b both of which define a curved surface. This configuration facilitates the formation of the holes 813 and the auxiliary holes 814 by drilling or using laser in the step shown in FIGS. 30 and 34.

In the manufacture of the semiconductor device A10, the foundation layers 822 on the inner circumferential surfaces 813a of the holes 813 may be formed by electroless plating. This ensures that the conductive layers 82 (which will be formed into the middle electrodes 23 of the semiconductor device A10) to be appropriately formed on the inner circumferential surfaces 813a.

The semiconductor device A10 includes the coatings 51 disposed on the obverse surface 11 such that each coating 51 overlaps with at least a part of a concavity 14 in plan view. This configuration prevents the material of the sealing resin 52 from flowing into the holes 813 and the auxiliary holes 814 when it is applied in the step of forming the sealing resin 52 shown in FIG. 39. Therefore, the coatings 51 prevent the sealing resin 52 from adhering to the middle electrodes 23 of the semiconductor device A10. As shown in FIGS. 22, 23 and 27, the sealing resin 52 has the outer edges 521 each having a part in contact with a coating 51 and overlapping with a concavity 14. This means that the sealing resin 52 is kept from adhering to the middle electrodes 23. In this manner, the presence of the coatings 51 ensure that the middle electrodes 23 are exposed to the outside of the semiconductor device A10.

Figure 40:
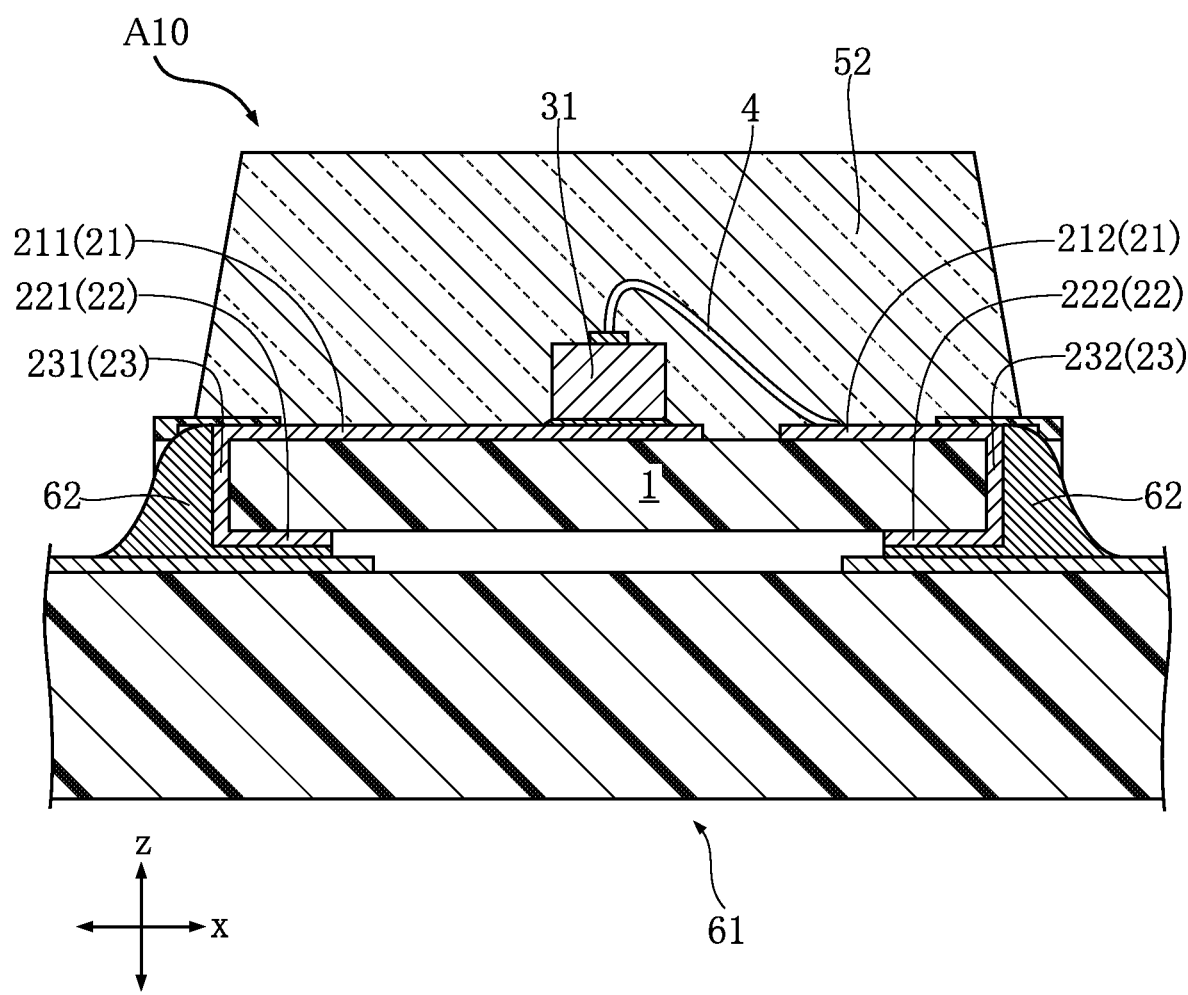
FIG. 40 is a sectional view of the semiconductor device shown in FIG. 22, disposed on a wired substrate.

FIG. 40 is a sectional view showing the semiconductor device A10 mounted on a wired substrate 61 by reflowing. FIG. 40 is taken along the same plane as FIG. 27. The semiconductor device A10 is mounted on the wired substrate 61 with conductive bonding layers 62 between the reverse-surface electrodes 22 and the wired substrate 61. The conductive bonding layers 62 are made of solder cream, for example. The conductive bonding layers 62 are in contact with the middle electrodes 23 in addition to the reverse-surface electrodes 22. Each conductive bonding layer 62 has a fillet at a part contacting a middle electrode 23. The fillet has an inclined surface in the first direction x. The middle electrodes 23 serve to promote the formation of fillets, which increases the bonding strength of the semiconductor device A10 onto the wired substrate 61.

Third Embodiment

Figure 41:
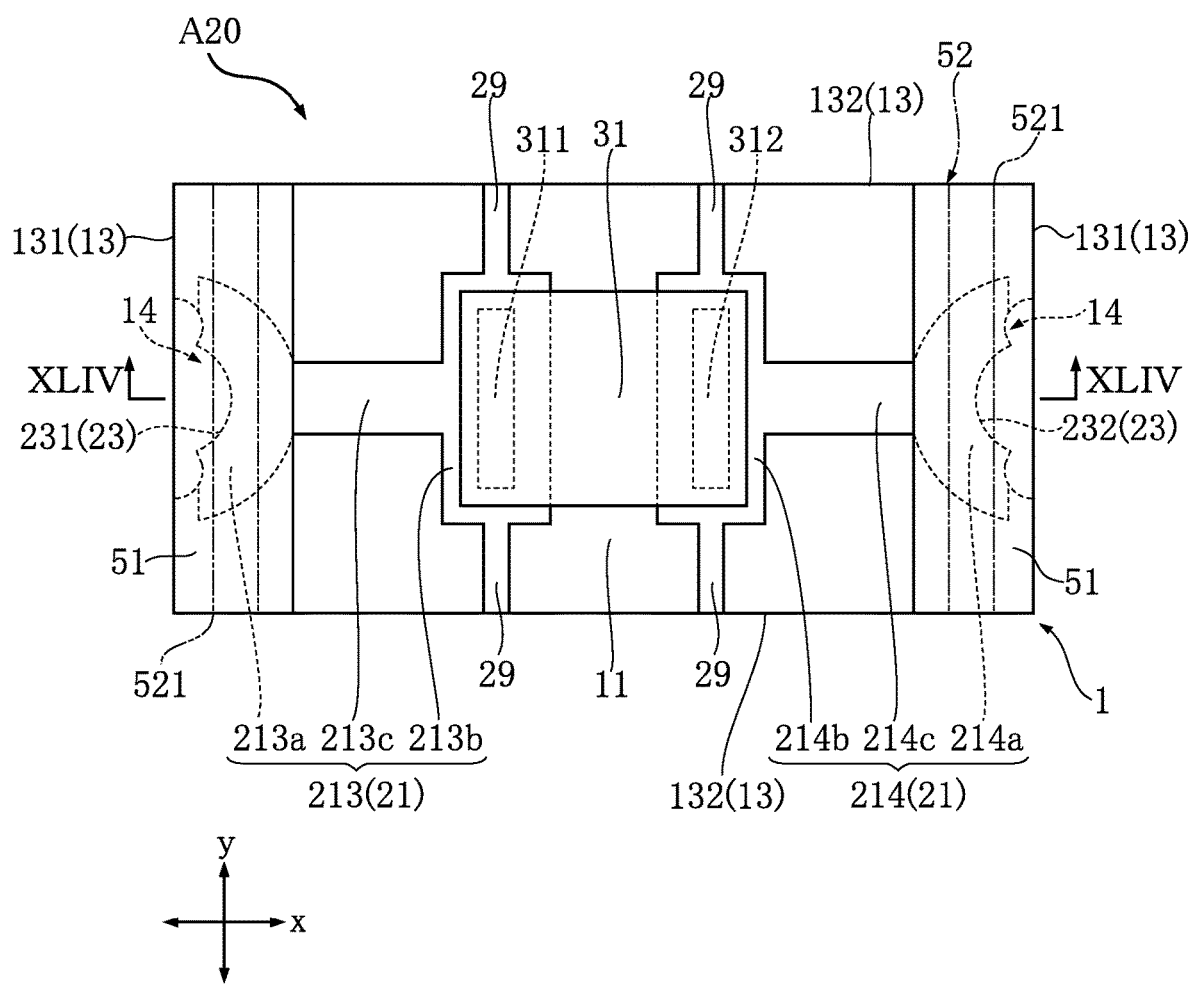
FIG. 41 is a plan view of a semiconductor device (with a sealing resin shown in phantom) according to a third embodiment of the present disclosure.

The following describes a semiconductor device A20 according to a third embodiment of the present disclosure, with reference to FIGS. 41 to 45. In the figures, the same reference signs are used to denote components that are the same as or similar to the components of the semiconductor device A10 described above. In addition, no description of such components is repeated. For convenience of illustration, FIG. 41 shows the semiconductor device A20 is shown in phantom by the imaginary lines indicating the outline of the sealing resin 52.

The semiconductor device A20 differs from the semiconductor device A20 in the structures of the obverse-surface electrodes 21 and the semiconductor element 31. The semiconductor device A20 is similar to the semiconductor device A10 in that it is an LED package containing a light-emitting diode as the semiconductor element 31.

Figure 42:
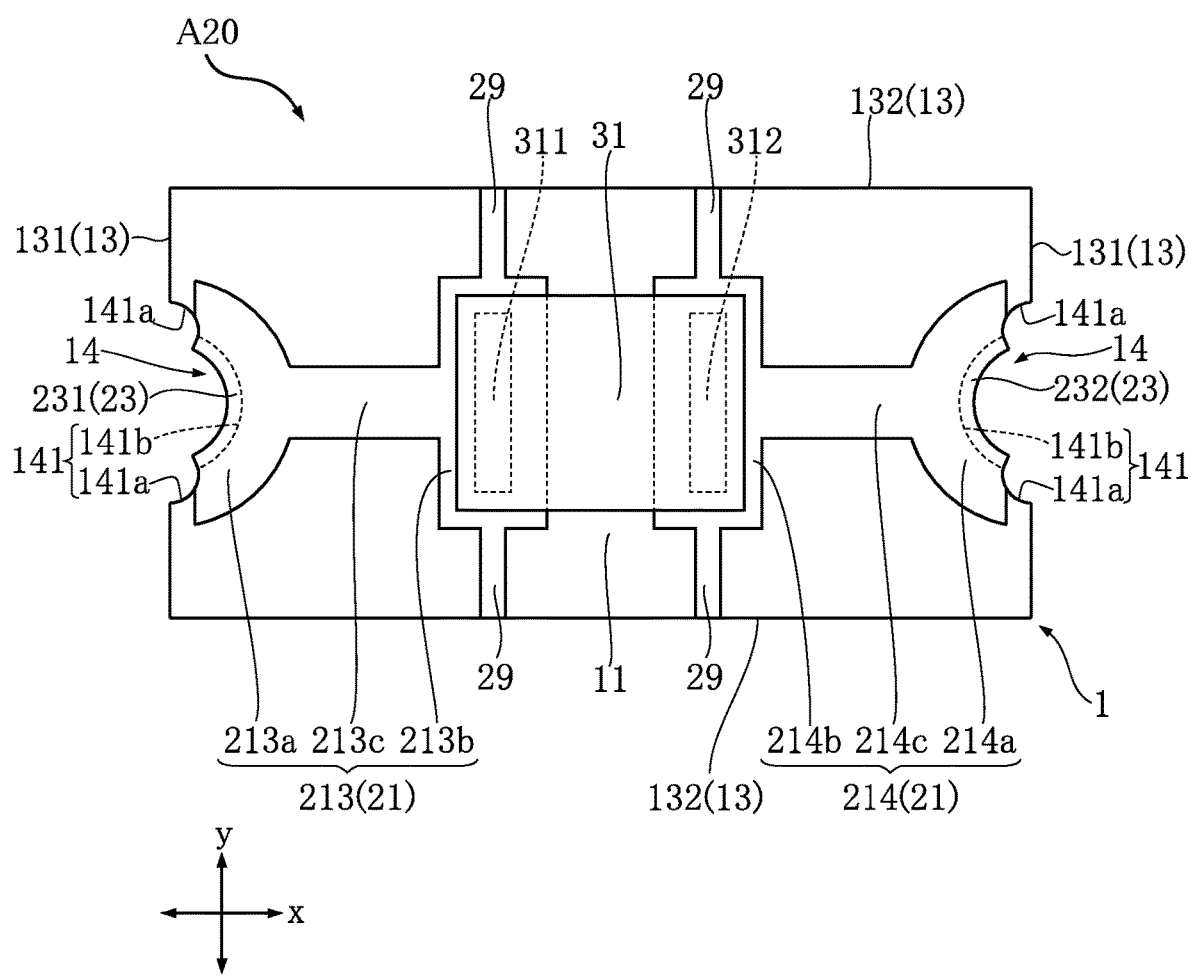
FIG. 42 is a plan view of the semiconductor device shown in FIG. 41, with the coatings and the sealing resin omitted.
Figure 43:
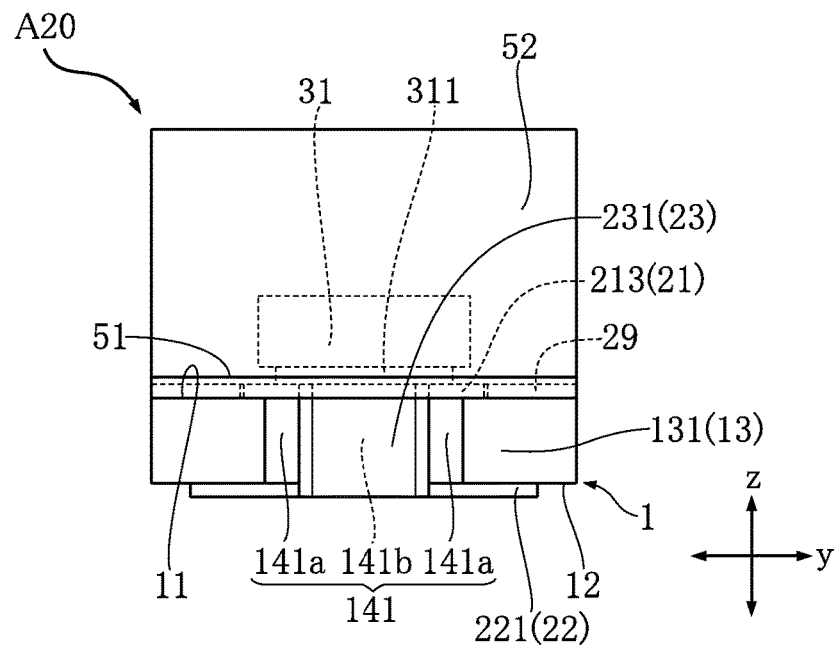
FIG. 43 is a left-side view of the semiconductor device of FIG. 41.
Figure 44:
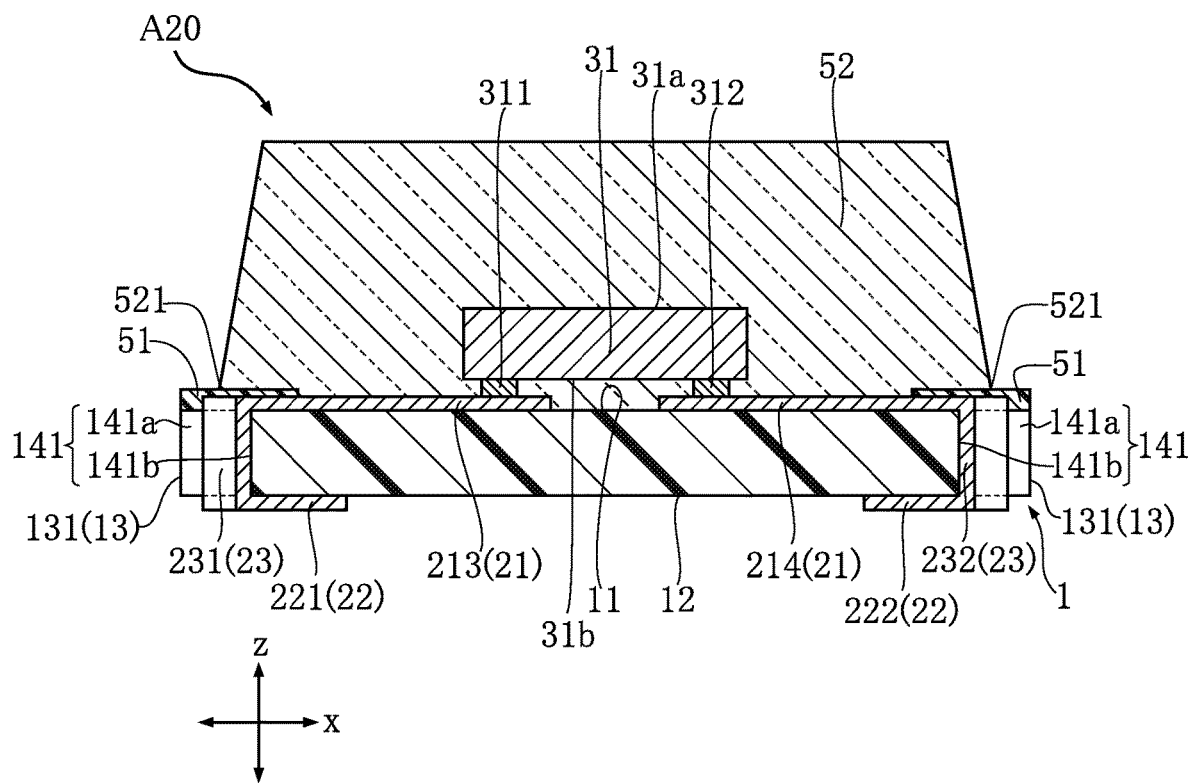
FIG. 44 is a sectional view taken along line XLIV-XLIV of FIG. 41.
Figure 45:
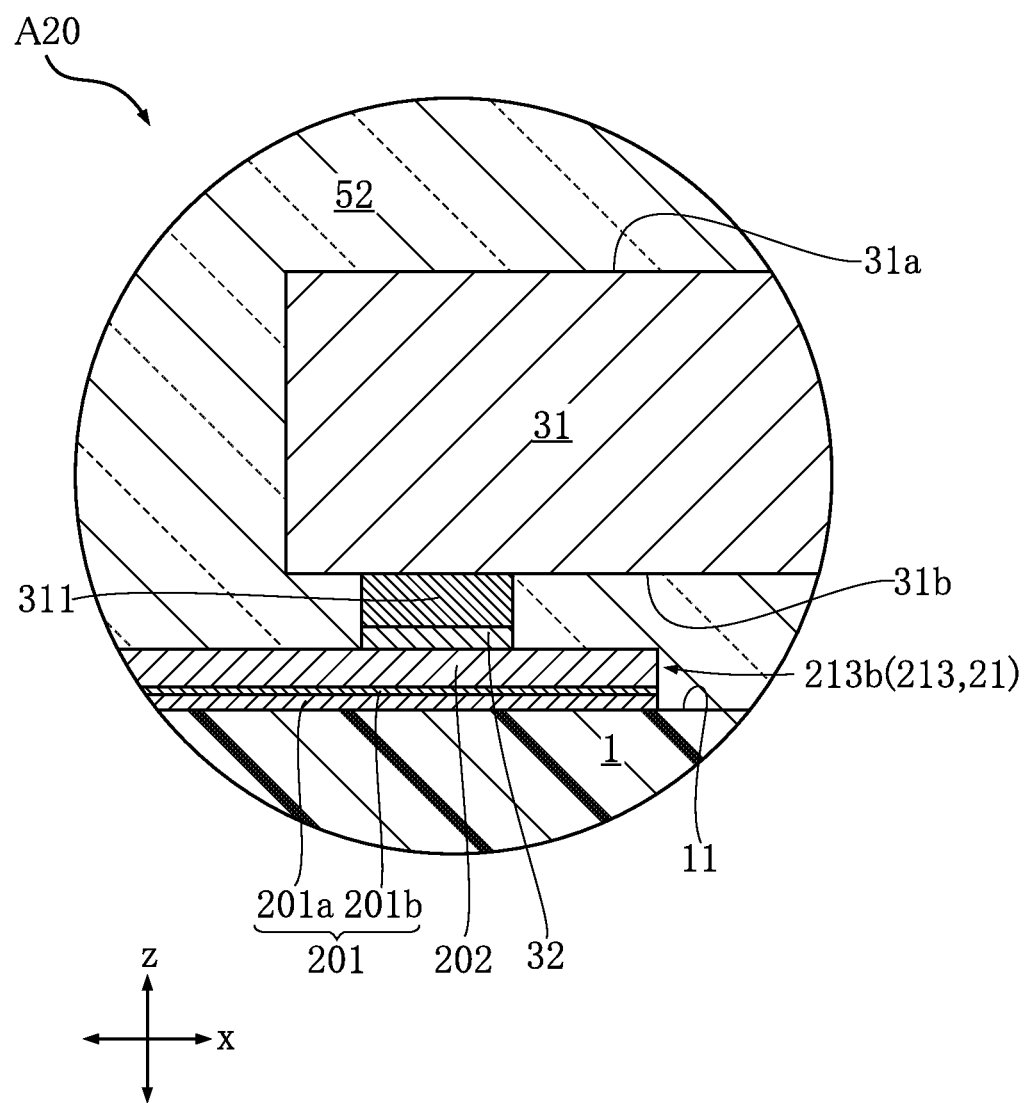
FIG. 45 is a partially enlarged view of FIG. 44 (showing a part around the semiconductor element).

As shown in FIGS. 41 and 42, the obverse-surface electrodes 21 of the present embodiment include a first obverse-surface electrode 213 and a second obverse-surface electrode 214 spaced apart from each other in the first direction x. The semiconductor element 31 is mounted partly on the first obverse-surface electrode 213 and partly on the second obverse-surface electrode 214. As with the obverse-surface electrodes 21 of the semiconductor device A10, the obverse-surface electrodes 21 of this embodiment are composed of a Cu layer 201 (including a first layer 201a and a second layer 201b) and a plating layer 202.

As shown in FIGS. 41 and 42, the first obverse-surface electrode 213 has a base segment 213a, a mounting segment 213b and a connecting segment 213c. The base segment 213a has an outer perimeter including a part located on a part of the boundary between the obverse surface 11 and one of the inner surfaces 141 (one on the left in FIG. 42). In plan view, the base segment 213a has an arc shape with a predetermined radial width. A first middle electrode 231 is connected to the outer perimeter of the base segment 213a at a part located on the boundary between the obverse surface 11 and the second region 141b of the inner surface 141. The mounting segment 213b is where the semiconductor element 31 is mounted. The mounting segment 213b has a strip shape extending in the second direction y in plan view. The connecting segment 213c connects the base segment 213a to the mounting segment 213b. The connecting segment 213c has a shape of a strip extending in the first direction x in plan view.

As shown in FIGS. 41 and 42, the second obverse-surface electrode 214 has a base segment 214a, a mounting segment 214b and a connecting segment 214c. The second obverse-surface electrode 214 has a shape symmetrical to the shape of the first obverse-surface electrode 213 with respect to an axis along the second direction y. The base segment 214a corresponds to the base segment 213a of the first obverse-surface electrode 213. A second middle electrode 232 is connected to the edge of the base segment 214a at a part located on the boundary between the obverse surface 11 and the second region 141b of the inner surface 141. The mounting segment 214b corresponds to the mounting segment 213b of the first obverse-surface electrode 213. The mounting segment 214b is where the semiconductor element 31 is mounted. The connecting segment 214c corresponds to the connecting segment 213c of the first obverse-surface electrode 213. The connecting segment 214c connects the base segment 214a to the mounting segment 214b.

In the present embodiment, as shown in FIGS. 41 to 45, the semiconductor element 31 has a first electrode 311 and a second electrode 312 on the element reverse surface 31b that faces toward the obverse surface 11. The first electrode 311 is electrically connected to a p-type semiconductor layer (now illustrated) of the semiconductor element 31. The second electrode 312 is electrically connected to an n-type semiconductor layer (not illustrated) of the semiconductor element 31. That is, the semiconductor element 31 of the present embodiment is so-called a flip-chip element. The first electrode 311 is electrically connected to the first obverse-surface electrode 213 via a conductive bonding layer 32. The second electrode 312 is electrically connected to the second obverse-surface electrode 214 via another conductive bonding layer 32. The bonding layers 32 of the present embodiment is formed from solder paste, for example. More specifically, the bonding layers 32 are made of the solder paste cured by reflowing. The present embodiment allows the wire 4 to be omitted.

The following describes advantages of the semiconductor device A20.

As with the semiconductor device A10, the semiconductor device A20 includes the obverse-surface electrodes 21, the reverse-surface electrodes 22 and the middle electrodes 23. Each obverse-surface electrode 21 has an outer perimeter located inward in the obverse surface 11 from the boundary between the obverse surface 11 and the side surface 13. In addition, each reverse-surface electrode 22 has an outer perimeter located inward in the reverse surface 12 from the boundary between the reverse-surface electrode 22 and the side surface 13. This configuration also makes it possible to provide a semiconductor devices A20 of a smaller size without metal burrs on the electrodes (obverse-surface electrodes 21 and reverse-surface electrodes 22), which impairs the appearance and/or mountability.

Since the semiconductor element 31 is so-called a flip-chip element, the semiconductor device A20 includes no wires 4, requiring no space for such wires 4. Thus, a larger semiconductor element 31 may be used to improve the brightness as compared with the semiconductor device A10 of a comparable package size. Reversely, a semiconductor element 31 of a size comparable to that included in the semiconductor device A10 may be used to allow the semiconductor device A20 to be smaller.

The present disclosure is not limited to the specific embodiments described above. Various design modifications may be made to the specific configurations of each part of the present disclosure.

Specifically, the second and third embodiments described above encompass the following clauses.

Clause B1.

A semiconductor device comprising:

a substrate having:

an obverse surface and a reverse surface facing away from each other in a thickness direction;

a side surface connected to both the obverse surface and the reverse surface; and a concavity recessed from the side surface, the concavity having an inner surface extending from the obverse surface to the reverse surface;

at least one obverse-surface electrode disposed on the obverse surface;

a reverse-surface electrode disposed on the obverse surface;

a middle electrode disposed on the inner surface to electrically connect the obverse-surface electrode and the reverse-surface electrode; and a semiconductor element mounted on the obverse-surface electrode, wherein the obverse-surface electrode has an outer perimeter located inward in the obverse surface from a boundary between the obverse surface and the side surface, and wherein the reverse-surface electrode has an outer perimeter located inward in the reverse surface from a boundary between the reverse surface and the side surface.

Clause B2.
   The semiconductor device according to Clause B1,
   wherein the middle electrode has an outer perimeter located inward in the inner surface from a boundary between the inner surface and the side surface as viewed in the thickness direction.

Clause B3.
   The semiconductor device according to Clause B2,
   wherein the inner surface has a first region recessed from the side surface and a second region recessed from the first region, and
   wherein the middle electrode is disposed on the second region.

Clause B4.
   The semiconductor device according to Clause B3,
   wherein each of the first region and the second region is a curved surface.

Clause B5.
   The semiconductor device according to Clause B3 or B4,
   wherein the outer perimeter of the obverse-surface electrode has a part located on a boundary between the obverse surface and the first region, and
   wherein the outer perimeter of the reverse-surface electrode has a part located on a boundary between the reverse surface and the first region.

Clause B6.
   The semiconductor device according to any of Clauses B1 to B5,
   wherein the side surface has a pair of regions spaced apart from each other in one direction perpendicular to the thickness direction, and
   wherein the concavity is recessed from both the regions.

Clause B7.
   The semiconductor device according to Clause B6,
   wherein the at least one obverse-surface electrode comprises a plurality of obverse-surface electrodes including:
      a first obverse-surface electrode on which the semiconductor element is mounted; and
      a second obverse-surface electrode spaced apart from the first obverse-surface electrode in the one direction, and
   wherein the semiconductor device further comprises a wire that electrically connects the semiconductor element to the second obverse-surface electrode.

Clause B8.
   The semiconductor device according to Clause B7,
   wherein the semiconductor element has an element obverse surface facing in the same direction as the obverse surface and an element reverse surface facing away from the element obverse surface,
   wherein the element reverse surface is a part of a first electrode that is electrically connected to the first obverse-surface electrode via a conductive bonding layer, and
   wherein a second electrode is formed on the element obverse surface and the wire is connected to the second electrode.

Clause B9.
   The semiconductor device according to Clause B6,
   wherein the at least one obverse-surface electrode comprises a plurality of obverse-surface electrodes including a first obverse-surface electrode and a second obverse-surface electrode spaced apart from each other in the one direction, and
   wherein the semiconductor element is mounted on both the first obverse-surface electrode and the second obverse-surface electrode.

Clause B10.
   The semiconductor device according to Clause B9,
   wherein the semiconductor element has an element reverse surface facing toward the obverse surface, and
   wherein the semiconductor device further comprises a first electrode and a second electrode that are formed on the element reverse surface, the first electrode being electrically connected to the first obverse-surface electrode via a conductive bonding layer, the second electrode being electrically connected to the second obverse-surface electrode via a conductive bonding layer.

Clause B11.
   The semiconductor device according to any of Clauses B1 to B10,
   wherein each of the obverse-surface electrode, the reverse-surface electrode and the middle electrode includes a Cu layer that is in contact with the substrate.

Clause B12.
   The semiconductor device according to any of Clauses B1 to B11,
   wherein the semiconductor element comprises a light emitting diode, and
   wherein the semiconductor device further comprises a sealing resin covering the semiconductor element.

Clause B13.
   The semiconductor device according to Clause B12,
   wherein the sealing resin contains a phosphor.

Clause B14.
   The semiconductor device according to Clause B12 or B13, further comprising
   a coating disposed on the obverse surface and overlaps with at least a part of the concavity as viewed in the thickness direction of the substrate.

Clause B15.
   A method for manufacturing a semiconductor device, comprising:
   forming a hole extending through a base member in a thickness direction, the base member having an obverse surface and a reverse surface facing away from each other in the thickness direction;
   forming an electrically conductive foundation layer on the obverse surface, the reverse surface and an inner circumferential surface of the hole; and
   removing a part of the foundation layer,
   wherein the removing of a part of the foundation layer includes removing parts of the foundation layer such that parts of the foundation layer left unremoved on the obverse surface and the reverse surface have outer edges spaced apart from a line passing through a center of the hole as viewed in a thickness direction of the base member.

Clause B16.
   The method according to Clause B15,
   wherein the removing of a part of the foundation layer includes forming a pair of auxiliary holes through the base member, the pair of auxiliary holes being continuous with the hole and located at opposite sides of the hole along the line passing through the center of the hole as viewed in the thickness direction of the base member.

Clause B17.
   The method according to Clause B15 or B16,
   wherein the forming of a foundation layer includes forming the foundation layer on the inner circumferential surface of the hole by electroless plating.

The invention claimed is:
1. An optical device comprising:
   a substrate having an obverse surface and a reverse surface facing away from each other;

an obverse-surface conductive layer formed on the obverse surface of the substrate, the obverse-surface conductive layer including a first obverse-surface conducting region and a second obverse-surface conductive region;

a reverse-surface conductive layer formed on the reverse surface of the substrate;

a first conductive part extending through the substrate and overlapping with the first obverse-surface conducting region and the reverse-surface conductive layer as viewed in a thickness direction of the substrate;

an optical element disposed on the obverse-surface conductive layer; and a reflector disposed on the substrate, the reflector having an inner surface that surrounds the optical element as viewed in the thickness direction, wherein the optical element is located on the first obverse-surface conducting region, and the second obverse-surface conducting region is located between the first obverse-surface conducting region and the inner surface of the reflector as viewed in the thickness direction, wherein the second obverse-surface conducting region is spaced apart from the inner surface of the reflector as viewed in the thickness direction, and wherein the obverse-surface conductive layer includes a third obverse-surface conducting region that is disposed between the first obverse-surface conducting region and the second obverse-surface conducting region as viewed in the thickness direction and that connects the first obverse-surface conducting region and the second obverse-surface conducting region.

2. The optical device according to claim 1, further comprising a bonding layer disposed between and in contact with the optical element and the obverse-surface conductive layer.

3. The optical device according to claim 1,
wherein an entirety of the obverse-surface conductive layer is located inside the inner surface as viewed in the thickness direction.

4. The optical device according to claim 1,
wherein the first conductive part is located inside the inner surface as viewed in the thickness direction.

5. The optical device according to claim 1,
wherein a distance between the second obverse-surface conducting region and the inner surface is smaller than a distance between the second obverse-surface conducting region and the first obverse-surface conducting region.

6. The optical device according to claim 1,
wherein the third obverse-surface conducting region extends from the first obverse-surface conducting region in a first direction, and
wherein the third obverse-surface conducting region is smaller than the first obverse-surface conducting region in dimension in a second direction that is perpendicular to both the first direction and the thickness direction.

7. The optical device according to claim 6,
wherein the third obverse-surface conducting region is smaller than the second obverse-surface conducting region in dimension in the second direction.

8. The optical device according to claim 1, further comprising
a wire bonded to the optical element and the obverse-surface conductive layer, wherein the obverse-surface conductive layer includes a fourth obverse-surface conducting region to which the wire is bonded, and wherein the fourth obverse-surface conducting region is spaced apart from the inner surface of the reflector as viewed in the thickness direction.

9. The optical device according to claim 8, further comprising
a second conductive part that extends through the substrate, the second conductive part overlapping with the fourth obverse-surface conducting region and the reverse-surface conductive layer as viewed in the thickness direction of the substrate, wherein the second conductive part is located inside the inner surface as viewed in the thickness direction.

10. The optical device according to claim 9,
wherein the reverse-surface conductive layer includes a first reverse-surface conductive region and a second reverse-surface conductive region, wherein the first reverse-surface conductive region overlaps with the first conductive part and the reflector as viewed in the thickness direction, and wherein the second reverse-surface conductive region overlaps with the second conductive part and the reflector as viewed in the thickness direction.

11. The optical device according to claim 1,
wherein the substrate has two side surfaces facing away from each other, wherein the substrate has: a first boundary between the reverse surface and one of the side surfaces; and a second boundary between the reverse surface and the other of the side surfaces, and wherein the reverse-surface conductive layer extends on the reverse surface of the substrate from the first boundary to the second boundary as viewed in the thickness direction.

12. The optical device according to claim 1,
wherein the reflector and the substrate contain the same material.

13. The optical device according to claim 10,
wherein the reflector is made of an opaque material.

14. An optical device comprising:
a substrate having an obverse surface and a reverse surface facing away from each other;

an obverse-surface conductive layer formed on the obverse surface of the substrate, the obverse-surface conductive layer including a first obverse-surface conducting region and a second obverse-surface conductive region;

a reverse-surface conductive layer formed on the reverse surface of the substrate;

a first conductive part extending through the substrate and overlapping with the first obverse-surface conducting region and the reverse-surface conductive layer as viewed in a thickness direction of the substrate;

an optical element disposed on the obverse-surface conductive layer;

a reflector disposed on the substrate, the reflector having an inner surface that surrounds the optical element as viewed in the thickness direction; and a light-transmitting resin package disposed on the substrate, wherein the optical element is located on the first obverse-surface conducting region, and the second obverse-surface conducting region is located between the first obverse-surface conducting region and the inner surface of the reflector as viewed in the thickness direction, wherein the second obverse-surface conducting region is spaced apart from the inner surface of the reflector as viewed in the thickness direction, wherein the light-transmitting resin package has two light-transmitting outer surfaces facing away from each other, wherein the reflector has two reflector outer surfaces facing away from each other, wherein each of the two light-transmitting outer surfaces and the two reflector outer surfaces is parallel to the thickness direction of the substrate, and wherein the two light-transmitting outer surfaces are flush with the two reflector outer surfaces, respectively.

15. The optical device according to claim 14, wherein the light-transmitting resin package has a surface curved outward in a direction from the substrate to the optical element.

16. An optical device comprising:
a substrate having an obverse surface and a reverse surface facing away from each other;
an obverse-surface conductive layer formed on the obverse surface of the substrate, the obverse-surface conductive layer including a first obverse-surface conducting region and a second obverse-surface conductive region;
a reverse-surface conductive layer formed on the reverse surface of the substrate;
a first conductive part extending through the substrate and overlapping with the first obverse-surface conducting region and the reverse-surface conductive layer as viewed in a thickness direction of the substrate;
an optical element disposed on the obverse-surface conductive layer; and
a reflector disposed on the substrate, the reflector having an inner surface that surrounds the optical element as viewed in the thickness direction, wherein the optical element is located on the first obverse-surface conducting region, and the second obverse-surface conducting region is located between the first obverse-surface conducting region and the inner surface of the reflector as viewed in the thickness direction, wherein an entirety of the second obverse-surface conducting region is spaced apart from the inner surface of the reflector by a predetermined distance as viewed in the thickness direction, and wherein the obverse surface of the substrate is exposed in a region containing the predetermined distance as viewed in the thickness direction.

17. The optical device according to claim 16, wherein the predetermined distance is at least 40 µm.

18. The optical device according to claim 16, wherein the inner surface of the reflector is perpendicular to the obverse surface of the substrate.

19. The optical device according to claim 16, further comprising a bonding layer, wherein the reflector and the obverse surface of the substrate are spaced apart from each other via the bonding layer.

20. The optical device according to claim 19, wherein the bonding layer is smaller in thickness than the second obverse-surface conductive region.

* * * * *